United States Patent
Kitano et al.

(10) Patent No.: US 11,968,463 B2
(45) Date of Patent: Apr. 23, 2024

(54) SOLID-STATE IMAGING DEVICE AND IMAGING DEVICE INCLUDING A DYNAMIC VISION SENSOR (DVS)

(71) Applicants: SONY GROUP CORPORATION, Tokyo (JP); SONY SEMICONDUCTOR SOLUTIONS CORPORATION, Kanagawa (JP)

(72) Inventors: Shin Kitano, Kanagawa (JP); Koya Tsuchimoto, Kanagawa (JP); Kei Nakagawa, Tokyo (JP)

(73) Assignees: Sony Group Corporation, Tokyo (JP); Sony Semiconductor Solutions Corporation, Kanagawa (JP)

(*) Notice: Subject to any disclaimer, the term of this patent is extended or adjusted under 35 U.S.C. 154(b) by 320 days.

(21) Appl. No.: 17/285,021

(22) PCT Filed: Oct. 7, 2019

(86) PCT No.: PCT/JP2019/039465
§ 371 (c)(1),
(2) Date: Apr. 13, 2021

(87) PCT Pub. No.: WO2020/085060
PCT Pub. Date: Apr. 30, 2020

(65) Prior Publication Data
US 2021/0400223 A1 Dec. 23, 2021

(30) Foreign Application Priority Data
Oct. 25, 2018 (JP) .................................. 2018-201001

(51) Int. Cl.
*H04N 25/75* (2023.01)
*H01L 27/146* (2006.01)
(Continued)

(52) U.S. Cl.
CPC ............. *H04N 25/75* (2023.01); *H04N 25/46* (2023.01); *H04N 25/766* (2023.01);
(Continued)

(58) Field of Classification Search
CPC ...... H04N 25/75; H04N 25/46; H04N 25/766; H04N 25/59; H01L 27/14614;
(Continued)

(56) References Cited

U.S. PATENT DOCUMENTS

2007/0215970 A1  9/2007  Lee
2008/0308852 A1  12/2008  Lee
(Continued)

FOREIGN PATENT DOCUMENTS

EP      2563011        2/2013
JP      2007325139 A   12/2007
(Continued)

OTHER PUBLICATIONS

International Search Report and Written Opinion prepared by the European Patent Office dated Jan. 14, 2020, for International Application No. PCT/JP2019/039465.

*Primary Examiner* — Ahmed A Berhan
(74) *Attorney, Agent, or Firm* — Sheridan Ross PC

(57) ABSTRACT

An imaging device includes at least one floating diffusion region, and a set of photoelectric conversion regions sharing the at least one floating diffusion region and that convert incident light into electric charges. The imaging device includes a first readout circuit and a second readout circuit. The first readout circuit is coupled to the at least one floating diffusion region and located at a first side of the set of photoelectric conversion region, and the second readout circuit is coupled to the at least one floating diffusion region. The second readout circuit includes a portion located at a second side of the set of photoelectric conversion regions that is opposite the first side, and the second readout circuit is configured to control the first readout circuit.

23 Claims, 28 Drawing Sheets

(51) Int. Cl.
*H04N 25/46* (2023.01)
*H04N 25/766* (2023.01)

(52) U.S. Cl.
CPC .. *H01L 27/14614* (2013.01); *H01L 27/14621* (2013.01); *H01L 27/14643* (2013.01)

(58) Field of Classification Search
CPC ......... H01L 27/14621; H01L 27/14643; H01L 27/14636; H01L 27/14612; H01L 27/14645; H01L 27/14603; H01L 27/14634; H01L 27/14641
See application file for complete search history.

(56) References Cited

U.S. PATENT DOCUMENTS

| | | |
|---|---|---|
| 2009/0046186 A1 | 2/2009 | Nagai |
| 2010/0123771 A1 | 5/2010 | Moon |
| 2013/0049082 A1* | 2/2013 | Kato ................. H01L 27/14603 257/292 |
| 2016/0165159 A1 | 6/2016 | Hseih et al. |
| 2016/0372504 A1 | 12/2016 | Kato et al. |
| 2017/0059399 A1* | 3/2017 | Suh ........................ H04N 25/77 |
| 2018/0227513 A1 | 8/2018 | Keung et al. |
| 2019/0115379 A1 | 4/2019 | Kato et al. |

FOREIGN PATENT DOCUMENTS

| | | |
|---|---|---|
| JP | 2008235478 A | 10/2008 |
| JP | 2012501578 A | 1/2012 |
| JP | 2013062789 A | 4/2013 |
| JP | 2013077826 A | 4/2013 |
| JP | 2015130533 A | 7/2015 |
| JP | 2016-533140 | 10/2016 |
| JP | 2018160667 A | 10/2018 |
| WO | WO 2007/105478 | 9/2007 |
| WO | WO-2007105478 A1 * | 9/2007 ....... H01L 27/14603 |
| WO | WO 2016/089551 | 6/2016 |
| WO | WO-2018012133 A1 | 1/2018 |

* cited by examiner

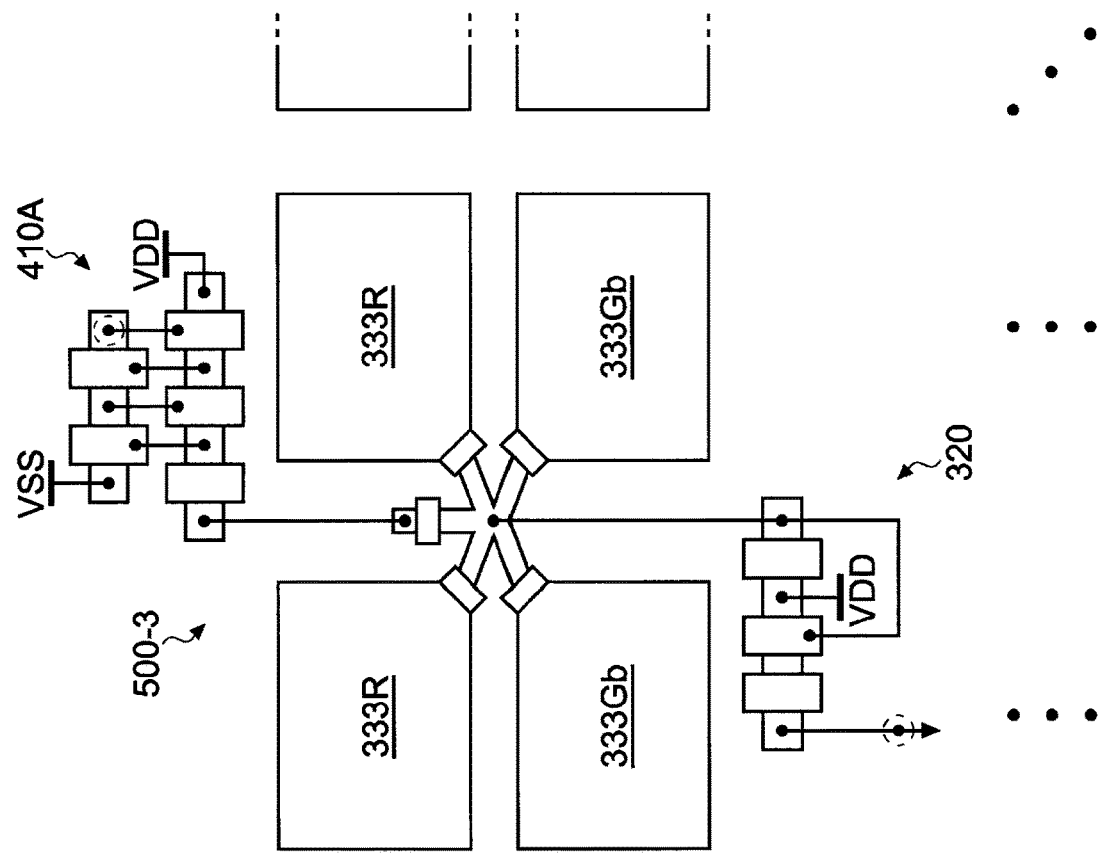
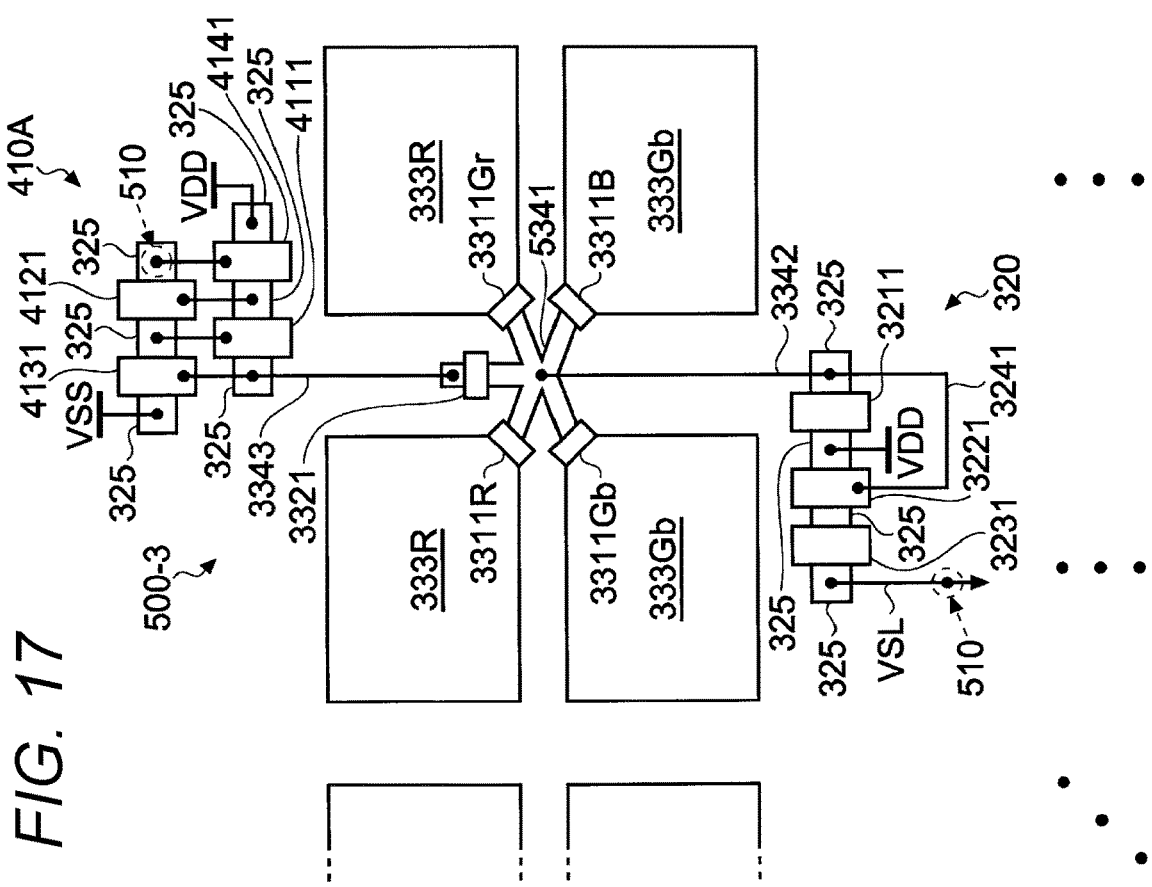
FIG. 17

SOLID-STATE IMAGING DEVICE AND IMAGING DEVICE INCLUDING A DYNAMIC VISION SENSOR (DVS)

CROSS REFERENCE TO RELATED APPLICATIONS

This application is a national stage application under 35 U.S.C. 371 and claims the benefit of PCT Application No. PCT/JP2019/039465, having an international filing date of 7 Oct. 2019, which designated the United States, which PCT application claimed the benefit of Japanese Patent Application No. 2018-201001, filed 25 Oct. 2018, the entire disclosures of each of which are incorporated herein by reference.

TECHNICAL FIELD

The present disclosure relates to a solid-state imaging device, and an imaging device.

BACKGROUND ART

In the related art, a synchronization-type solid-state imaging device that captures image data in synchronization with a synchronization signal such as a vertical synchronization signal has been used in an imaging device and the like. In the typical synchronization-type solid-state imaging device, it is difficult to acquire image data for every period of the synchronization signal (for example, for every $\frac{1}{60}$ seconds), and thus it is difficult to cope with a case where relatively high-speed processing is demanded in fields related to traffic, a robot, and the like. In this regard, there is suggested a non-synchronization-type solid-state imaging device in which a detection circuit is provided for every pixel to detect a situation in which a light-reception amount exceeds a threshold value as an address event in real time. The non-synchronization-type solid-state imaging device that detects the address event for every pixel is also referred to as a dynamic vision sensor (DVS).

CITATION LIST

Patent Literature

PTL 1: JP 2016-533140A

SUMMARY

Technical Problem

However, in the DVS, it is necessary to provide a circuit configuration for detecting the address event in addition to a circuit configuration for reading out a pixel signal of a voltage value corresponding to a light-reception amount, and thus an occupation ratio of a light-receiving element on a light-receiving surface decreases. As a result, there is a problem that quantum efficiency with respect to incident light (hereinafter, referred to as "light-reception efficiency") deteriorates.

Therefore, the present disclosure provides a solid-state imaging device and an imaging device which are capable of improving the light-reception efficiency.

Solution to Problem

According to an embodiment of the present disclosure, there is provided an imaging device including at least one floating diffusion region, a set of photoelectric conversion regions sharing the at least one floating diffusion region and that convert incident light into electric charges, a first readout circuit coupled to the at least one floating diffusion region and located at a first side of the set of photoelectric conversion regions, and a second readout circuit coupled to the at least one floating diffusion region. The second readout circuit includes a portion located at a second side of the set of photoelectric conversion regions that is opposite the first side. The second readout circuit is also configured to control the first readout circuit. The second readout circuit is configured to convert a voltage signal into a logarithmic value based on the electric charges. The second readout circuit includes a first set of transistors and a second set of transistors spaced apart from one another in a first direction. The first set of transistors and the second set of transistors are arranged in a second direction substantially perpendicular to the first direction. The set of photoelectric conversion regions includes a first group of four photoelectric conversion regions in a 2×2 matrix. A first line extending in the first direction intersects the first and second sets of transistors and first and second photoelectric conversion regions in the first group. A second line that extends in the first direction and that is offset from the first line in the second direction intersects the at least one floating diffusion region. The first readout circuit includes a third set of transistors that are arranged in the second direction. A third line that extends in the first direction and that is offset from the second line in the second direction intersects the third set of transistors and third and fourth photoelectric conversion regions in the first group. A number of transistors in the third set of transistors and a number of transistors in the first set of transistors is equal. A number of transistors in the second set of transistors is fewer than the number of the transistors in the first set of transistors. The set of photoelectric conversion regions includes a second group of four photoelectric conversion regions in a 2×2 matrix, and the first readout circuit is between the first group and the second group in the first direction. The at least one floating diffusion region includes a first floating diffusion region shared by the first group of four photoelectric conversion regions, and a second floating diffusion region shared by the second group of four photoelectric conversion regions. According to an aspect of the present disclosure, there is provided an imaging device including a first floating diffusion region, a first group of photoelectric conversion regions sharing the first floating diffusion region and that convert incident light into electric charges, a second floating diffusion region, a second group of photoelectric conversion regions sharing the second floating diffusion region and that convert incident light into electric charges, a first readout circuit coupled to the first and second floating diffusions and located at a first side of the first group of photoelectric conversion regions, and a second readout circuit coupled to the first and second floating diffusion regions. The second readout circuit includes a portion located at a second side of the first group of photoelectric conversion regions such that the second readout circuit is between the first group of photoelectric conversion regions and the second group of photoelectric conversion regions. The second readout circuit is also configured to control the first readout circuit, the second side being opposite to the first side. The second readout circuit is configured to convert a voltage signal to a logarithmic value based on the electric charges. The first group and the second group each include four photoelectric conversion regions in a 2×2 matrix. The first group and the second group are aligned with one another in a first direction. A line extends in the first direction through the first floating diffusion region and the second floating diffusion region. Gates of transistors in the first readout circuit are at a first side of the center line, and gates of transistors in the second readout circuit are at a second side of the center line that is opposite the first side of the center line. The transistors in the second readout circuit include a first set of transistors and a second set of transistors spaced apart from the first set of transistors in the first direction. The gates of the transistors in the first and second sets of transistors and the gates of the transistors in the first readout circuit are arranged in a second direction that is substantially perpendicular to the first direction.

According to an aspect of the present disclosure, there is provided an imaging device, comprising a first chip that includes at least one floating diffusion region, a set of photoelectric conversion regions sharing the at least one floating diffusion region and that convert incident light into electric charge. A second chip is bonded to the first chip and includes a first readout circuit coupled to the at least one floating diffusion region and located at a first side of the set of photoelectric conversion regions and a second readout circuit coupled to the at least one floating diffusion region. The second readout circuit includes a portion located at a second side of the set of photoelectric conversion regions that is opposite the first side. The second readout circuit is configured to control the first readout circuit. The second readout circuit is configured to convert a voltage signal into a logarithmic value based on the electric charges. A third chip is bonded to the second chip. The third chip includes signal processing circuitry for processing a pixel signal for each photoelectric conversion region. According to an embodiment of the present disclosure, there is provided a solid-state imaging device including: a plurality of photoelectric conversion elements which are arranged in a two-dimensional lattice shape in row and column directions, and each generate a charge corresponding to a light-reception amount; a first transistor that is provided in each of the plurality of photoelectric conversion elements; an integration unit that integrates an output of the first transistor that is provided in each of two or more photoelectric conversion elements among the plurality of photoelectric conversion elements; a detection unit that detects a photocurrent based on a charge that is generated in at least one of the two or more photoelectric conversion elements; a second transistor that is disposed between an output of the first transistor that is provided in each of the two or more photoelectric conversion elements, and the detection unit; and a generation unit that generates a pixel signal of a voltage value based on a charge that is generated in each of the two or more photoelectric conversion elements.

BRIEF DESCRIPTION OF DRAWINGS

FIG. 17 is a top view illustrating a schematic configuration example of an upper layer circuit according to a third layout example of the first embodiment.

DESCRIPTION OF EMBODIMENTS

Figure 1:
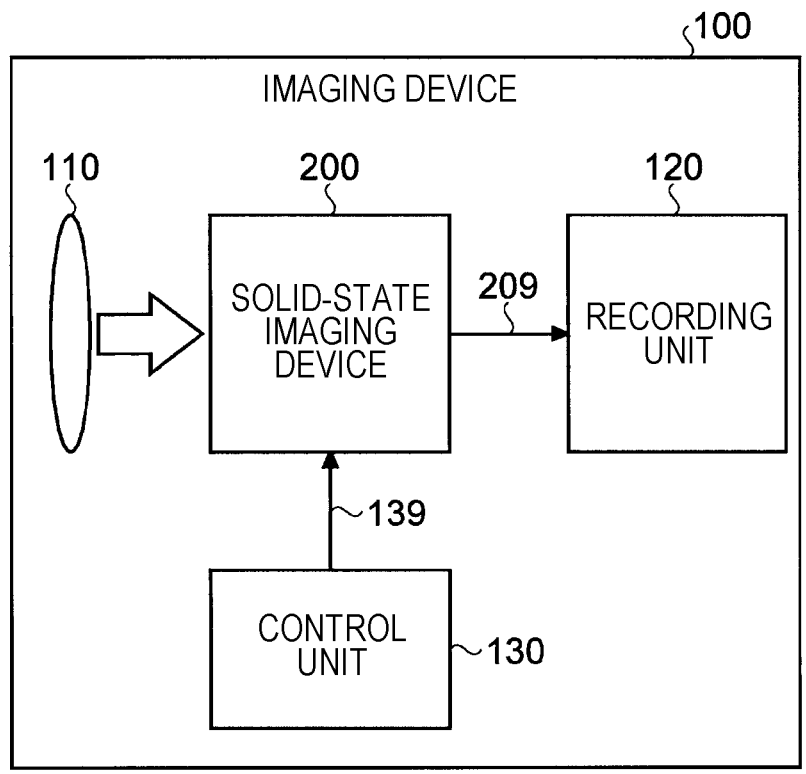
FIG. 1 is a block diagram illustrating a schematic configuration example of a solid-state imaging device and an imaging device according to a first embodiment.

Hereinafter, an embodiment of the present disclosure will be described in detail on the basis of the accompanying drawings. Furthermore, in the following embodiments, the same reference numeral will be given to the same portion, and redundant description thereof will be omitted.

In addition, the present disclosure will be described according to the following item sequence.

1. Introduction
2. First Embodiment
2.1 Configuration Example of Imaging Device
2.2 Configuration Example of Solid-State Imaging Device
2.2.1 Lamination Configuration Example of Solid-State Imaging Device
2.2.2 Functional Configuration Example of Solid-State Imaging Device
2.3 Configuration Example of Pixel Array Unit
2.4 Example of Pixel Block
2.4.1 Bayer Array
2.4.2 X-Trans (registered trademark)-Type Array
2.4.3 Quad Bayer Array
2.4.4 White RGB Array
2.5 Configuration Example of Pixel Block
2.6 Configuration Example of Address Event Detection Unit
2.7 Configuration Example of Current-Voltage Conversion Unit
2.8 Configuration Example of Subtractor and Quantizer
2.9 Configuration Example of Column ADC
2.10 Operation Example of Solid-State Imaging Device
2.10.1 Timing Chart
2.10.2 Flowchart
2.11 Layout Example of Upper Layer Circuit
2.11.1 First Layout Example
2.11.2 Second Layout Example
2.11.3 Third Layout Example
2.12 Operation and Effect
3. Second Embodiment
3.1 Configuration Example of Pixel Block
3.2 Operation Example of Solid-State Imaging Device
3.3 Layout Example
3.4 Operation and Effect
4. Third Embodiment
4.1 Layout Example of Upper Layer Circuit
4.1.1 First Layout Example
4.1.2 Second Layout Example
4.1.3 Third Layout Example
4.1.4 Fourth Layout Example
4.2 Operation and Effect
5. Fourth Embodiment
5.1 Operation and Effect
6. Fifth Embodiment
6.1 Operation and Effect
7. Application Example to Moving Body

1. INTRODUCTION

A typical dynamic vision sensor (DVS) employs a so-called event-driven type driving method in which existence or nonexistence of address event ignition is detected for every unit pixel, and a pixel signal is read out from a unit pixel in which the address event is ignited in a case where the address event ignition is detected.

Furthermore, the unit pixel in this description represents a minimum (or alternatively, desired) unit of a pixel including one photoelectric conversion element (also referred to as "light-receiving element") and corresponds to each dot in image data that is read out from an image sensor as an example. In addition, the address event represents an event that occurs for every address that is allocable to each of a plurality of the unit pixels which are arranged in a two-dimensional lattice shape, and examples thereof include an event in which a current value of a photocurrent based on a charge generated in the photoelectric conversion element or a variation amount thereof exceeds an arbitrary constant threshold value.

In the event-driven type DVS, a detection circuit that detects address event ignition for every unit pixel is necessary in addition to a pixel circuit that reads out a pixel signal of a voltage value corresponding to a light-reception amount from a unit pixel. Therefore, a circuit configuration having a larger scale in comparison to a pixel circuit that is typically provided in a complementary metal oxide semiconductor (CMOS) image sensor and the like is combined to a solid-state imaging device. With this arrangement, an occupation ratio of a light-receiving element (also referred to as "photoelectric conversion element") on a light-receiving surface decreases, and thus there is a problem that a quantization efficiency with respect to incident light (hereinafter, also referred to as "light-reception efficiency") deteriorates.

Therefore, in the following embodiments, with regard to a solid-state imaging device and an imaging device which are capable of reducing a scale of a circuit that is combined to the solid-state imaging device, several examples will be described in detail.

2. FIRST EMBODIMENT

First, a solid-state imaging device and an imaging device according to a first embodiment of the present disclosure will be described in detail with reference to the accompanying drawings.

2.1 Configuration Example of Imaging Device

FIG. 1 is a block diagram illustrating a schematic configuration example of the solid-state imaging device and the imaging device according to the first embodiment. As illustrated in FIG. 1, for example, an imaging device 100 includes an imaging lens 110, a solid-state imaging device 200, a recording unit 120, and a control unit 130. As the imaging device 100, a camera that is mounted in an industrial robot, an in-vehicle camera, and the like are assumed.

The imaging lens 110 condenses incident light and images an image of the incident light to a light-receiving surface of the solid-state imaging device 200. The light-receiving surface is a surface on which photoelectric conversion elements (also referred to as "light-receiving element") in the solid-state imaging device 200 are arranged. The solid-state imaging device 200 photoelectrically converts the incident light to generate image data. In addition, the solid-state imaging device 200 executes predetermined signal processing such as noise removal and white balance adjustment with respect to the generated image data. A result obtained by the signal processing and a detection signal indicating existence or nonexistence of address event ignition are output to the recording unit 120 through a signal line 209. Furthermore, a method of generating the detection signal indicating existence or nonexistence of the address event ignition will be described later.

For example, the recording unit 120 is constituted by a flash memory, a dynamic random access memory (DRAM), a static random access memory (SRAM), or the like, and records data input from the solid-state imaging device 200.

For example, the control unit 130 is constituted by a central processing unit (CPU) and the like, and outputs various instructions through a signal line 139 to control respective units such as the solid-state imaging device 200 in the imaging device 100.

2.2 Configuration Example of Solid-State Imaging Device

Next, a configuration example of the solid-state imaging device 200 will be described in detail with reference to the accompanying drawings.

2.2.1 Lamination Configuration Example of Solid-State Imaging Device

Figure 2:
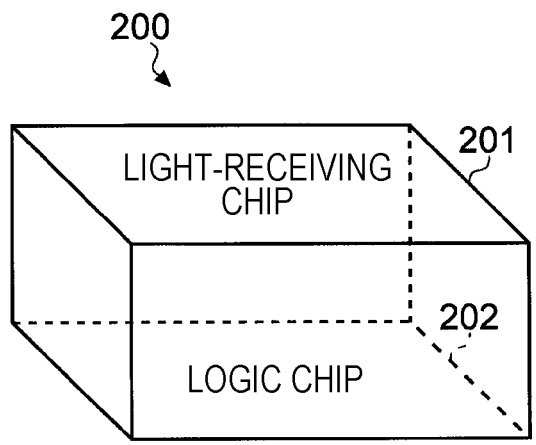
FIG. 2 is a view illustrating a lamination structure example of the solid-state imaging device according to the first embodiment.

FIG. 2 is a view illustrating a lamination structure example of the solid-state imaging device according to the first embodiment. As illustrated in FIG. 2, the solid-state imaging device 200 has a structure in which a light-receiving chip 201 and a logic chip 202 are vertically laminated. In joining of the light-receiving chip 201 and the logic chip 202, for example, so-called direct joining in which joining surfaces of the chips are planarized, and the chips are laminated with an inter-electron force can be used. However, there is no limitation thereto, and for example, so-called Cu—Cu joining in which copper (Cu) electrode pads formed on joining surfaces are bonded, bump joining, and the like can also be used.

In addition, the light-receiving chip 201 and the logic chip 202 are electrically connected to each other, for example, through a connection portion such as a through-silicon via (TSV) that penetrates through a semiconductor substrate. In the connection using the TSV, for example, a so-called twin TSV method in which two TSVs including a TSV that is formed in the light-receiving chip 201 and a TSV that is formed from the light-receiving chip 201 to the logic chip 202 are connected to each other on chip external surfaces, a so-called shared TSV method in which the light-receiving chip 201 and the logic chip 202 are connected with a TSV that penetrates through both the chips, and the like can be employed.

However, in the case of using the Cu—Cu joining or the bump joining in the joining of the light-receiving chip 201 and the logic chip 202, both the light-receiving chip 201 and the logic chip 202 are electrically connected to each other through a Cu—Cu joint or a bump joint.

2.2.2 Functional Configuration Example of Solid-State Imaging Device

Figure 3:
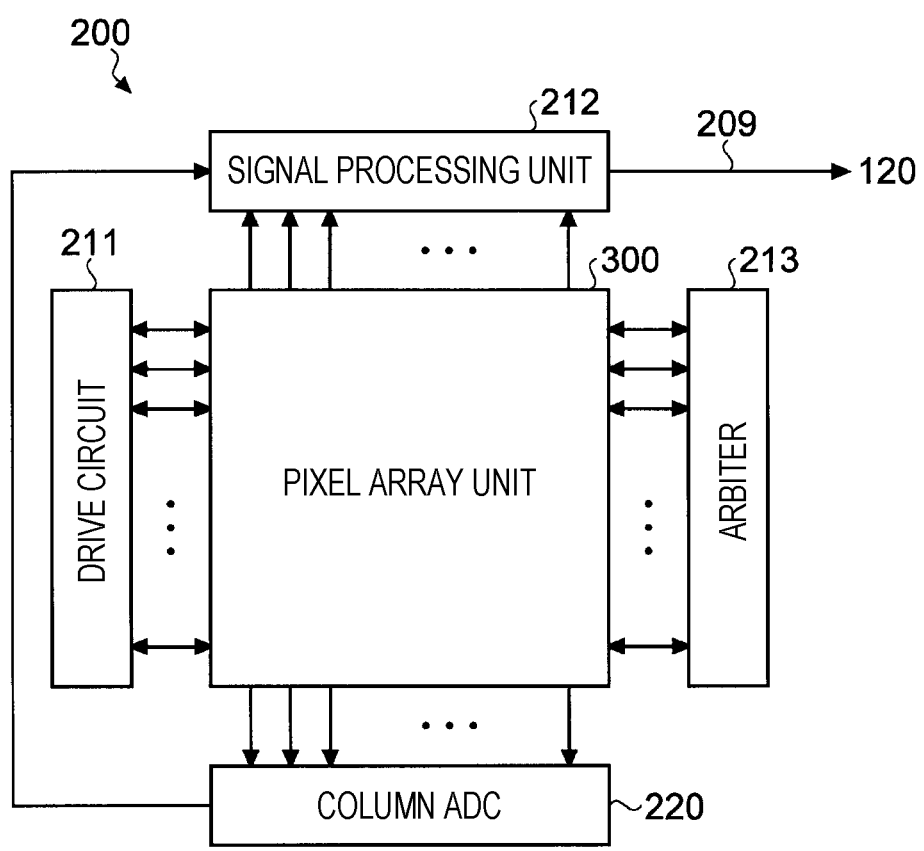
FIG. 3 is a block diagram illustrating a functional configuration example of the solid-state imaging device according to the first embodiment.

FIG. 3 is a block diagram illustrating a functional configuration example of the solid-state imaging device according to the first embodiment. As illustrated in FIG. 3, the solid-state imaging device 200 includes a drive circuit 211, a signal processing unit 212, an arbiter 213, a column ADC 220, and a pixel array unit 300.

In the pixel array unit 300, a plurality of unit pixels are arranged in a two-dimensional lattice shape. Although described in detail in the following description, for example, each of the unit pixels includes one photoelectric conversion element such as a photodiode, a circuit (hereinafter, referred to as a pixel circuit or a pixel signal generation unit. For example, refer to FIG. 4) that reads out a charge generated through photoelectric conversion from the photoelectric conversion element, and a circuit (hereinafter, referred to as an address event detection unit. For example, refer to FIG. 4) that detects a photocurrent based on a charge generated through photoelectric conversion from the photoelectric conversion element. Here, the pixel signal generation unit and the address event detection unit can be shared by a plurality of the photoelectric conversion elements. In this case, each of the unit pixels includes the one photoelectric conversion element, and the pixel signal generation unit and the address event detection unit which are shared.

The plurality of unit pixels which are arranged in a two-dimensional lattice shape in the pixel array unit 300 are grouped into a plurality of pixel blocks, each including a predetermined number of unit pixels. Hereinafter, an assembly of unit pixels or pixel blocks which are arranged in a horizontal direction is referred to as "row", and an assembly of unit pixels or pixel blocks which are arranged in a direction orthogonal to the row is referred to as "column".

Each of the unit pixels generates charges corresponding to light-reception amount of the photoelectric conversion element. Each of the pixel blocks detects existence or nonexistence of address event ignition on the basis of whether or not a current value of a current (hereinafter, referred to as a photocurrent) by charges generated in any one unit pixel that belongs to the pixel block or a variation amount thereof exceeds a predetermined threshold value. In addition, when the address event is ignited, each of the pixel blocks outputs a request for reading out a pixel signal of a voltage value corresponding to the light-reception amount of the photoelectric conversion element from each of the unit pixels which belong to the pixel block to the arbiter 213.

The drive circuit 211 drives each of the unit pixels and allows each of the unit pixels to output a pixel signal to the column ADC 220.

The arbiter 213 arbitrates a request from each of the pixel blocks and transmits a predetermined response to the pixel block which issues the request on the basis of the arbitration result. The pixel block which receives the response supplies a detection signal indicating existence or nonexistence of the address event ignition (hereinafter, simply referred to as "address event detection signal") to the drive circuit 211 and the signal processing unit 212.

For every pixel block column, the column ADC 220 converts an analog signal from the column into a digital signal. In addition, the column ADC 220 supplies a digital signal generated through the conversion to the signal processing unit 212.

The signal processing unit 212 executes predetermined signal processing such as correlated double sampling (CDS) processing (noise removal) and white balance adjustment with respect to the digital signal transmitted from the column ADC 220. In addition, the signal processing unit 212 supplies a signal processing result and an address event detection signal to the recording unit 120 through the signal line 209.

2.3 Configuration Example of Pixel Array Unit

Figure 4:
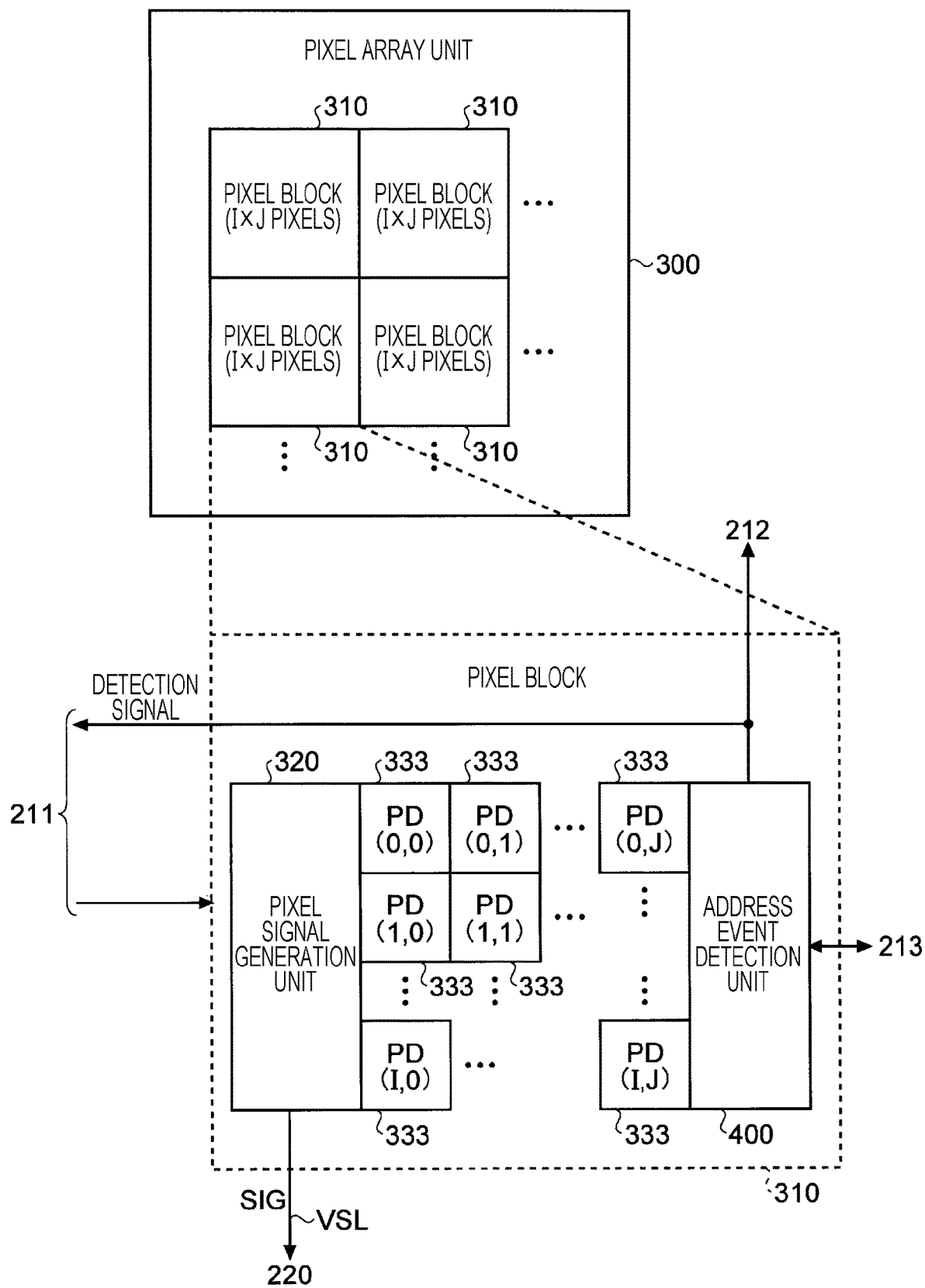
FIG. 4 is a block diagram illustrating a schematic configuration example of a pixel array unit according to the first embodiment.

Next, a configuration example of the pixel array unit 300 will be described. FIG. 4 is a block diagram illustrating a schematic configuration example of the pixel array unit according to the first embodiment. As illustrated in FIG. 4, a plurality of unit pixels in the pixel array unit 300 are grouped into a plurality of pixel blocks 310. Each of the pixel blocks 310 includes a plurality of unit pixels which are arranged in I rows×J columns (I and J represent a positive integer).

Each of the pixel blocks 310 includes a pixel signal generation unit 320, a plurality of photoelectric conversion elements of I rows×J columns (furthermore, noted as a photodiode (PD) in FIG. 4) 333, and an address event detection unit 400. The pixel signal generation unit 320 and the address event detection unit 400 are shared by the plurality of photoelectric conversion elements 333 in the pixel block 310. Each of the unit pixels includes one of the photoelectric conversion elements 333, and the pixel signal generation unit 320 and the address event detection unit 400 which are shared in the same pixel block 310. Coordinates of the unit pixels conform to coordinates of the photoelectric conversion elements 333 which are arranged in a two-dimensional lattice shape on a light-receiving surface of the solid-state imaging device 200.

One vertical signal line VSL is wired in a column of one pixel block 310. Accordingly, when the number of columns of the pixel block 310 is set as m (m represents a positive integer), m pieces of vertical signal lines VSL are arranged in the pixel array unit 300.

Each of the photoelectric conversion elements 333 is a light-receiving element that photoelectrically converts incident light and generates a photocurrent. The photoelectric conversion element 333 supplies a photocurrent that is generated through photoelectric conversion to any one of the pixel signal generation unit 320 and the address event detection unit 400 in accordance with control of the drive circuit 211.

The pixel signal generation unit 320 generates a signal of a voltage value corresponding to a charge amount of the photocurrent supplied from the photoelectric conversion element 333 as a pixel signal SIG. The pixel signal generation unit 320 supplies the generated pixel signal SIG to the column ADC 220 through the vertical signal line VSL.

The address event detection unit 400 detects existence or nonexistence of address event ignition on the basis of whether or not the current value of the photocurrent supplied form the photoelectric conversion elements 333 in the same pixel block 310 or a variation amount thereof exceeds a predetermined threshold value. Examples of the address event include an ON event indicating that the variation amount exceeds a threshold value of the upper limit, and an OFF event indicating that the variation amount is less than a threshold value of the lower limit. In addition, examples of an address event detection signal include one bit indicating a detection result of the ON event and one bit indicating a detection result of the OFF event. Furthermore, the address event detection unit 400 may be configured to detect any one of the ON event and the OFF event.

When the address event is ignited, the address event detection unit 400 supplies a request for requiring transmission of a detection signal to the arbiter 213. In addition, when receiving a response to the request from the arbiter 213, the address event detection unit 400 supplies a detection signal to the drive circuit 211 and the signal processing unit 212.

The drive circuit 211 to which the detection signal is supplied executes reading-out with respect to respective unit pixels which belong to the pixel block 310 including the address event detection unit 400 that supplies the detection signal. Through the reading-out, a pixel signal SIG of an analog value is sequentially input to the column ADC 220 from respective unit pixels in the pixel block 310 that is set as a reading-out target.

2.4 Example of Pixel Block

In the configuration illustrated in FIG. 4, for example, the pixel block 310 is constituted by a combination of photoelectric conversion elements 333 which receive wavelength components necessary to reconstruct a color. For example, in the case of reconstructing a color on the basis of three primary colors of RGB, the pixel block 310 is constituted by a combination of a photoelectric conversion element 333 that receives light of a red (R) color, a photoelectric conversion element 333 that receives light of a green (G) color, and a photoelectric conversion element 333 that receives light of a blue (B) color.

Here, in this embodiment, for example, a plurality of photoelectric conversion elements 333 which are arranged in a two-dimensional lattice shape in the pixel array unit 300 are grouped into a plurality of pixel blocks 310 on the basis of an array of a wavelength selection elements (for example, color filters) (hereinafter, referred to as an array of color filters) which are provided with respect to the respective photoelectric conversion elements 333.

Examples of the color filter array include various arrays such as a Bayer array of 2×2 pixels, a color filter array of 3×3 pixels which is employed in an X-Trans (registered trademark) CMOS sensor (hereinafter, also referred to as "X-Trans (registered trademark) type array"), a Quad Bayer array of 4×4 pixels (also referred to as "Quadra array"), and a color filter of 4×4 pixels in which a white RGB color filter is combined to the Bayer array (hereinafter, also referred to as "white RGB array"). Here, in the following description, a case where the Bayer Array is employed as the color filter array will be exemplified.

Here, with regard to the pixel blocks 310 in the case of employing a representative color filter array, several examples will be described.

2.4.1 Bayer Array

Figure 5:
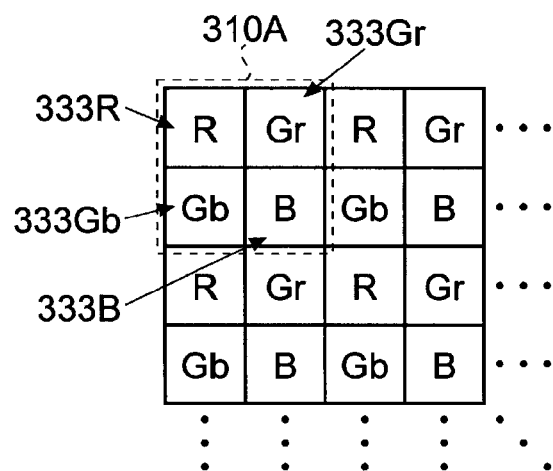
FIG. 5 is a schematic view illustrating a configuration example of a pixel block according to the first embodiment in a case where a Bayer array is employed as a color filter array.

FIG. 5 is a schematic view illustrating a configuration example of a pixel block in the case of employing the Bayer array as the color filter array. As illustrated in FIG. 5, in the case of employing the Bayer array as the color filter array, one pixel block 310A is constituted by a basic pattern (hereinafter, also referred to as "unit pattern") including a total of four photoelectric conversion elements 333 of 2×2 pixels as a repetitive unit in the Bayer array. Accordingly, for example, each pixel block 310A according to this example includes a photoelectric conversion element 333R including a color filter of a red (R) color, a photoelectric conversion element 333Gr including a color filter of a green (Gr) color, a photoelectric conversion element 333Gb including a color filter of a green (Gb) color, and a photoelectric conversion element 333B including a color filter of a blue (B) color.

2.4.2 X-Trans (Registered Trademark)-Type Array

Figure 6:
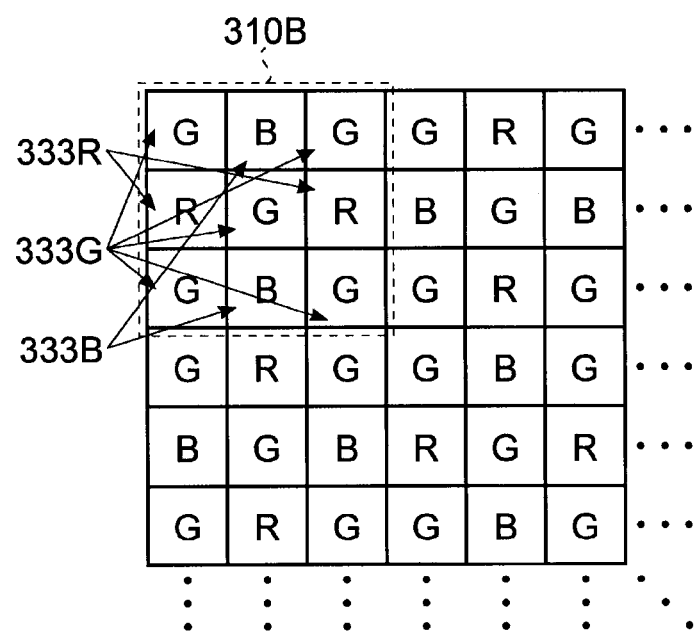
FIG. 6 is a schematic view illustrating a configuration example of the pixel block according to the first embodiment in a case where an X-Trans (registered trademark)-type array is employed as the color filter array.

FIG. 6 is a schematic view illustrating a configuration example of a pixel block in the case of employing an X-Trans (registered trademark)-type array as the color filter array. As illustrated in FIG. 6, in this example, one pixel block 310B is constituted by a basic pattern (hereinafter, also referred to as "unit pattern") including a total of nine photoelectric conversion elements 333 of 3×3 pixels as a repetitive unit in the X-Trans (registered trademark)-type array. Accordingly, for example, each pixel block 310B according to this example includes five photoelectric conversion elements 333G which are disposed along two diagonal lines in a rectangular region that forms the unit pattern and include a color filter of a green (G) color, two photoelectric conversion elements 333R which are arranged in the point symmetry with a photoelectric conversion element 333G located at the center of the rectangular region set as the central axis and include a color filter of a red (R) color, and two photoelectric conversion elements 333B which are disposed in the point symmetry with the photoelectric conversion element 333G located at the center of the rectangular region set as the central axis and include a color filter of a blue (B) color.

2.4.3 Quad Bayer Array

Figure 7:
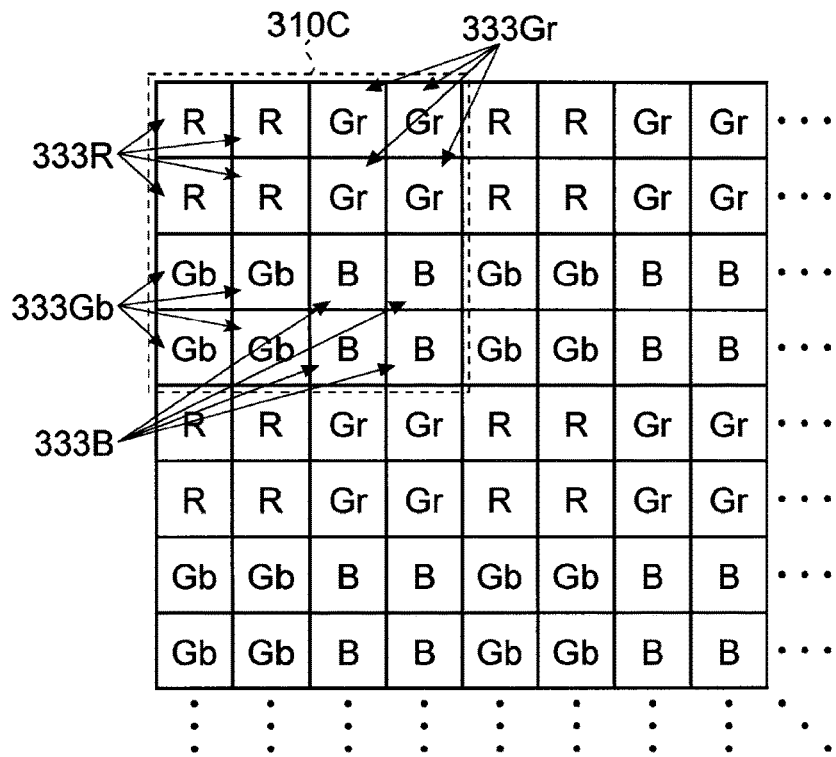
FIG. 7 is a schematic view illustrating a configuration example of the pixel block according to the first embodiment in a case where a Quad Bayer array is employed as the color filter array.

FIG. 7 is a schematic view illustrating a configuration example of a pixel block in the case of employing a Quad Bayer array as the color filter array. As illustrated in FIG. 7, in the case of employing the Bayer array as the color filter array, one pixel block 310C is constituted by a basic pattern (hereinafter, also referred to as "unit pattern") including a total of sixteen photoelectric conversion elements 333 of 4×4 pixels as a repetitive unit in the Quad Bayer array. Accordingly, for example, each pixel block 310C according to this example includes a total of four photoelectric conversion element 333R of 2×2 pixels including a color filter of a red (R) color, a total of four photoelectric conversion element 333Gr of 2×2 pixels including a color filter of a green (Gr) color, a total of four photoelectric conversion element 333Gb of 2×2 pixels including a color filter of a green (Gb) color, and a total of four photoelectric conversion element 333B of 2×2 pixels including a color filter of a blue (B) color.

2.4.4 White RGB Array

Figure 8:
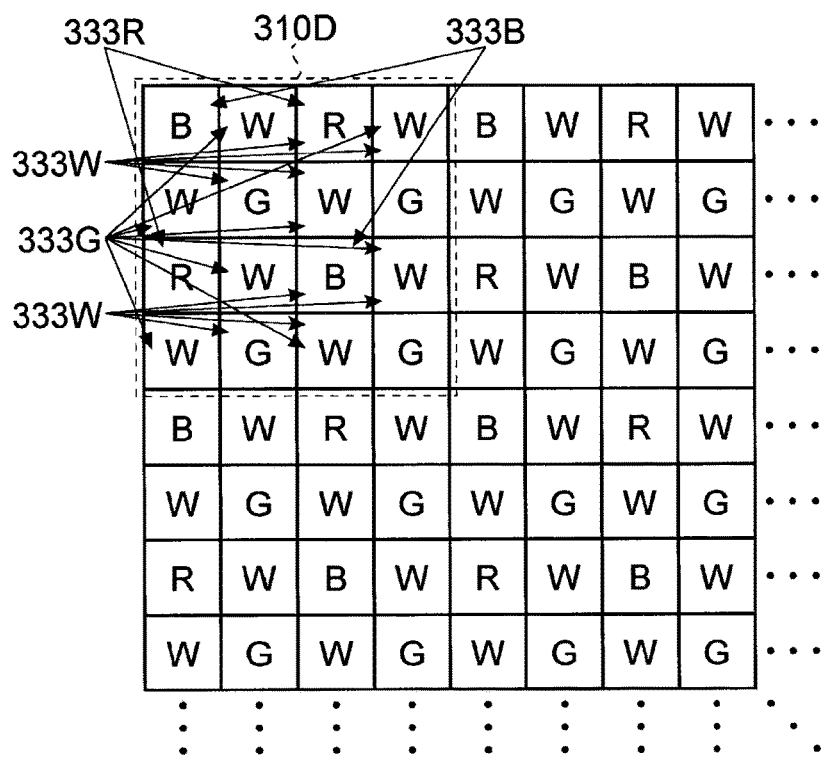
FIG. 8 is a schematic view illustrating a configuration example of the pixel block according to the first embodiment in a case where a white RGB array is employed as the color filter array.

FIG. 8 is a schematic view illustrating a configuration example of a pixel block in the case of employing a white RGB array as the color filter array. As illustrated in FIG. 8, in the case of employing the white RGB array as the color filter array, one pixel block 310D is constituted by a basic pattern (hereinafter, also referred to as "unit pattern") including a total of sixteen photoelectric conversion elements 333 of 4×4 pixels as a repetitive unit in the white RGB array. Accordingly, for example, each pixel block 310D according to this example has a configuration in which a photoelectric conversion element 333W including white RGB color filters which receive respective wavelength components of three primary colors of RGB are disposed between a photoelectric conversion element 333R including a color filter of a red (R) color, a photoelectric conversion element 333G including a color filter of a green (G) color, and a photoelectric conversion element 333B including a color filter of a blue (B) color.

Furthermore, in the case of employing the white RGB array, for example, a pixel signal based on a charge that is transmitted from each of the photoelectric conversion elements 333R, 333G, 333B, and 333W is subjected to signal processing in the signal processing unit 212, and thus it is possible to convert image data that is read out from the pixel array unit 300 and corresponds to one frame into image data of the Bayer array.

As described above, in the case of providing a color filter with respect to the photoelectric conversion element 333, it is possible to use an assembly of the photoelectric conversion elements 333 which constitute the repetitive unit pattern in the color filter array as a combination of the photoelectric conversion elements 333 which receive light of wavelength components necessary to reconstruct a color.

However, there is no limitation thereto, and one pixel block 310 may be constituted by a plurality of unit patterns. In addition, it is possible to group a plurality of the photoelectric conversion elements 333 in the pixel array unit 300 into a plurality of the pixel blocks 310 so that each of the pixel blocks 310 includes the photoelectric conversion elements 333 necessary to reconstruct a color without limitation to the unit pattern.

Furthermore, for example, in the case of the Quad Bayer array, a photoelectric conversion element group related to the same color in the unit pattern may be set as one pixel block 310, and a total of four photoelectric conversion elements 333R, 333Gr, and 333Gb, and 333B which include each color of photoelectric conversion element 333 one by one may be set as one pixel block 310.

2.5 Configuration Example of Pixel Block

Figure 9:
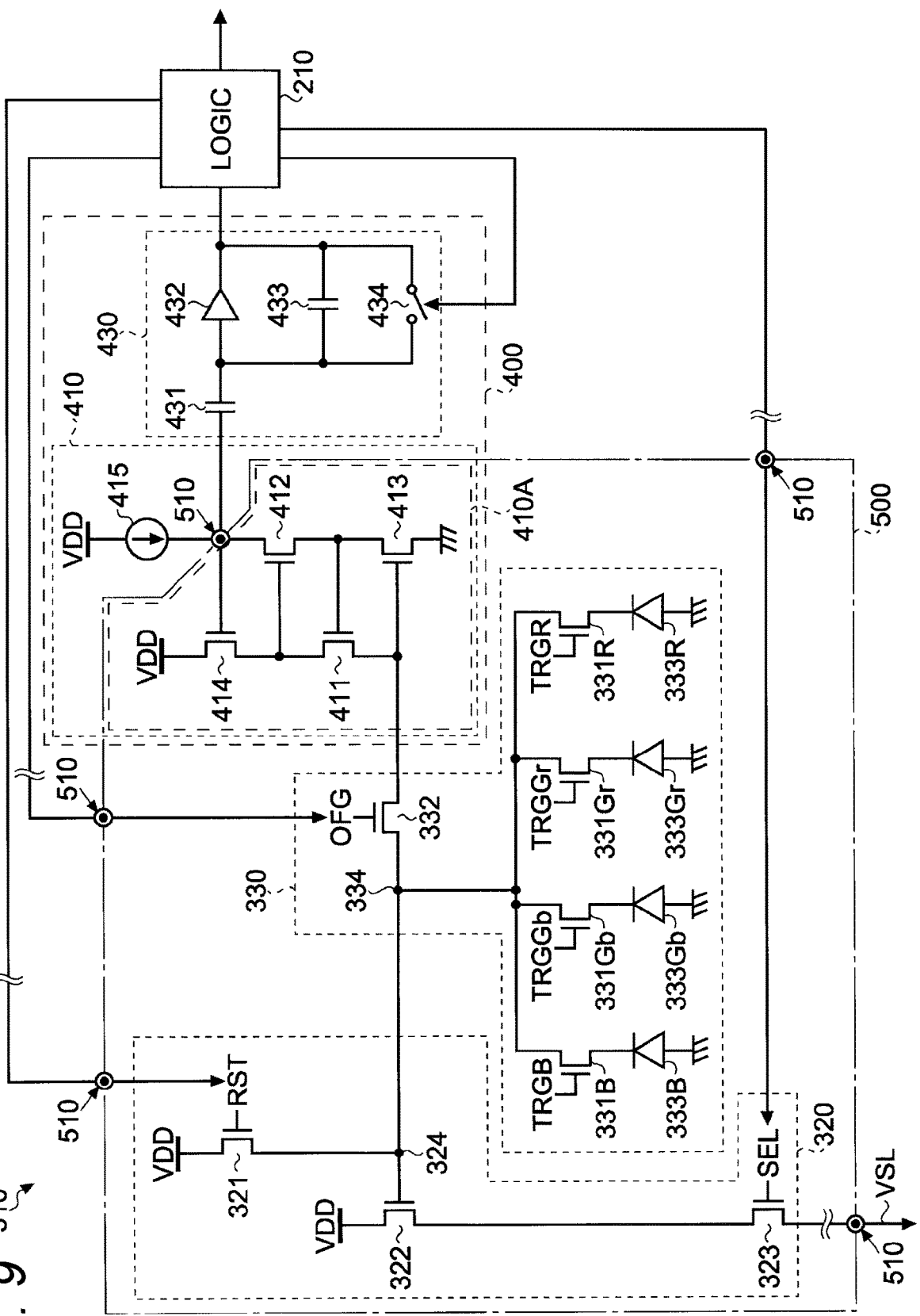
FIG. 9 is a circuit diagram illustrating a schematic configuration example of the pixel block according to the first embodiment.

Next, a configuration example of the pixel block 310 will be described. FIG. 9 is a circuit diagram illustrating a schematic configuration example of the pixel block according to the first embodiment. As illustrated in FIG. 9, for example, the pixel block 310 includes a pixel signal generation unit (or readout circuit) 320, a light-receiving unit 330, and an address event detection unit (or readout circuit) 400. Furthermore, the logic circuit 210 in FIG. 9 is, for example, a logic circuit including the drive circuit 211, the signal processing unit 212, and an arbiter 213 in FIG. 3.

For example, the light-receiving unit 330 includes the photoelectric conversion element 333R including the color filter of a red (R) color, the photoelectric conversion element 333Gr including the color filter of a green (Gr) color, the photoelectric conversion element 333Gb including the color filter of a green (Gb) color, and the photoelectric conversion element 333B including the color filter of a blue (B) color. In addition, the light-receiving unit 330 includes four transmission transistors 331R, 331Gr, 331Gb, and 331B respectively provided to the four photoelectric conversion elements 333R, 333Gr, 333Gb, and 333B, and an overflow gate (OFG) transistor (fifth transistors) 332.

Transmission signals TRGR, TRGGr, TRGGb, and TRGB are respectively supplied to gates of the transmission transistors 331R, 331Gr, 331Gb, and 331B from the drive circuit 211. A control signal OFG is supplied to a gate of the OFG transistor 332 from the drive circuit 211. Outputs through the respective transmission transistors 331R, 331Gr, 331Gb, and 331B are integrated by a node 334. The node 334 is connected to the pixel signal generation unit 320 and is connected to the address event detection unit 400 through the OFG transistor 332.

For example, the pixel signal generation unit 320 includes a reset transistor (second transistor) 321, an amplification transistor (third transistor) 322, a selection transistor (fourth transistor) 323, and a floating diffusion layer (FD) 324.

The transmission transistors 331R, 331Gr, 331Gb, and 331B and the OFG transistor 332 of the light-receiving unit 330 are constituted, for example, by using an N-type metal-oxide-semiconductor (MOS) transistor (hereinafter, simply referred to as "NMOS transistor"). Similarly, the reset transistor 321, the amplification transistor 322, and the selection transistor 323 of the pixel signal generation unit 320 are each constituted, for example, by using the NMOS transistor.

For example, the address event detection unit 400 includes a current-voltage conversion unit 410 and a subtractor 430. However, the address event detection unit 400 may further be provided with a buffer, a quantizer, and a transmission unit. Details of the address event detection unit 400 will be described in the following description by using FIG. 10 and the like.

In the configuration, each of the photoelectric conversion elements 333R, 333Gr, 333Gb, and 333B of the light-receiving unit 330 photoelectrically converts a light beam of a specific wavelength component in incident light to generate a charge.

The transmission transistors 331R, 331Gr, 331Gb, and 331B transmit a charge that is generated in the photoelectric conversion element 333R, 333Gr, 333Gb, or 333B to the node 334 in accordance with the transmission signal TRGR, TRGGr, TRGGb, or TRGB which is applied to each gate thereof. On the other hand, the OFG transistor 332 supplies an electric signal (photocurrent) based on the charge generated in the photoelectric conversion elements 333R, 333Gr, 333Gb, and/or 333B to the address event detection unit 400 in accordance with the control signal OFG.

A floating diffusion layer 324 accumulates charges from the photoelectric conversion elements 333R, 333Gr, 333Gb, and 333B which are integrated by the node 334. A reset transistor 321 discharges (initializes) the charges accumulated in the floating diffusion layer 324 in accordance with a reset signal transmitted from the drive circuit 211. An amplification transistor 322 allows a pixel signal of a voltage value corresponding to a charge amount of charges accumulated in the floating diffusion layer 324 to appear in a vertical signal line VSL. A selection transistor 323 switches connection between the amplification transistor 322 and the vertical signal line VSL in accordance with a selection signal SEL transmitted from the drive circuit 211. Furthermore, the analog pixel signal that appears in the vertical signal line VSL is read out by the column ADC 220 and is converted into a digital pixel signal.

When an instruction for address event detection initiation is given by the control unit 130, the drive circuit 211 in the logic circuit 210 outputs the control signal OFG for setting the OFG transistor 332 of all of a plurality of the light-receiving units 330 in the pixel array unit 300 to an ON-state, and outputs the control signals TRGR, TRGGr, TRGGb, and TRGB for setting all of the transmission transistors 331R, 331Gr, 331Gb, and 331B in all of a plurality of the pixel blocks 310 to an ON-state. With this arrangement, photocurrents generated in the photoelectric conversion elements 333R, 333Gr, 333Gb, and 333B of the light-receiving unit 330 are supplied to the address event detection unit 400 of each of the pixel blocks 310 through the node 334 and the OFG transistor 332.

When detecting address event ignition on the basis of the photocurrents from the light-receiving unit 330, the address event detection unit 400 of the pixel block 310 outputs a request with respect to the arbiter 213. With respect to this, the arbiter 213 arbitrates the request transmitted from the pixel block 310 and transmits a predetermined response to the pixel block 310 that issues the request on the basis of the arbitration result. The pixel block 310 that receives the response supplies a detection signal indicating existence or nonexistence of the address event ignition (hereinafter, referred to as "address event detection signal") to the drive circuit 211 and the signal processing unit 212 in the logic circuit 210.

The drive circuit 211 sets the OFG transistor 332 in the pixel block 310 that is a supply source of the address event detection signal to an OFF-state. With this arrangement, supply of the photocurrent from the light-receiving unit 330 to the address event detection unit 400 in the pixel block 310 is stopped.

Next, the drive circuit 211 sequentially sets the transmission transistors 331R, 331Gr, 331Gb, and 331B in the light-receiving unit 330 of the pixel block 310 to an ON-state by the transmission signal TRG. With this arrangement, charges which are generated in the photoelectric conversion elements 333R, 333Gr, 333Gb, and 333B in the light-receiving unit 330 are sequentially transmitted to the floating diffusion layer 324 through the transmission transistors 331R, 331Gr, 331Gb, and 331B. In addition, a pixel signal of a voltage values corresponding to a charge amount of charges accumulated in the floating diffusion layer 324 sequentially appears in the vertical signal line VSL that is connected to the selection transistor 323 of the pixel signal generation unit 320.

As described above, in the solid-state imaging device 200, pixel signals are sequentially output to the column ADC 220 from the unit pixels 330R, 330Gr, 330Gb, and 330B which are included in the pixel block 310 in which address event ignition is detected.

Furthermore, for example, the light-receiving unit 330, the pixel signal generation unit 320, and two log (LG) transistors (sixth and seventh transistors) 411 and 414 and two amplification transistors (eighth and ninth transistors) 412 and 413 in the current-voltage conversion unit 410 of the address event detection unit 400 are disposed, for example, in the light-receiving chip 201 illustrated in FIG. 2, and other configurations are disposed, for example, in the logic chip 202 that is joined to the light-receiving chip 201 through a Cu—Cu joint 510. Therefore, in the following description, in the pixel block 310, configurations which are disposed in the light-receiving chip 201 are referred to as "upper layer circuit", and the two LG transistors 411 and 414 and the two amplification transistors 412 and 413 in the current-voltage conversion unit 410 are referred to as "upper layer detection circuit 410A". Furthermore, although not illustrated in FIG. 9, the logic circuit 210 and gates of the transmission transistors 331R, 331Gr, 331Gb, and 331B are also connected through the Cu—Cu joint 510.

2.6 Configuration Example of Address Event Detection Unit

Figure 10:
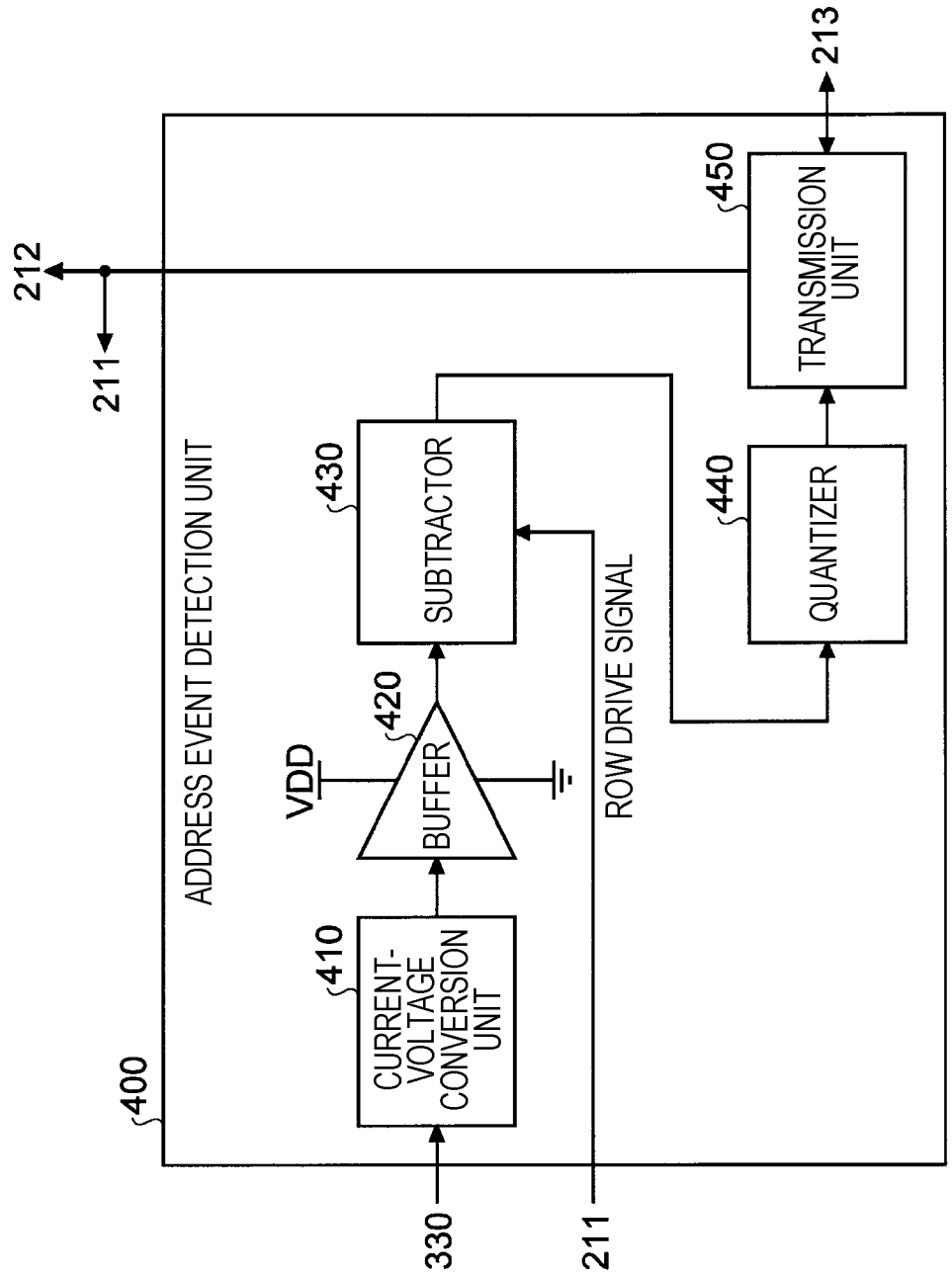
FIG. 10 is a block diagram illustrating a schematic configuration example of an address event detection unit according to the first embodiment.

FIG. 10 is a block diagram illustrating a schematic configuration example of the address event detection unit according to the first embodiment. As illustrated in FIG. 10, the address event detection unit 400 includes a current-voltage conversion unit 410, a buffer 420, a subtractor 430, a quantizer 440, and a transmission unit 450. Furthermore, in the following description, in a case where the photoelectric conversion elements 333R, 333Gr, 333Gb, and 333B are not distinguished, reference numerals thereof will be set to 333.

The current-voltage conversion unit 410 converts the photocurrent from the light-receiving unit 330 into a voltage signal in a logarithm thereof and supplies the voltage signal generated through the conversion to the buffer 420.

The buffer 420 corrects the voltage signal transmitted from the current-voltage conversion unit 410, and outputs a voltage signal after correction to the subtractor 430.

The subtractor 430 lowers a voltage level of the voltage signal transmitted from the buffer 420 in accordance with a row drive signal transmitted from the drive circuit 211 and supplies the lowered voltage signal to the quantizer 440.

The quantizer 440 quantizes the voltage signal transmitted from the subtractor 430 into a digital signal, and outputs the digital signal generated through the quantization to the transmission unit 450 as a detection signal.

The transmission unit 450 transmits the detection signal transmitted from the quantizer 440 to the signal processing unit 212 and the like. For example, when address event ignition is detected, the transmission unit 450 supplies a request for transmission of an address event detection signal from the transmission unit 450 to the drive circuit 211 and the signal processing unit 212 to the arbiter 213. In addition, when receiving a response with respect to the request from the arbiter 213, the transmission unit 450 supplies the detection signal to the drive circuit 211 and the signal processing unit 212.

2.7 Configuration Example of Current-Voltage Conversion Unit

For example, the current-voltage conversion unit 410 in the configuration illustrated in FIG. 10 includes the two LG transistors 411 and 414, the two amplification transistors 412 and 413, and a constant-current circuit 415 as illustrated in FIG. 9.

For example, a source of the LG transistor 411 and a gate of the amplification transistor 413 are connected to a drain of the OFG transistor 332 of the light-receiving unit 330. In addition, for example, a drain of the LG transistor 411 is connected to a source of the LG transistor 414 and a gate of the amplification transistor 412. For example, a drain of the LG transistor 414 is connected to a power supply terminal VDD.

In addition, for example, a source of the amplification transistor 413 is grounded, and a drain thereof is connected to a gate of the LG transistor 411 and a source of the amplification transistor 412. For example, a drain of the amplification transistor 412 is connected to a power supply terminal VDD through the constant-current circuit 415. For example, the constant-current circuit 415 is constituted by a load MOS transistor such as a p-type MOS transistor.

In this connection relationship, a loop-shaped source follower circuit is constructed. With this arrangement, a photocurrent from the light-receiving unit 330 is converted into a voltage signal in a logarithmic value corresponding to a charge amount thereof. Furthermore, the LG transistors 411 and 414, and the amplification transistors 412 and 413 may be each constituted, for example, by an NMOS transistor.

2.8 Configuration Example of Subtractor and Quantizer

Figure 11:
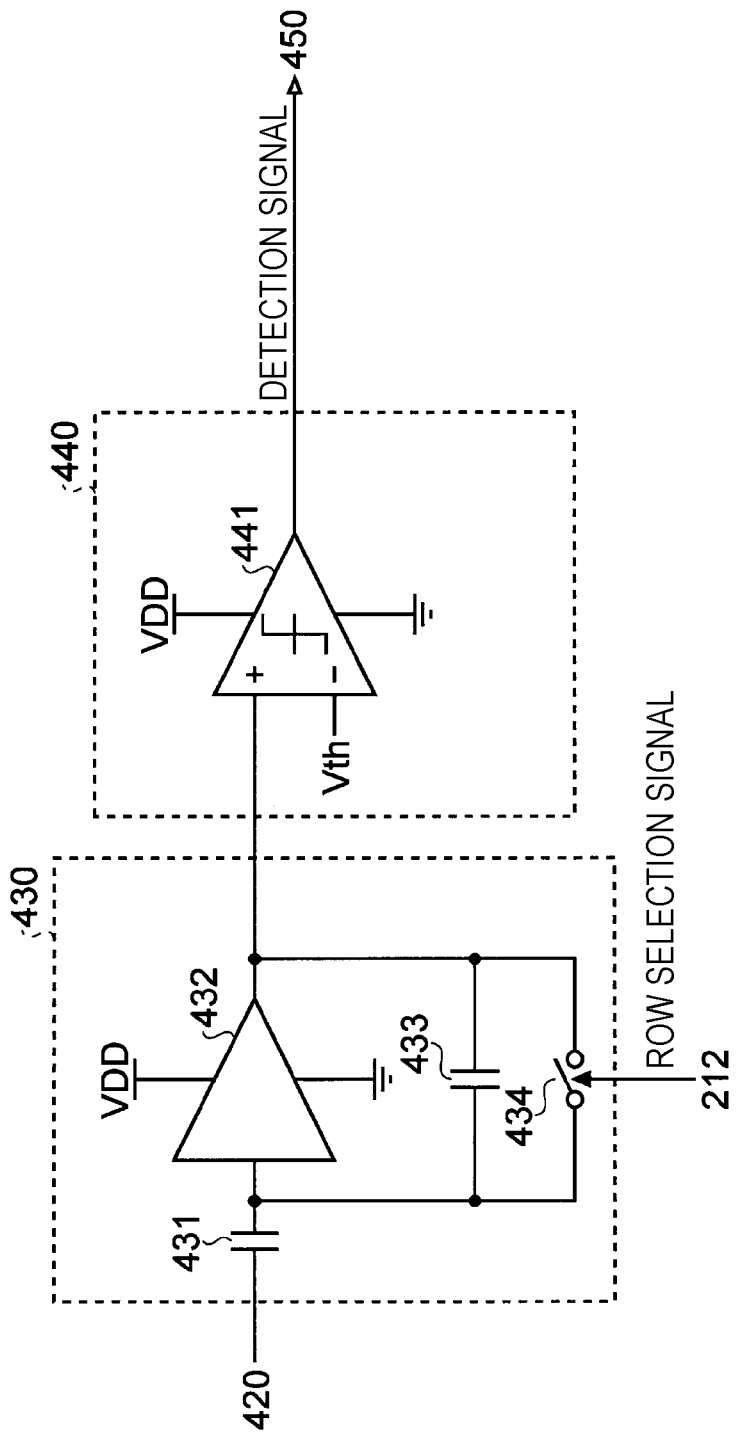
FIG. 11 is a circuit diagram illustrating a schematic configuration example of a subtractor and a quantizer according to the first embodiment.

FIG. 11 is a circuit diagram illustrating a schematic configuration example of the subtractor and the quantizer according to the first embodiment. The subtractor 430 includes capacitors 431 and 433, an inverter 432, and a switch 434. In addition, the quantizer 440 includes a comparator 441.

One end of the capacitor 431 is connected to an output terminal of the buffer 420, and the other end is connected to an input terminal of the inverter 432. The capacitor 433 is connected to the inverter 432 in parallel. The switch 434 opens or closes a route connecting both ends of the capacitor 433 in accordance with a row drive signal.

The inverter 432 inverts a voltage signal that is input through the capacitor 431. The inverter 432 outputs an inverted signal to a non-inverting input terminal (+) of the comparator 441.

When the switch 434 is turned on, a voltage signal Vinit is input to a butter 420 side of the capacitor 431. In addition, the opposite side becomes a virtual ground terminal. A potential of the virtual ground terminal is set to zero for convenience. At this time, when a capacity of the capacitor 431 is set as C1, a potential Qinit that is accumulated in the capacitor 431 is expressed by the following Expression (1). On the other hand, both ends of the capacitor 433 are short-circuited, and thus an accumulated charge thereof becomes zero.

$$Qinit = C1 \times Vinit \tag{1}$$

Next, when considering a case where the switch 434 is turned off, and a voltage of the capacitor 431 on the buffer 420 side varies and reaches Vafter, a charge Qafter accumulated in the capacitor 431 is expressed by the following Expression (2).

$$Qafter = C1 V \text{ after} \tag{2}$$

On the other hand, when an output voltage is set as Vout, a charge Q2 accumulated in the capacitor 433 is expressed by the following Expression (3).

$$Q2 = -C2 \times Vout \tag{3}$$

At this time, a total charge amount of the capacitors 431 and 433 does not vary, and thus the following Expression (4) is established.

$$Qinit = Qafter + Q2 \tag{4}$$

When Expression (1) to Expression (3) are substituted for Expression (4), the following Expression (5) is obtained.

$$Vout = -(C1/C2) \times (Vafter - Vinit) \tag{5}$$

Expression (5) represents a subtraction operation of a voltage signal, and a gain of the subtraction result becomes C1/C2. Typically, it is desired to maximize (or alternatively, increase) the gain, and thus it is preferable to make a design so that C1 becomes large and C2 becomes small. On the other hand, when C2 is excessively small, kTC noise increases, and thus there is a concern that noise characteristics deteriorate. Accordingly, a reduction in the capacity of C2 is limited to a range capable of permitting noise. In addition, since the address event detection unit 400 including the subtractor 430 is mounted for every pixel block 310, a restriction on an area is present in capacities C1 and C2. Values of the capacities C1 and C2 are determined in consideration of the restriction.

The comparator 441 compares a voltage signal transmitted from the subtractor 430 and a predetermined threshold voltage Vth that is applied to an inverting input terminal (−). The comparator 441 outputs a signal indicating the comparison result to the transmission unit 450 as a detection signal.

In addition, when a conversion gain by the current-voltage conversion unit 410 is set as $CG_{log}$, and a gain of the buffer 420 is set to "1", a gain A of the entirety of the address event detection unit 400 is expressed by the following Expression (6).

[Math. 1]

$$A = \frac{CG_{log} \cdot C1}{C2} \sum_{n=1}^{N} i_{photo\_n} \tag{6}$$

In Expression (6), $i_{photo\_n}$ represents a photocurrent of an nth photoelectric conversion element 333, and a unit thereof is, for example, an ampere (A). N represents the number of the photoelectric conversion elements 333 in the pixel block 310.

2.9 Configuration Example of Column ADC

Figure 12:
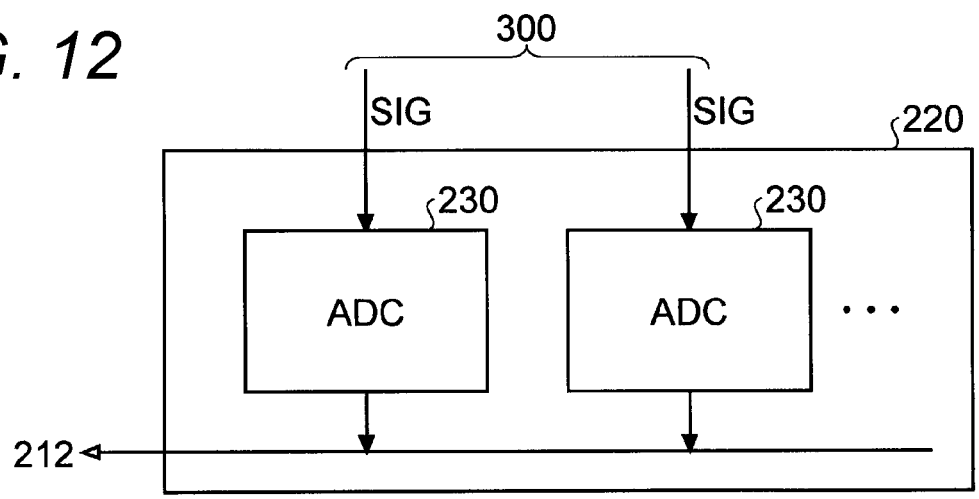
FIG. 12 is a block diagram illustrating a schematic configuration example of a column ADC according to the first embodiment.

FIG. 12 is a block diagram illustrating a schematic configuration example of the column ADC according to the first embodiment. The column ADC 220 includes a plurality of ADCs 230 which are provided for every column of the pixel block 310.

Each of the ADCs 230 converts an analog pixel signal SIG that is supplied through the vertical signal line VSL into a digital signal. For example, the pixel signal SIG is converted into a digital signal in which a bit length is greater than that of a detection signal. For example, when the detection signal is set to two bits, the pixel signal SIG is converted into a digital signal of three or greater bits (16 bits and the like). The ADC 230 supplies a generated digital signal to the signal processing unit 212.

2.10 Operation Example of Solid-State Imaging Device

Next, an operation of the solid-state imaging device 200 according to this embodiment will be described in detail with reference to the accompanying drawings.

2.10.1 Timing Chart

Figure 13:
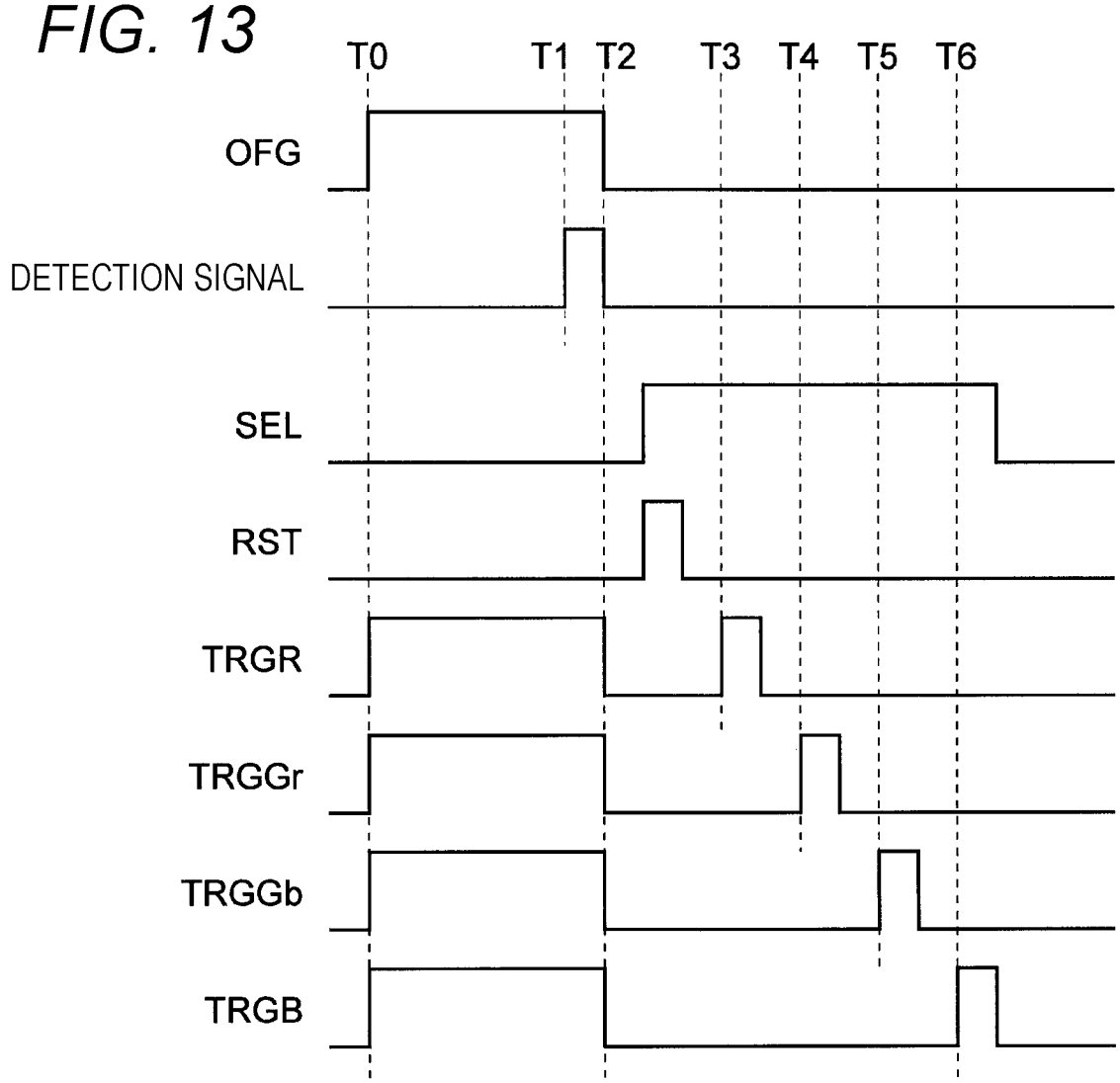
FIG. 13 is a timing chart illustrating an example of an operation of the solid-state imaging device according to the first embodiment.

First, an example of the operation of the solid-state imaging device 200 will be described by using a timing chart. FIG. 13 is a timing chart illustrating an example of the operation of the solid-state imaging device according to the first embodiment.

As illustrated in FIG. 13, at a timing T0, when an instruction for address event detection initiation is given by the control unit 130, the drive circuit 211 raises the control signal OFG applied to the gate of the OFG transistor 332 of all of the light-receiving units 330 in the pixel array unit 300 to a high level, and raises the control signals TRGR, TRGGr, TRGGb, and TRGB which are applied to gates of the transmission transistors 331R, 331Gr, 331Gb, and 331B of all of the light-receiving units 330 to a high level. With this arrangement, a plurality of the OFG transistors 332 of all of the light-receiving units 330, and the transmission transistors 331R, 331Gr, 331Gb, and 331B enter an ON-state, and a photocurrent based on a charge generated in each of the photoelectric conversion elements 333R, 333Gr, 333Gb, and 333B is supplied from each of the light-receiving units 330 to each of the address event detection units 400.

Next, a case where the address event detection unit 400 of an arbitrary pixel block 310 detects address event ignition in a period in which the control signal OFG is in a high level will be assumed. In this case, the address event detection unit 400 that detects the address event ignition transmits a request to the arbiter 213. A response for the request is returned to the address event detection unit 400 that issues the request from the arbiter 213.

The address event detection unit 400 that receives the response raises a detection signal that is input to the drive circuit 211 and the signal processing unit 212 to a high level, for example, in a period of a timing T1 to a timing T2. Furthermore, in this description, it is assumed that the detection signal is a one-bit signal indicating a detection result of an ON event.

The drive circuit 211 to which a high-level detection signal is input from the address event detection unit 400 at the timing T1 lowers all control signals OFG, and all of the control signals TRGR, TRGGr, TRGGb, and TRGB to a low level at a subsequent timing T2. With this arrangement, supply of a photocurrent from all of the light-receiving units 330 of the pixel array unit 300 to the address event detection unit 400 is stopped.

In addition, at the timing T2, the drive circuit 211 raises a selection signal SEL that is applied to a gate of the selection transistor 323 in the pixel signal generation unit 320 of a reading-out target pixel block 310 to a high level, and raises a reset signal RST that is applied to a gate of the reset transistor 321 of the same pixel signal generation unit 320 to a high level for a constant pulse period. With this arrangement, charges accumulated in the floating diffusion layer 324 of the pixel signal generation unit 320 are discharged (initialized), and thus the unit pixel is reset in a pixel block unit. In this manner, a voltage, which appears in the vertical signal line VSL in a state in which the floating diffusion layer 324 is initialized, is read out by the ADC 230 connected to the vertical signal line VSL in the column ADC 220 as a reset-level pixel signal (hereinafter, simply referred to as "reset level") for every pixel block 310, and is converted into a digital value.

Next, at a timing T3 after reading out the reset level, the drive circuit 211 applies a transmission signal TRGR of a constant pulse period, for example, to the gate of the transmission transistor 331R in the reading-out target pixel block 310. With this arrangement, a charge generated in the photoelectric conversion element 333R is transmitted to the floating diffusion layer 324 in the pixel signal generation unit 320, and a voltage corresponding to charges accumulated in the floating diffusion layer 324 appears in the vertical signal line VSL. In this manner, the voltage that appears in the vertical signal line VSL is read out by the ADC 230 connected to the vertical signal line VSL in the column ADC 220 as a signal-level pixel signal (hereinafter, simply referred to as "signal level") of a red (R) color and is converted into a digital value.

The signal processing unit 212 executes CDS processing in which a difference between the reset level and the signal level which are read out as described above is obtained as a net pixel signal corresponding to a light-reception amount of the photoelectric conversion element 333R.

Next, at a timing T4 after reading out the signal level based on the photoelectric conversion element 333R, the drive circuit 211 applies a transmission signal TRGGr of a constant pulse period, for example, to the gate of the transmission transistor 331Gr in the reading-out target pixel block 310. With this arrangement, a charge generated in the photoelectric conversion element 333Gr is transmitted to the floating diffusion layer 324 in the pixel signal generation unit 320, and a voltage corresponding to charges accumulated in the floating diffusion layer 324 appears in the vertical signal line VSL. In addition, the voltage that appears in the vertical signal line VSL is read out by the ADC 230 of the column ADC 220 as a signal level of a green (Gr) color and is converted into a digital value.

Next, in a similar manner, signal levels based on the photoelectric conversion elements 333Gb and 333B in the reading-out target pixel block 310 are read out by the ADC 230 of the column ADC 220 and are converted into digital values (timings T5 and T6).

Then, when reading-out of the signal levels based on all of the photoelectric conversion elements 333 in the reading-out target pixel block 310 is completed, the drive circuit 211 raises the control signal OFG that is applied to the gate of the OFG transistors 332 of all of the light-receiving units 330 in the pixel array unit 300, and the control signals TRGR, TRGGr, TRGGb, and TRGB which are applied to the gates of the transmission transistors 331R, 331Gr, 331Gb, and 331B of all of the light-receiving units 330 to a high level. With this arrangement, detection of address event ignition in all of the light-receiving units 330 in the pixel array unit 300 is restarted.

2.10.2 Flowchart

Figure 14:
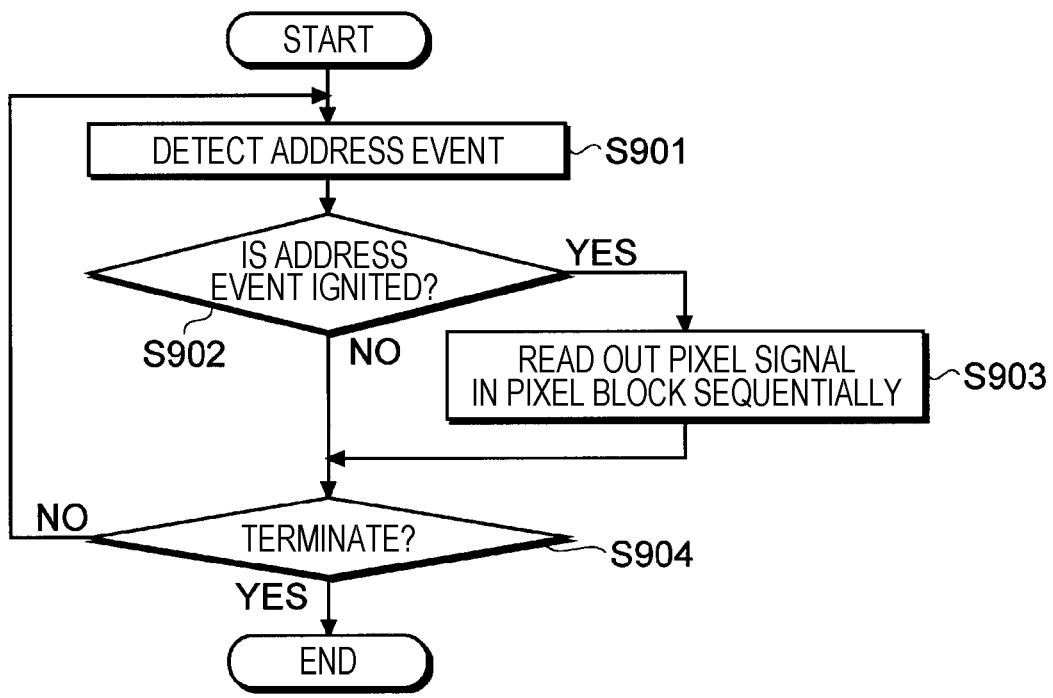
FIG. 14 is a flowchart illustrating an example of the operation of the solid-state imaging device according to the first embodiment.

Next, an example of the operation of the solid-state imaging device 200 will be described by using a flowchart. FIG. 14 is a flowchart illustrating an example of the operation of the solid-state imaging device according to the first embodiment. For example, the operation is initiated when a predetermined application for detecting an address event is executed.

As illustrated in FIG. 14, in this operation, first, each of the pixel blocks 310 in the pixel array unit 300 detects existence or nonexistence of address event ignition (step S901). In addition, the drive circuit 211 determines whether or not address event ignition is detected in any one of the pixel blocks 310 (step S902).

In a case where the address event ignition is not detected (NO in step S902), this operation proceeds to step S904. On the other hand, in a case where the address event ignition is detected (YES in step S902), the drive circuit 211 sequentially executes reading-out of a pixel signal with respect to unit pixels which belong to the pixel block 310 for which the address event ignition is detected, thereby reading out the pixel signal sequentially from unit pixels which belong to the reading-out target pixel block 310 (step S903), and the processing proceeds to step S904.

In step S904, it is determined whether or not to terminate this operation. In a case where this operation is not terminated (NO in step S904), this operation returns to step S901, and the subsequent operations are repeated. On the other hand, in a case where this operation is terminated (YES in step S904), this operation is terminated.

2.11 Layout Example of Upper Layer Circuit

As described above, in the configuration illustrated in FIG. 9, an upper layer circuit 500 including the light-receiving unit 330, the pixel signal generation unit 320, the two LG transistors 411 and 414 and the two amplification transistors 412 and 413 in the current-voltage conversion unit 410 of the address event detection unit 400 is disposed in the light-receiving chip 201 illustrated in FIG. 2 as an example, and the other configurations are disposed in the logic chip 202 that is joined to the light-receiving chip 201 through the Cu—Cu joining as an example. Hereinafter, with regard to a layout example in the light-receiving chip 201 of the upper layer circuit 500, several examples will be described.

2.11.1 First Layout Example

Figure 15:
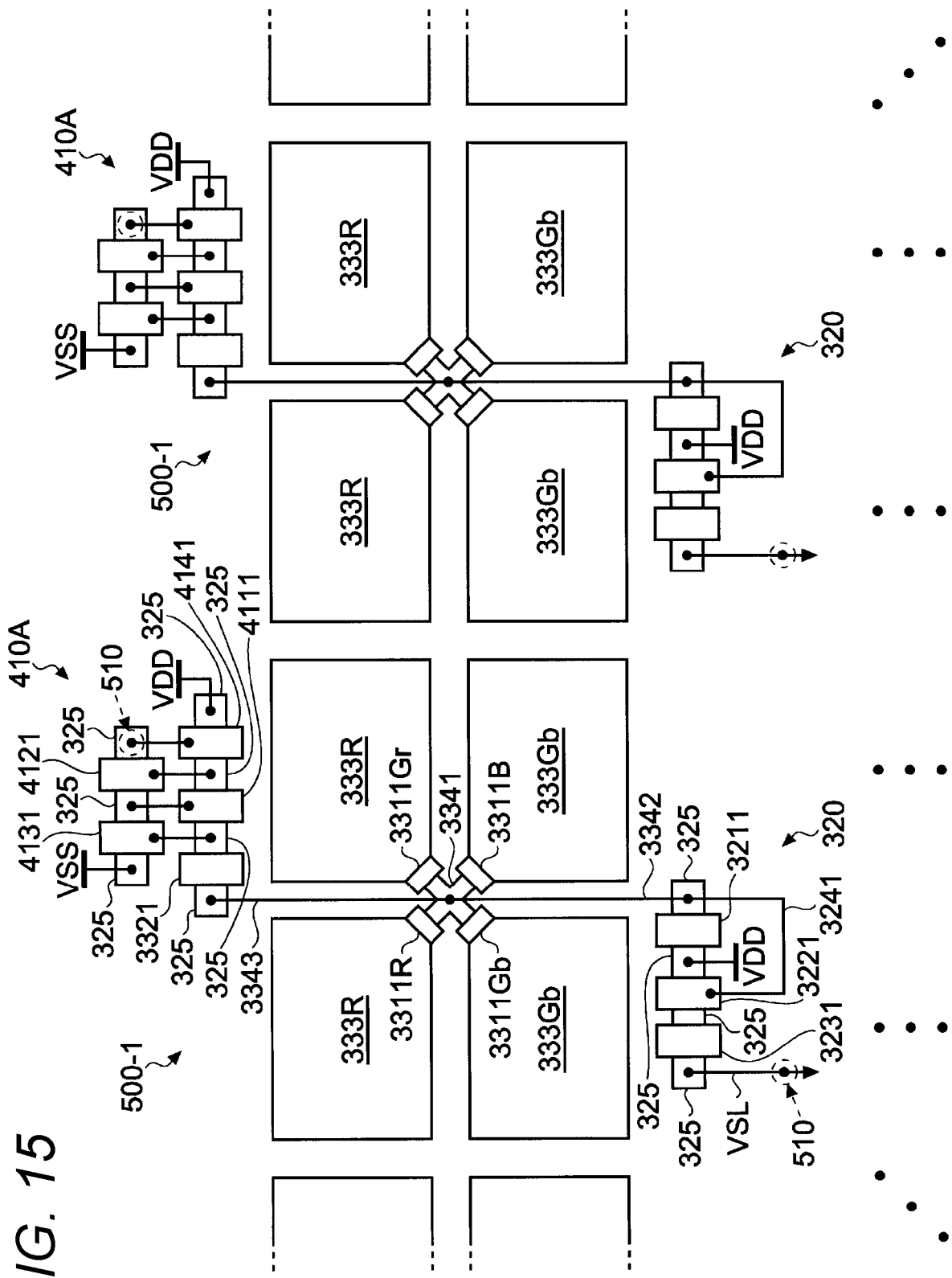
FIG. 15 is a top view illustrating a schematic configuration example of an upper layer circuit according to a first layout example of the first embodiment.

FIG. 15 is a top view illustrating a schematic configuration example of an upper layer circuit according to a first layout example. As illustrated in FIG. 15, in the first layout example, upper layer circuits 500-1 are arranged in a two-dimensional lattice shape in row and column directions. Each of the upper layer circuits 500-1 includes four photoelectric conversion elements 333R, 333Gr, 333Gb, and 333B which are formed by injecting an N-type dopant (donor) into a semiconductor substrate in which a P-type dopant (acceptor) is diffused. For example, each of the photoelectric conversion elements 333R, 333Gr, 333Gb, and 333B is provided with a microlens that condenses incident light, and a color filter that selectively allows a wavelength component allocated to each of the photoelectric conversion elements 333R, 333Gr, 333Gb, and 333B to be transmitted therethrough.

For example, the four photoelectric conversion elements 333R, 333Gr, 333Gb, and 333B are arranged in a 2×2 matrix shape along a unit pattern of the Bayer array (refer to FIG. 5). Furthermore, in FIG. 15, a shape of an incident surface of each of the photoelectric conversion elements 333R, 333Gr, 333Gb, and 333B is set to a rectangular shape, but there is no limitation to the rectangular shape.

Transmission gates 3311R, 3311Gr, 3311Gb, and 3311B of the transmission transistors 331R, 331Gr, 331Gb, and 331B are respectively provided at positions adjacent to each other in the four photoelectric conversion elements 333R, 333Gr, 333Gb, and 333B, for example, corners opposite to each other. In addition, drains of the transmission transistors 331R, 331Gr, 331Gb, and 331B are connected to each other by an integration unit 3341 corresponding to the node 334 (refer to FIG. 9). The integration unit 3341 may be an interconnection layer or a diffusion region having conductivity.

For example, the pixel signal generation unit 320 is connected to an interconnection 3342 that extends downward from the integration unit 3341 in a column direction. A reset gate 3211 of the reset transistor 321, an amplification gate 3221 of the amplification transistor 322, and a selection gate 3231 of the selection transistor 323 in the pixel signal generation unit 320 are linearly arranged in a line, for example, from a connection site with the interconnection 3342 in parallel to a row direction.

Diffusion regions 325, which are respectively provided to the reset gate 3211, the amplification gate 3221, and the selection gate 3231 and function as a source and a drain, are arranged, for example, in the same direction as an arrangement direction of the reset gate 3211, the amplification gate 3221, and the selection gate 3231. At this time, the diffusion region 325 between the reset gate 3211 and the amplification gate 3221 may be shared by the reset transistor 321 and the amplification transistor 322. Similarly, the diffusion region 325 between the amplification gate 3221 and the selection gate 3231 may be shared by the amplification transistor 322 and the selection transistor 323.

The diffusion region 325 that functions as a drain of the reset transistor 321 and the amplification gate 3221 are connected to each other by an interconnection 3241 that functions as the floating diffusion layer 324. The diffusion region 325 between the reset gate 3211 and the amplification gate 3221 is connected to a power supply terminal VDD.

On the other hand, for example, the OFG transistor 332 in the light-receiving unit 330 and the current-voltage conversion unit 410 are connected to an interconnection 3343 that extends upward from the integration unit 3341 in the column direction. For example, an OFG gate 3321 of the OFG transistor 332, and an LG gate 4111 of the LG transistor 411 and an LG gate 4141 of the LG transistor 414 in the current-voltage conversion unit 410 are linearly arranged in a line from a connection site with the interconnection 3343 in parallel to the row direction.

Diffusion regions 325, which are respectively provided with respect to the OFG gate 3321, the LG gate 4111, and the LG gate 4141 and function as a source and a drain, are arranged, for example, in the same direction as an arrangement direction of the OFG gate 3321, the LG gate 4111, and the LG gate 4141. At this time, the diffusion region 325 between the OFG gate 3321 and the LG gate 4111 may be shared by the OFG transistor 332 and the LG transistor 411. Similarly, the diffusion region 325 between the LG gate 4111 and the LG gate 4141 may be shared by the LG transistors 411 and 414.

An amplification gate 4121 of the amplification transistor 412 and an amplification gate 4131 of the amplification transistor 413 are arranged in parallel to an array of the LG gates 4111 and 4141. For example, diffusion regions 325, which are respectively provided with respect to the amplification gates 4121 and 4131 and function as a source and a drain, are arranged in the same direction as an arrangement direction of the amplification gates 4121 and 4131. At this time, the diffusion region 325 between the amplification gates 4121 and 4131 may be shared by the amplification transistors 412 and 413.

In addition, the diffusion region 325 that functions as a drain of the LG transistor 414 is connected to a power supply terminal VDD, and the diffusion region 325 that functions as a drain of the amplification transistor 413 is grounded.

In addition, the diffusion region 325 between the OFG gate 3321 and the LG gate 4111 is connected to the amplification gate 4131, the diffusion region 325 between the LG gate 4111 and the LG gate 4141 is connected to the amplification gate 4121, the diffusion region 325 between the amplification gate 4121 and the amplification gate 4131 is connected to the LG gate 4111, and the diffusion region 325 that functions as a drain of the amplification transistor 412 is connected to the LG gate 4141.

In the above-described configuration, the diffusion region 325 that functions as a drain of the selection transistor 323 and the diffusion region 325 that functions as the drain of the amplification transistor 412 are each connected to the logic chip 202 through the Cu—Cu joint 510. The Cu—Cu joint 510 functions as a connection portion that electrically connects the light-receiving chip 201 and the logic chip 202, and also functions as a joint for mechanically laminating the light-receiving chip 201 and the logic chip 202.

Accordingly, the diffusion region 325 that functions as the drain of the selection transistor 323 is electrically connected to the vertical signal line VSL on the logic chip 202 side through the Cu—Cu joint 510. In addition, the diffusion region 325 that functions as the drain of the amplification transistor 412 is electrically connected to remaining circuit configurations of the current-voltage conversion unit 410 disposed on the logic chip 202 side through the Cu—Cu joint 510.

In addition, although not illustrated in the drawing, the transmission gates 3311R, 3311Gr, 3311Gb, and 3311B, and the OFG gate 3321 in the light-receiving unit 330, and the reset gates 3211 and the selection gate 3231 in the pixel signal generation unit 320 as illustrated in FIG. 9 are connected to the drive circuit 211 of the logic chip 202 through a Cu—Cu joint 510 (not illustrated).

As described above, when the pixel signal generation unit 320 and the upper layer detection circuit 410A are laid out to linearly extend respectively, it is possible to shorten an interconnection length. With this arrangement, it is possible to reduce the occupation ratio of the pixel signal generation unit 320 and the upper layer detection circuit 410A on the light-receiving surface, and thus the occupation ratio of the photoelectric conversion element 333 increases. As a result, it is possible to improve light-reception efficiency.

In addition, it is possible to use an NMOS transistor as the respective transistors which constitute the pixel signal generation unit 320, and the respective transistors which constitute the upper layer detection circuit 410A. Accordingly, when disposing the transistors in the same light-receiving chip 201, it is possible to simplify a manufacturing process of the light-receiving chip 201.

In addition, a layout of the respective transistors which constitute the pixel signal generation unit 320, and a layout of the respective transistors which constitute the upper layer detection circuit 410A are similar to each other, and thus when the configurations are disposed in the same light-receiving chip 201, it is also possible to make a layout design of the light-receiving chip 201 easy.

Here, it should be understood that an imaging device includes at least one floating diffusion region 3341, a set of photoelectric conversion regions 333R, 333R, 333Gb, 333Gb sharing the at least one floating diffusion region 3341 and that convert incident light into electric charges. Further, a first readout circuit 320 is coupled to the at least one floating diffusion region 3341 and located at a first side of the set of photoelectric conversion regions, and a second readout circuit 400 is coupled to the at least one floating diffusion region 3341. The second readout circuit 400 includes a portion 410A located at a second side of the set of photoelectric conversion regions that is opposite the first side. The second readout circuit 400 is also configured to control the first readout circuit 320. The second readout circuit 400 is configured to convert a voltage signal into a logarithmic value based on the electric charges. The second readout circuit 400 includes a first set of transistors (with gates 3321, 4111, 4141) and a second set of transistors (with gates 4131, 4121) spaced apart from one another in a first direction. The first set of transistors and the second set of transistors are arranged in a second direction substantially perpendicular to the first direction. The set of photoelectric conversion regions includes a first group of four photoelectric conversion regions in a 2×2 matrix. A first line (not shown) extending in the first direction intersects the first and second sets of transistors and first and second photoelectric conversion regions in the first group. A second line (not shown) that extends in the first direction and that is offset from the first line in the second direction intersects the at least one floating diffusion region. The first readout circuit 320 includes a third set of transistors (with gates 3211, 3221, 3231) that are arranged in the second direction. A third line (not shown) that extends in the first direction and that is offset from the second line in the second direction intersects the third set of transistors and third and fourth photoelectric conversion regions in the first group. A number of transistors in the third set of transistors and a number of transistors in the first set of transistors is equal. A number of transistors in the second set of transistors is fewer than the number of the transistors in the first set of transistors. The set of photoelectric conversion regions includes a second group of four photoelectric conversion regions in a 2×2 matrix, and the first readout circuit 320 is between the first group and the second group in the first direction (see FIG. 21). The at least one floating diffusion region 3341 includes a first floating diffusion region 3341 shared by the first group of four photoelectric conversion regions, and a second floating diffusion region 3341 shared by the second group of four photoelectric conversion regions (see FIG. 21).

2.11.2 Second Layout Example

Figure 16:
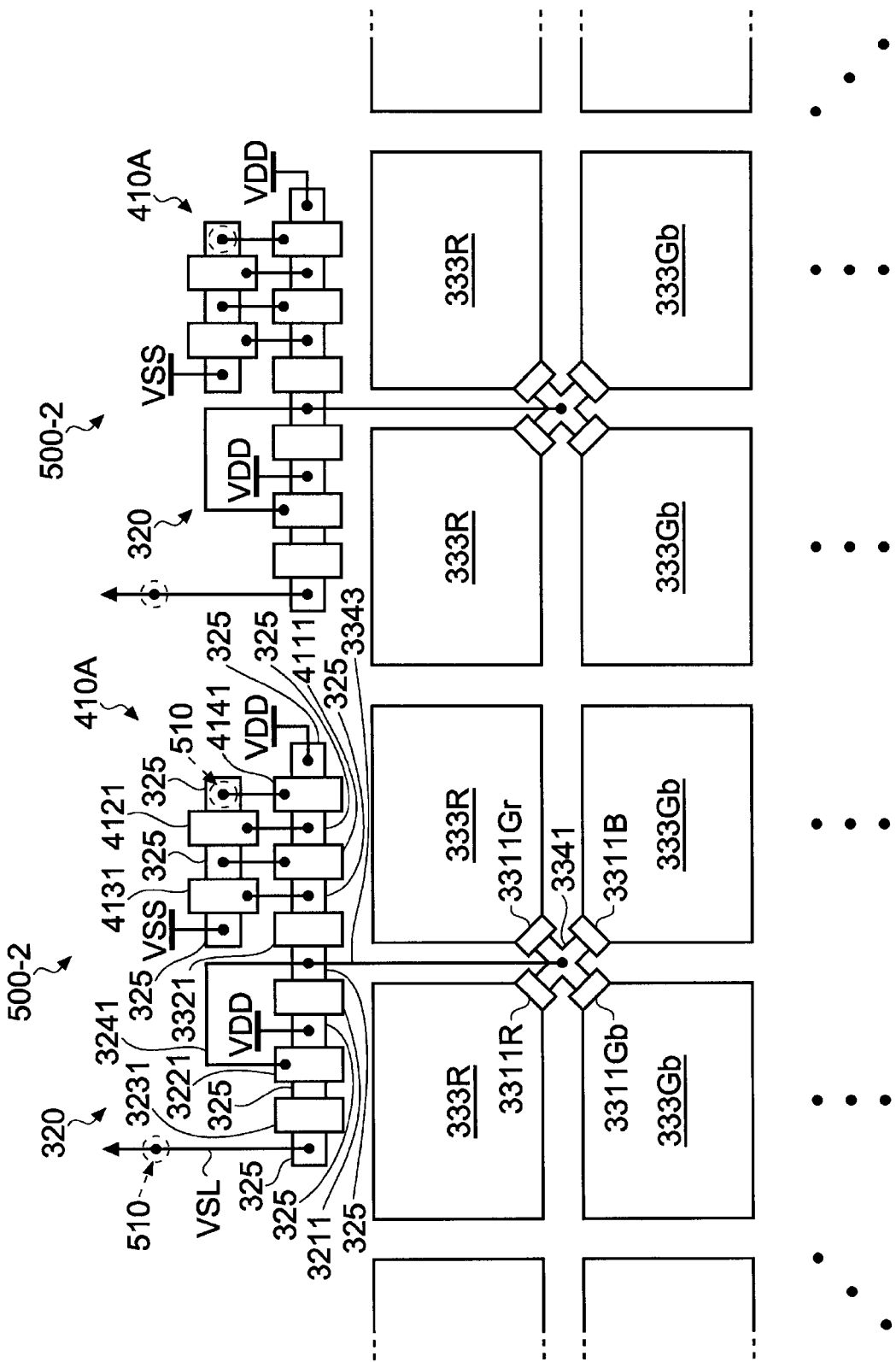
FIG. 16 is a top view illustrating a schematic configuration example of an upper layer circuit according to a second layout example of the first embodiment.

FIG. 16 is a top view illustrating a schematic configuration example of an upper layer circuit according to a second layout example. As illustrated in FIG. 16, in the second layout example, in a similar manner as in the first layout example, upper layer circuits 500-2 are arranged in a two-dimensional lattice shape in row and column directions. However, in each of the upper layer circuits 500-2, the pixel signal generation unit 320 and the upper layer detection circuit 410A are connected to, for example, an interconnection 3343 that extends upward from the integration unit 3341 in the column direction differently from the first layout example. In addition, the diffusion region 325 that functions as the drain of the reset gate 3211 and the diffusion region 325 that functions as a source of the OFG transistor 332 are commonized and are connected to the interconnection 3343.

The reset gate 3211, the amplification gate 3221, and the selection gate 3231, and the OFG gate 3321, the LG gate 4111, and the LG gate 4141 are linearly arranged in a line, for example, from a connection site with the interconnection 3343 in parallel to the row direction.

The diffusion regions 325, which are provided with respect to the reset gate 3211, the amplification gate 3221, and the selection gate 3231 and with respect to the OFG gate 3321, the LG gate 4111, and the LG gate 4141, and function as a source and a drain, are arranged, for example, in the same direction as in the arrangement direction thereof. At this time, the diffusion region 325 between the gates may be shared by transistors adjacent to each other. In addition, for example, the other configuration may be similar to those in the upper layer circuit 500-1 in the first layout example.

As described above, when the pixel signal generation unit 320 and the upper layer detection circuit 410A are laid out to linearly extend, it is possible to shorten an interconnection length thereof. With this arrangement, it is possible to further reduce the occupation ratio of the pixel signal generation unit 320 and the upper layer detection circuit 410A on the light-receiving surface, and thus the occupation ratio of the photoelectric conversion element 333 increases. As a result, it is possible to further improve the light-reception efficiency.

2.11.3 Third Layout Example

FIG. 17 is a top view illustrating a schematic configuration example of an upper layer circuit according to a third layout example. As illustrated in FIG. 17, an upper layer circuit 500-3 is configured as follows. For example, in a configuration similar to that of the upper layer circuit 500-1 according to the first layout example exemplified by using FIG. 15, the four-leg integration unit 3341 is substituted with a five-leg integration unit 5341, and the OFG gate 3321 is disposed at one branch of the five-leg integration unit 5341. In addition, the interconnection 3343 is configured to connect a drain of the OFG transistor 332 and a diffusion region 325 that functions as a source of the LG transistor 411 to each other.

According to this configuration, in a period of reading-out a pixel signal, that is, in a period in which the control signal OFG supplied to the OFG gate 3321 is set to a low level, it is possible to shorten an interconnection length of the node 334, that is, it is possible to separate the interconnection 3343 from the integration unit 5341. As a result, a charge loss when reading out the pixel signal is reduced, and thus current-voltage characteristics are improved. As a result, it is possible to substantially enhance light-reception sensitivity with respect to incident light.

Furthermore, in the third layout example, a case where the first layout example illustrated in FIG. 15 is set as a base has been exemplified, but application is also possible to other layout examples such as the second layout example illustrated in FIG. 16 without limitation to the above-described case.

2.12 Operation and Effect

As described above, according to this embodiment, it is possible to reduce the occupation ratio of the pixel signal generation unit 320 and the upper layer detection circuit 410A on the light-receiving surface, and thus the occupation ratio of the photoelectric conversion element 333 increases. As a result, it is possible to improve light-reception efficiency.

In addition, it is possible to use an NMOS transistor as the respective transistors which constitute the pixel signal generation unit 320, and the respective transistors which constitute the upper layer detection circuit 410A. Accordingly, when disposing the transistors in the same light-receiving chip 201, it is possible to simplify a manufacturing process of the light-receiving chip 201.

In addition, a layout of the respective transistors which constitute the pixel signal generation unit 320, and a layout of the respective transistors which constitute the upper layer detection circuit 410A are similar to each other, and thus when the configurations are disposed in the same light-receiving chip 201, it is also possible to make a layout design of the light-receiving chip 201 easy.

In addition, the OFG transistor 332 is disposed in the vicinity of the transmission transistors 331R, 331Gr, 331Gb, and 331B, and thus the charge loss when reading out the pixel signal is reduced, and the current-voltage characteristics are improved. As a result, it is possible to substantially enhance light-reception sensitivity with respect to incident light.

3. SECOND EMBODIMENT

Next, a solid-state imaging device and an imaging device according to a second embodiment will be described in detail with reference to the accompanying drawing. Furthermore, in the following description, with regard to configurations similar to those in the above-described embodiment, the configurations will be cited, and redundant description thereof will be omitted.

For example, as a method of improving sensitivity with respect to a charge that is generated in the photoelectric conversion element 333 in each of monitoring of address event ignition and reading-out of the pixel signal, a reduction in parasitic capacitance of the node 334 (for example, refer to FIG. 9) in the pixel block 310 is considered. Therefore, in this embodiment, for example, in a period of monitoring the address event ignition, the pixel signal generation unit 320 is separated from the node 334. With this arrangement, in a period of monitoring the address event ignition, it is possible to reduce the parasitic capacitance of the node 334. Accordingly, signal selectivity is improved, and it is possible to improve detection sensitivity of address event ignition with respect to the charge generated in the photoelectric conversion element 333.

In addition, in the period of monitoring the address event ignition, the parasitic capacitance of the node 334 is reduced. Accordingly, an effect capable of shortening time necessary for settling of the current-voltage conversion unit 410 in the address event detection unit 400 is also attained.

For example, the imaging device and the solid-state imaging device according to this embodiment may be similar to the imaging device 100 and the solid-state imaging device 200 described in the first embodiment. However, in this embodiment, the pixel block 310 is substituted with a pixel block 610 as described later.

3.1 Configuration Example of Pixel Block

Figure 18:
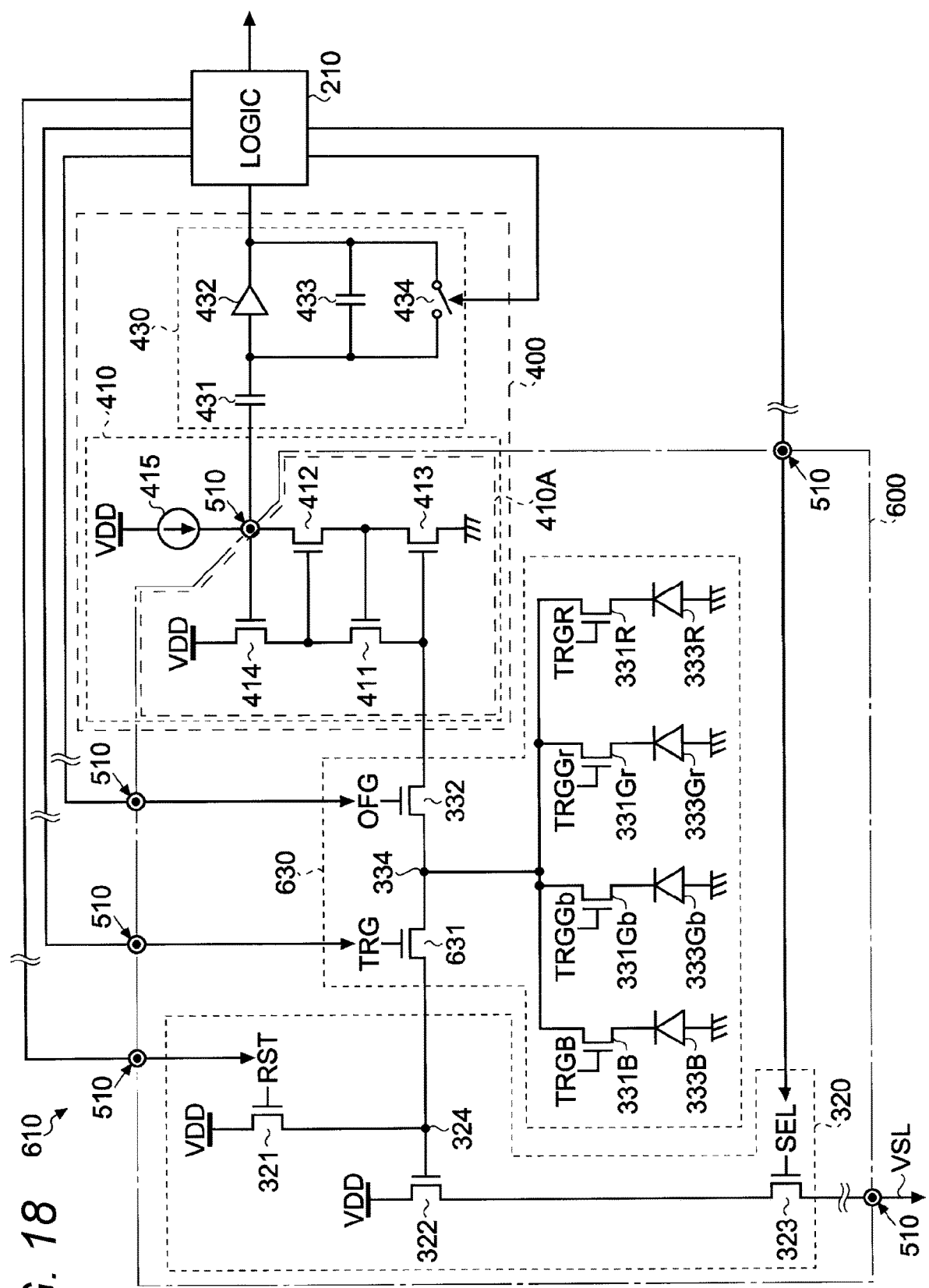
FIG. 18 is a circuit diagram illustrating a schematic configuration example of a pixel block according to a second embodiment.

FIG. 18 is a circuit diagram illustrating a schematic configuration example of the pixel block according to the second embodiment. As illustrated in FIG. 18, for example, the pixel block 610 has a configuration similar to the configuration of the pixel block 310 illustrated in FIG. 9, and the light-receiving unit 330 is substituted with a light-receiving unit 630. Furthermore, in this embodiment, a reference numeral of the upper layer circuit is set to 600 for convenience of explanation.

In the light-receiving unit 630, a transmission transistor 631 is provided between the node 334 and the floating diffusion layer 324. A control signal TRG is supplied to a gate of the transmission transistor 631 from the drive circuit 211. For example, the transmission transistor 631 is constituted by using an NMOS transistor.

In a period of monitoring the address event ignition, a low-level control signal TRG is supplied to the gate of the transmission transistor 631. With this arrangement, in the period of monitoring the address event ignition, an interconnection from the transmission transistor 631 to the drain of the reset transistor 321 and the gate of the amplification transistor 322 is separated from the node 334, and with this arrangement, the parasitic capacitance of the node 334 is reduced. Furthermore, in this period, a high-level control signal OFG is supplied to a gate, and thus the OFG transistor 332 is controlled to an ON-state.

On the other hand, in a period of reading out a pixel signal, a high-level control signal TRG is supplied to the gate of the transmission transistor 631. With this arrangement, charges generated in the photoelectric conversion elements 333R, 333Gr, 333Gb, and 333B are sequentially transmitted to the floating diffusion layer 324.

The other configurations may be similar to the configurations in the pixel block 310 according to the first embodiment.

3.2 Operation Example of Solid-State Imaging Device

Figure 19:
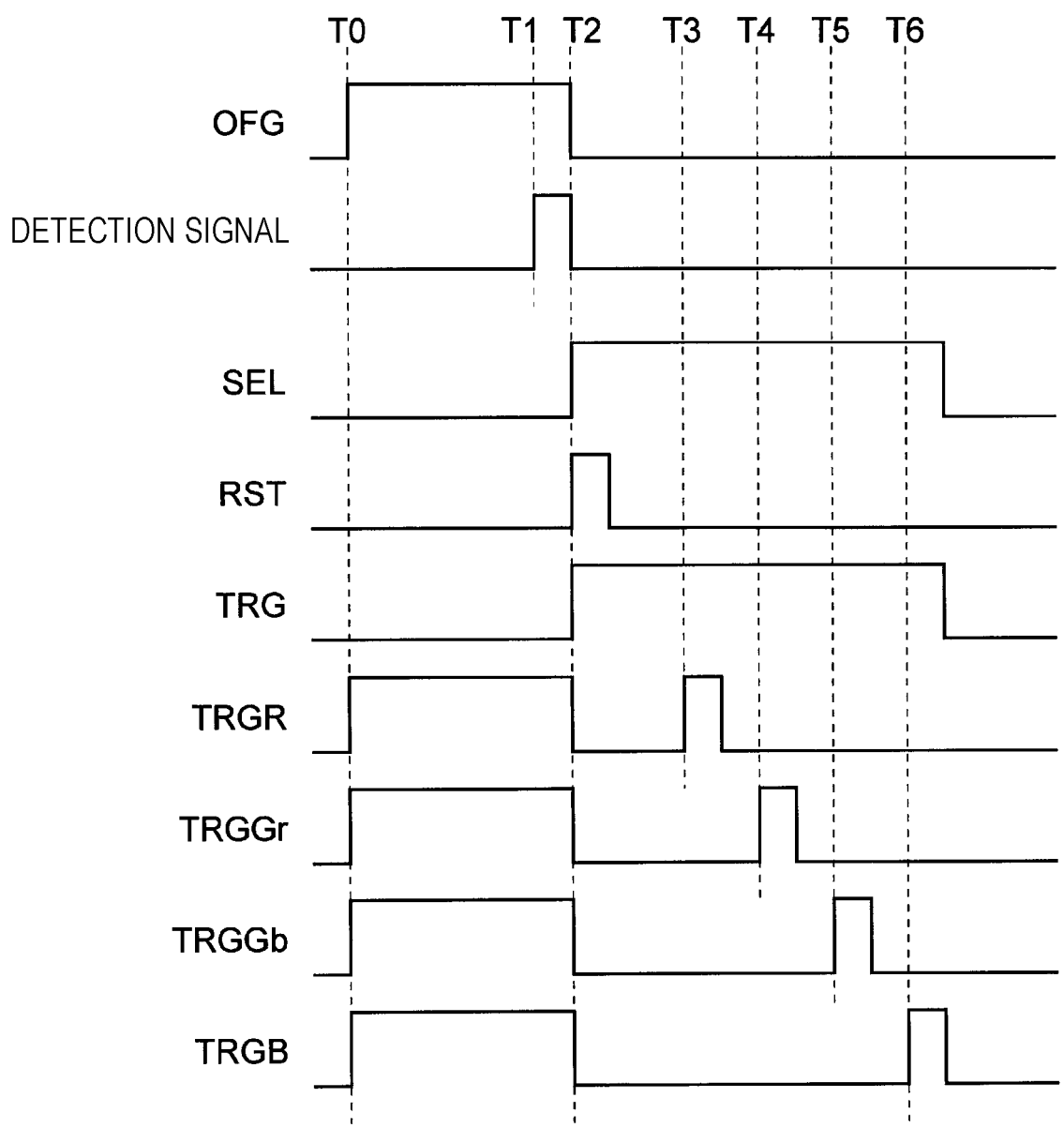
FIG. 19 is a timing chart illustrating an example of an operation of a solid-state imaging device according to the second embodiment.

Next, an operation of the solid-state imaging device 200 according to this embodiment will be described in detail with reference to the accompanying drawings. FIG. 19 is a timing chart illustrating an example of an operation of the solid-state imaging device according to the second embodiment. Furthermore, a flowchart may be similar to the flowchart illustrated in FIG. 14 in the first embodiment, and thus description thereof will be omitted here.

As illustrated in FIG. 19, in this embodiment, in an operation similar to the operation described by using the timing chart illustrated in FIG. 13, for example, in the same period in which the selection signal SEL that is applied to the gate of the selection transistor 323 in the pixel signal generation unit 320 of the reading-out target pixel block 310 is raised to a high level, the control signal TRG applied to the gate of the transmission transistor 631 in the light-receiving unit 330 of the reading-out target pixel block 310 is raised to a high level. With this arrangement, it enters a state in which the floating diffusion layer 324 is connected to the node 334, and thus in a similar manner as in the first embodiment, it is possible to perform CDS processing by sequentially reading out a reset level and a signal level of each wavelength component.

The other operations may be similar to the operations described by using FIG. 13 in the first embodiment.

3.3 Layout Example

Figure 20:
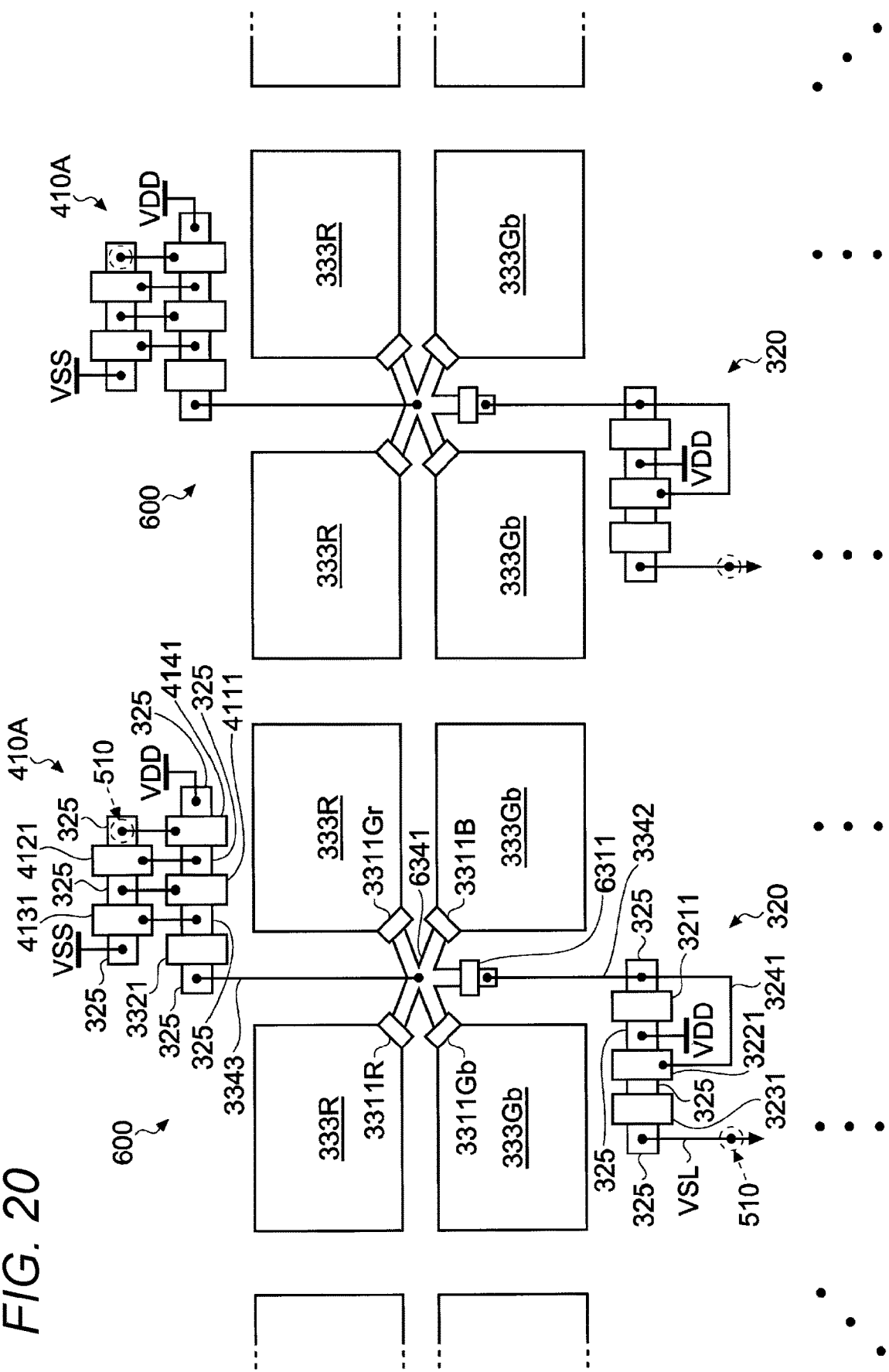
FIG. 20 is a top view illustrating a layout example of an upper layer circuit according to the second embodiment.

FIG. 20 is a top view illustrating a layout example of the upper layout circuit according to the second embodiment. As illustrated in FIG. 20, in the upper layer circuit 600, for example, in a configuration similar to that of the upper layer circuit 500-1 according to the first layout example exemplified by using FIG. 15, the four-leg integration unit 3341 is substituted with a five-leg integration unit 6341, and a transmission gate 6311 of the transmission transistor 631 of the transmission transistor 631 is disposed at one branch of the five-leg integration unit 6341. In addition, the interconnection 3342 is configured to connect a drain of the transmission transistor 631 and a diffusion region 325 that functions as a source of the reset transistor 321 to each other.

Furthermore, in this layout example, a case where the first layout example described by using FIG. 15 in the first embodiment is set as a base has been exemplified, but application is also possible to other layout examples such as the second layout example illustrated in FIG. 16 and the third layout example illustrated in FIG. 17 without limitation to the above-described case.

3.4 Operation and Effect

As described above, according to this embodiment, in a period of monitoring the address event ignition, that is, a period in which the control signal OFG supplied to the OFG gate 3321 is set to a high level, it is possible to shorten an interconnection length of the node 334, that is, it is possible to separate the interconnection 3342 from the interconnection 3343. As a result, it is possible to reduce parasitic capacitance of the node 334, and thus a charge loss when monitoring the address event ignition is reduced and the current-voltage characteristics are improved. With this arrangement, it is possible to detect address event ignition with more accuracy.

Furthermore, the other configurations, operations, and effects may be similar to those in the above-described embodiments, and thus individual detailed description thereof will be omitted.

4. THIRD EMBODIMENT

Next, a solid-state imaging device and an imaging device according to a third embodiment will be described in detail with reference to the accompanying drawings. Furthermore, in the following description, with regard to configurations similar to those in the above-described embodiments, the configurations will be cited, and redundant description thereof will be omitted.

In the above-described embodiments, it is assumed that the number of the photoelectric conversion elements 333 in I rows×J columns which are included in the pixel block 310 or 610 is set to a total of four of 2×2 pixels. In other words, in the above-described embodiments, the pixel signal generation unit 320 and the address event detection unit 400 are shared by four pieces of the photoelectric conversion elements 333. In contrast, in the third embodiment, description will be given of a case where the number of the photoelectric conversion elements 333 which are included in the pixel block 310 or 610 is set to eight as an example.

For example, a configuration and an operation of the imaging device and the solid-state imaging device according to this embodiment may be similar to the configuration and the operation of the imaging device 100 and the solid-state imaging device 200 described in the first or second embodiment. However, in this embodiment, the number of the photoelectric conversion elements 333 which are included in the pixel block 310 or 610 in the first or second embodiment is changed to eight.

4.1 Layout Example of Upper Layer Circuit

Next, with regard to a layout example of the upper layer circuit according to this embodiment, several examples will be described.

4.1.1 First Layout Example

Figure 21:
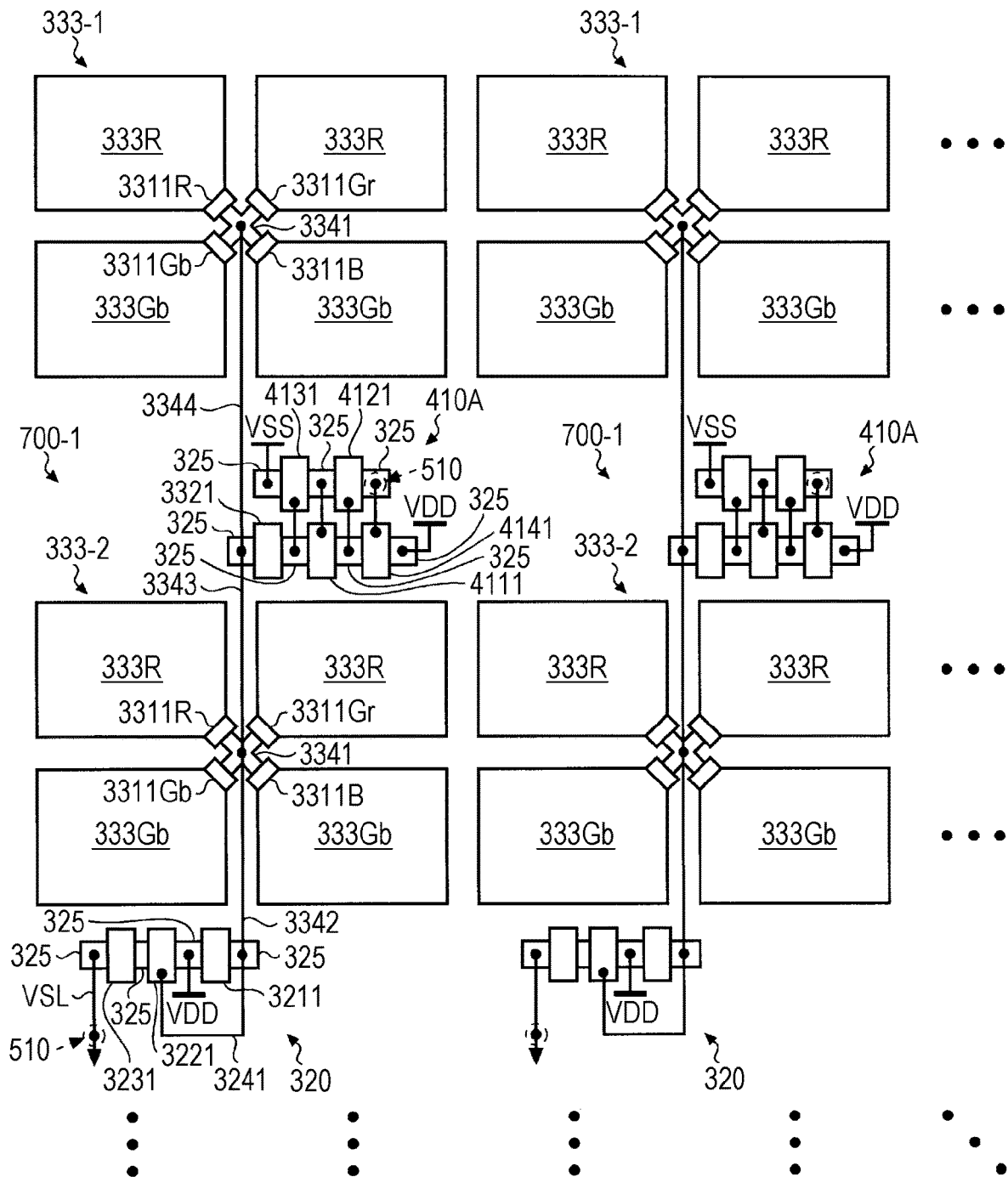
FIG. 21 is a top view illustrating a schematic configuration example of an upper layer circuit according to a first layout example of a third embodiment.

FIG. 21 is a top view illustrating a schematic configuration example of the upper layer circuit according to a first layout example. As illustrated in FIG. 21, in the first layout example, upper layer circuits 700-1 are arranged in a two-dimensional lattice shape in row and column directions. Each of the upper layer circuits 700-1 includes two photoelectric conversion element groups 333-1 and 333-2, each including a total of four photoelectric conversion elements 333R, 333Gr, 333Gb, and 333B of 2×2 pixels which constitute a basic pattern of the Bayer array. For example, the two photoelectric conversion element groups 333-1 and 333-2 are disposed in the column direction. However, there is no limitation thereto, and it is possible to employ a configuration in which the two photoelectric conversion element groups 333-1 and 333-2 are disposed in the row direction.

With respect to the two photoelectric conversion element groups 333-1 and 333-2, for example, the pixel signal generation unit 320 is disposed on an outer side in the column direction (in FIG. 21, a lower side in the column direction). On the other hand, the upper layer detection circuit 410A is disposed between the two photoelectric conversion element groups 333-1 and 333-2.

In other words, the upper layer circuit 700-1 according to the first layout example of this embodiment has a configuration in which the photoelectric conversion element group 333-1 is added with respect to the upper layer circuit 500-1 according to the first layout example described by using FIG. 15 in the first embodiment so that the upper layer detection circuit 410A is interposed between the two photoelectric conversion element groups 333-1 and 333-2.

For example, an integration unit 3341 of the added photoelectric conversion element group 333-1 is connected to the diffusion region 325 that functions as the source of the OFG transistor 332 through an interconnection 3344.

4.1.2 Second Layout Example

Figure 22:
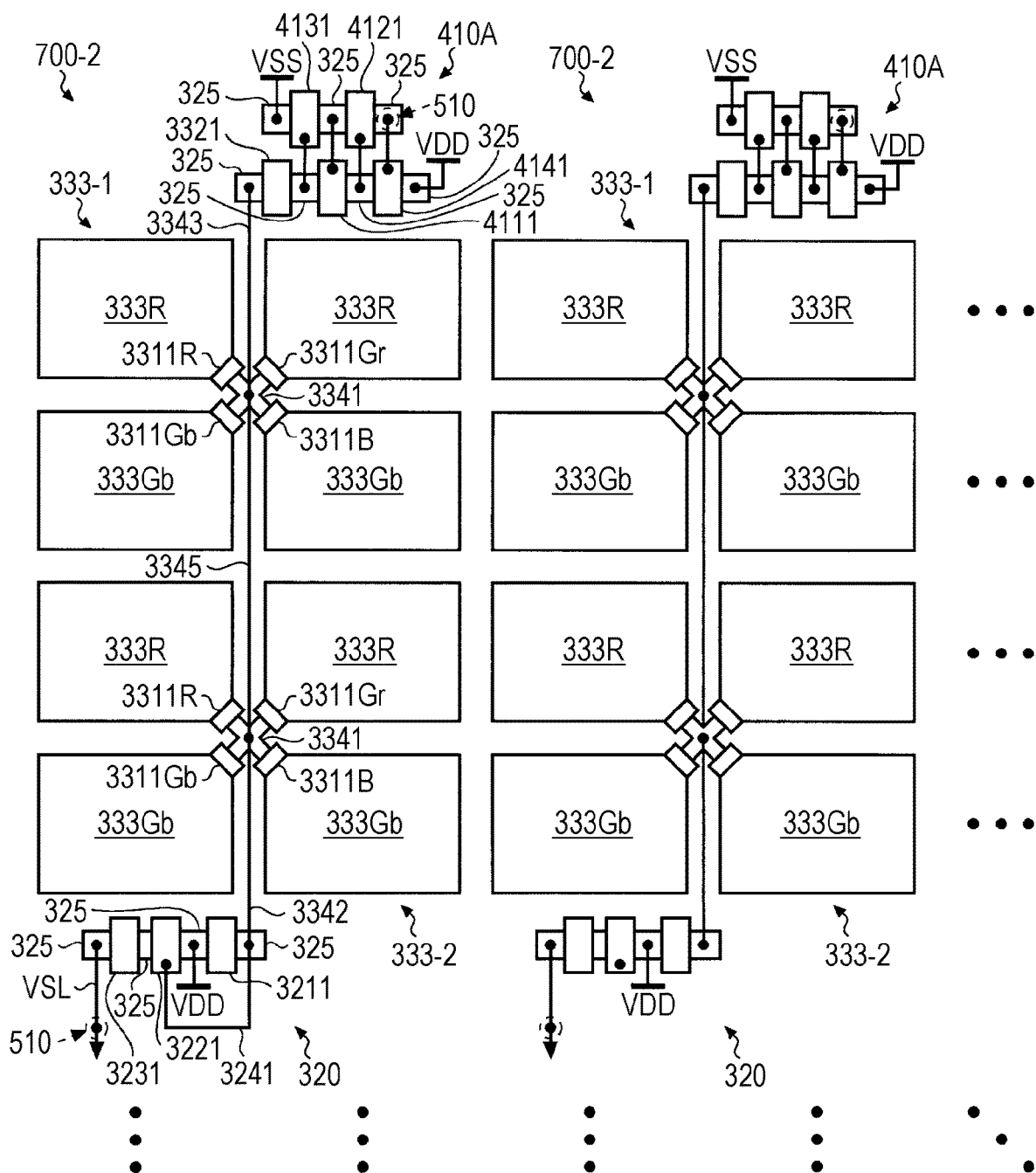
FIG. 22 is a top view illustrating a schematic configuration example of an upper layer circuit according to a second layout example of the third embodiment.

FIG. 22 is a top view illustrating a schematic configuration example of an upper layer circuit according to a second layout example. As illustrated in FIG. 22, in the second layout example, in a similar manner as in the first layout example, upper layer circuits 700-2 are arranged in a two-dimensional lattice shape in row and column directions. In addition, in a similar manner as in the first layout example, each of the upper layer circuits 700-2 includes two photoelectric conversion element groups 333-1 and 333-2.

With respect to the two photoelectric conversion element groups 333-1 and 333-2, for example, the pixel signal generation unit 320 is disposed on an outer side in the column direction (in FIG. 22, a lower side in the column direction). Furthermore, with respect to the two photoelectric conversion elements 333-1 and 333-2, for example, the upper layer detection circuit 410A is disposed on an outer side that is opposite to the pixel signal generation unit 320 in the column direction.

For example, the integration units 3341 of the two photoelectric conversion element groups 333-1 and 333-2 which are in parallel to each other in the column direction are connected to each other through an interconnection 3345.

4.1.3 Third Layout Example

Figure 23:
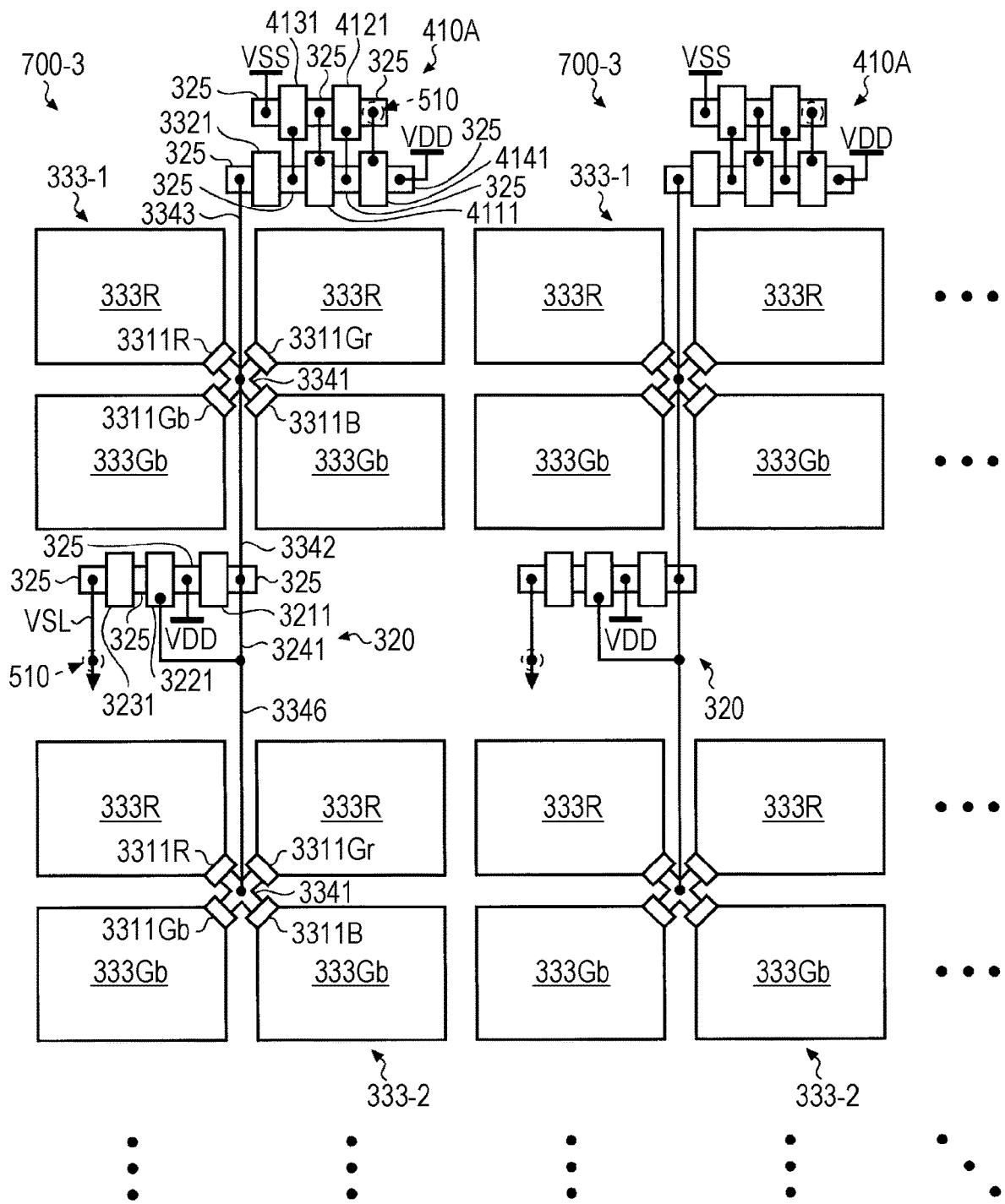
FIG. 23 is a top view illustrating a schematic configuration example of an upper layer circuit according to a third layout example of the third embodiment.

FIG. 23 is a top view illustrating a schematic configuration example of an upper layer circuit according to a third layout example. As illustrated in FIG. 23, in the third layout example, in a similar manner as in the first layout example, upper layer circuits 700-3 are arranged in a two-dimensional lattice shape in row and column directions. In addition, in a similar manner as in the first layout example, each of the upper layer circuits 700-3 includes two photoelectric conversion element groups 333-1 and 333-2.

With respect to the two photoelectric conversion element groups 333-1 and 333-2, for example, the upper layer detection circuit 410A is disposed on an outer side in the column direction (in FIG. 23, an upper side in the column direction). On the other hand, the pixel signal generation unit 320 is disposed between the two photoelectric conversion element groups 333-1 and 333-2.

In other words, the upper layer circuit 700-3 according to the third layout example of this embodiment has a configuration in which the photoelectric conversion element group 333-2 is added with respect to the upper layer circuit 500-1 according to the first layout example described by using FIG. 15 in the first embodiment so that the pixel signal generation unit 320 is interposed between the two photoelectric conversion element groups 333-1 and 333-2.

For example, the integration unit 3341 of the added photoelectric conversion element group 333-2 is connected to the diffusion region 325 that functions as the source of the reset transistor 321 through an interconnection 3346.

4.1.4 Fourth Layout Example

Figure 24:
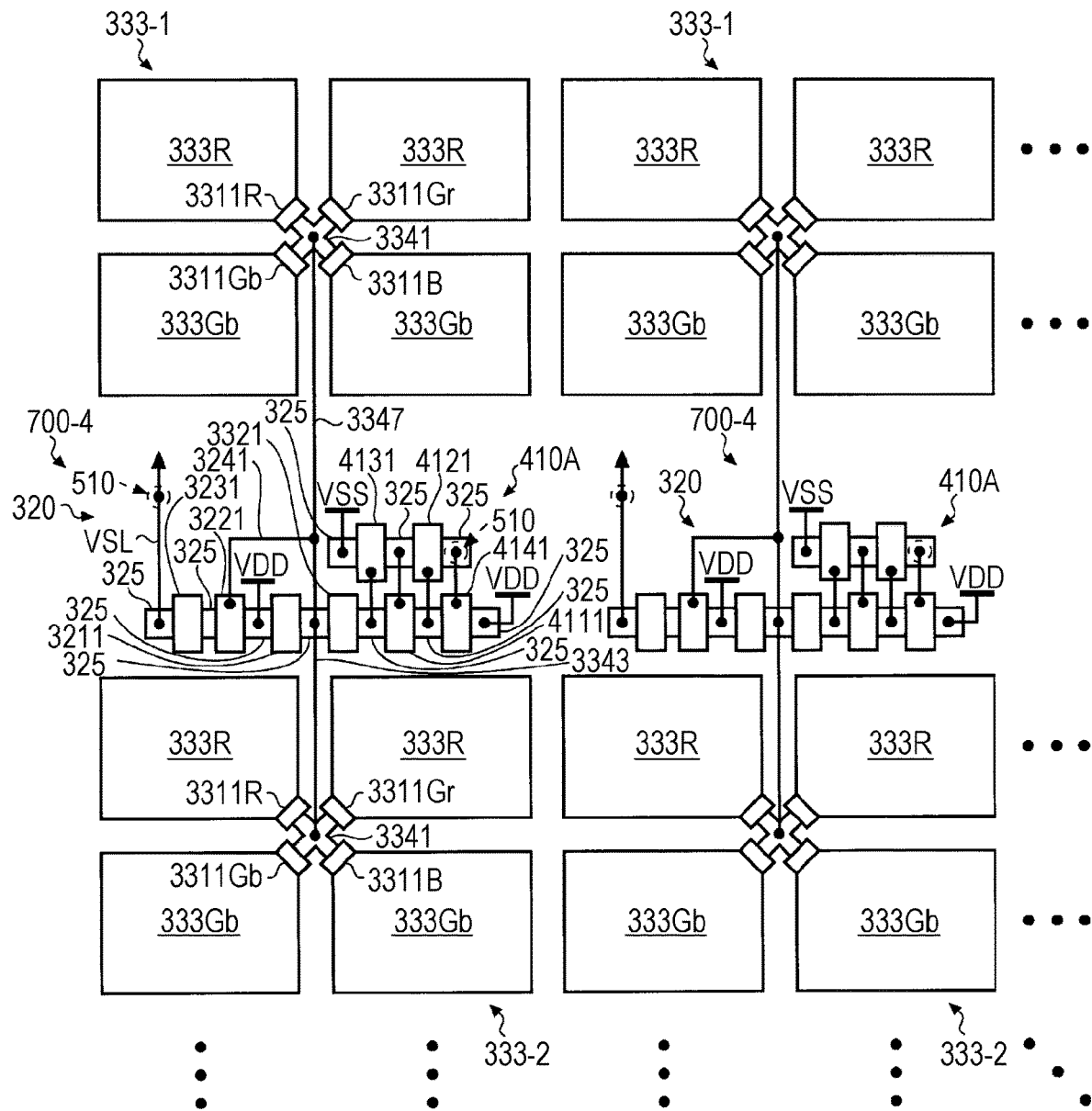
FIG. 24 is a top view illustrating a schematic configuration example of an upper layer circuit according to a fourth layout example of the third embodiment.

FIG. 24 is a top view illustrating a schematic configuration example of an upper layer circuit according to a fourth layout example. As illustrated in FIG. 24, in the fourth layout example, in a similar manner as in the first layout example, upper layer circuits 700-4 are arranged in a two-dimensional lattice shape in row and column directions. However, each of the upper layer circuits 700-4 has a configuration in which the photoelectric conversion element group 333-1 is added with respect to the upper layer circuit 500-2 according to the second layout example described by using FIG. 16 in the first embodiment so that the pixel signal generation unit 320 and the upper layer detection circuit 410A are interposed between the two photoelectric conversion element groups 333-1 and 333-2.

For example, the integration unit 3341 of the added photoelectric conversion element group 333-1 is connected to the diffusion region 325 that is shared by the OFG transistor 332 and the reset transistor 321 through an interconnection 3347.

4.2 Operation and Effect

As described above, the number of the photoelectric conversion elements 333 which are included in the pixel block 310 or 610 according to the present disclosure is not limited to four.

Furthermore, in the fourth layout example illustrated in FIG. 24, it is possible to make an interconnection distance between each of the plurality of photoelectric conversion elements 333, and the pixel signal generation unit 320 and the upper layer detection circuit 410A be approximately uniform, and thus it is possible to make current-voltage characteristics in monitoring of address event ignition based on each of the plurality of photoelectric conversion elements 333 and reading-out of the pixel signal be uniform.

Furthermore, the other configurations, operations, and effects may be similar to those in the above-described embodiments, and thus individual detailed description thereof will be omitted.

5. FOURTH EMBODIMENT

Next, a solid-state imaging device and an imaging device according to a fourth embodiment will be described in detail with reference to the accompanying drawings. Furthermore, in the following description, with regard to configurations similar to those in the above-described embodiment, the configurations will be cited, and redundant description thereof will be omitted.

In the above-described embodiment, a case where a photoelectric conversion element group in which the address event detection unit 400 monitors address event ignition, and a photoelectric conversion element group in which the pixel signal generation unit 320 reads out a pixel signal are the same as each other has been exemplified. However, it is not necessary for the groups to be the same as each other.

Figure 25:
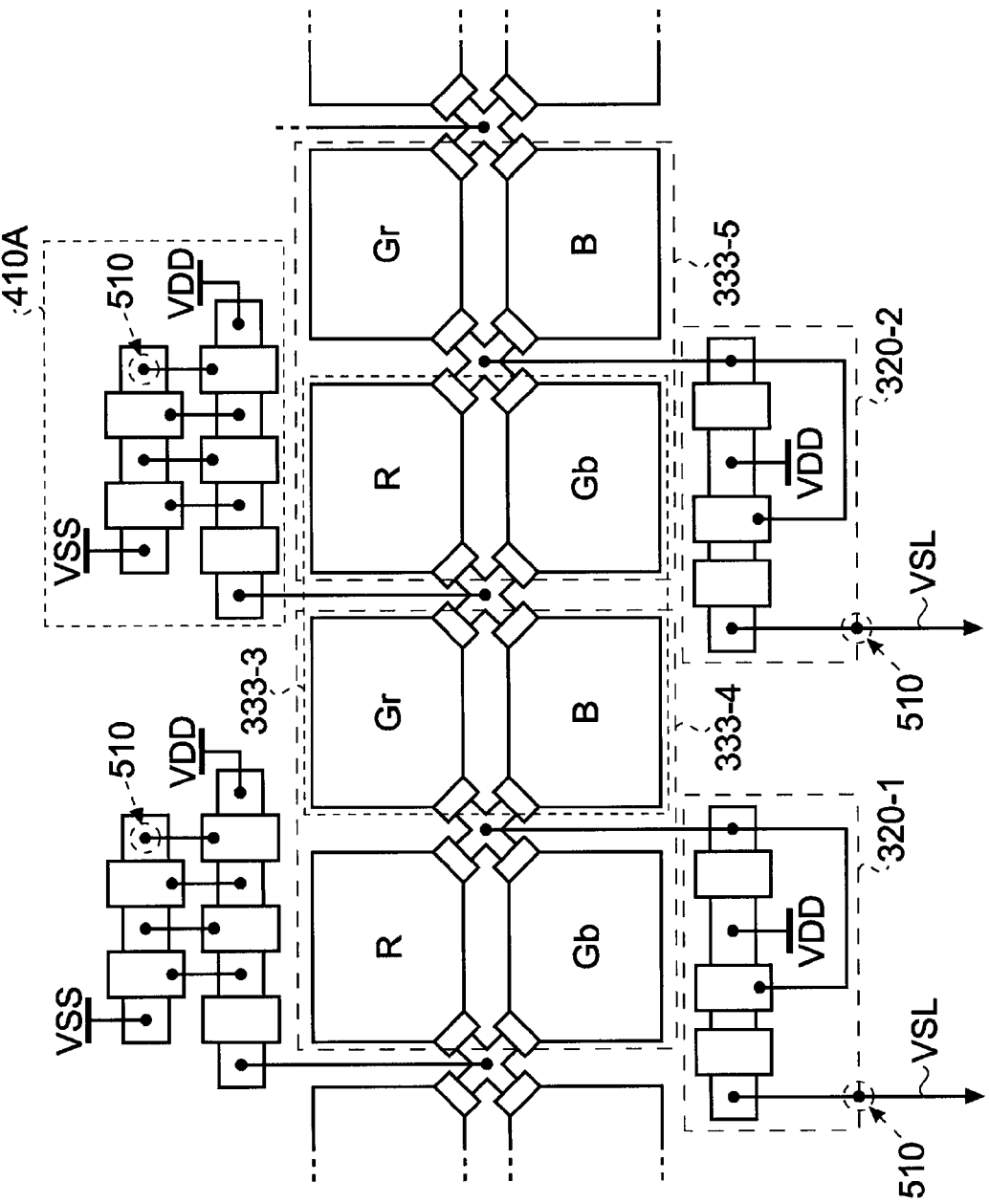
FIG. 25 is a top view illustrating a layout example of an upper layer circuit according to a fourth embodiment.

For example, as illustrated in FIG. 25, as in the first or second embodiment, in a case where one piece of the address event detection unit 400 monitors existence and nonexistence of address event ignition in a photoelectric conversion element group 333-3 including four photoelectric conversion elements 333R, 333Gr, 333Gb, and 333B, one pixel signal generation unit 320-1 may be in charge of reading-out of a pixel signal with respect to four photoelectric conversion elements 333R, 333Gr, 333Gb, and 333B which belong to a photoelectric conversion element group 333-4 including two photoelectric conversion elements (for example, the photoelectric conversion elements 333Gr and 333B) of the photoelectric conversion element group 333-3, and the other pixel signal generation unit 320-2 may be in charge of reading-out of a pixel signal with respect to four photoelectric conversion elements 333R, 333Gr, 333Gb, and 333B which belong to a photoelectric conversion element group 333-5 including the remaining two photoelectric conversion elements (for example, photoelectric conversion elements 333R and 333Gb) of the photoelectric conversion element group 333-3.

Figure 26:
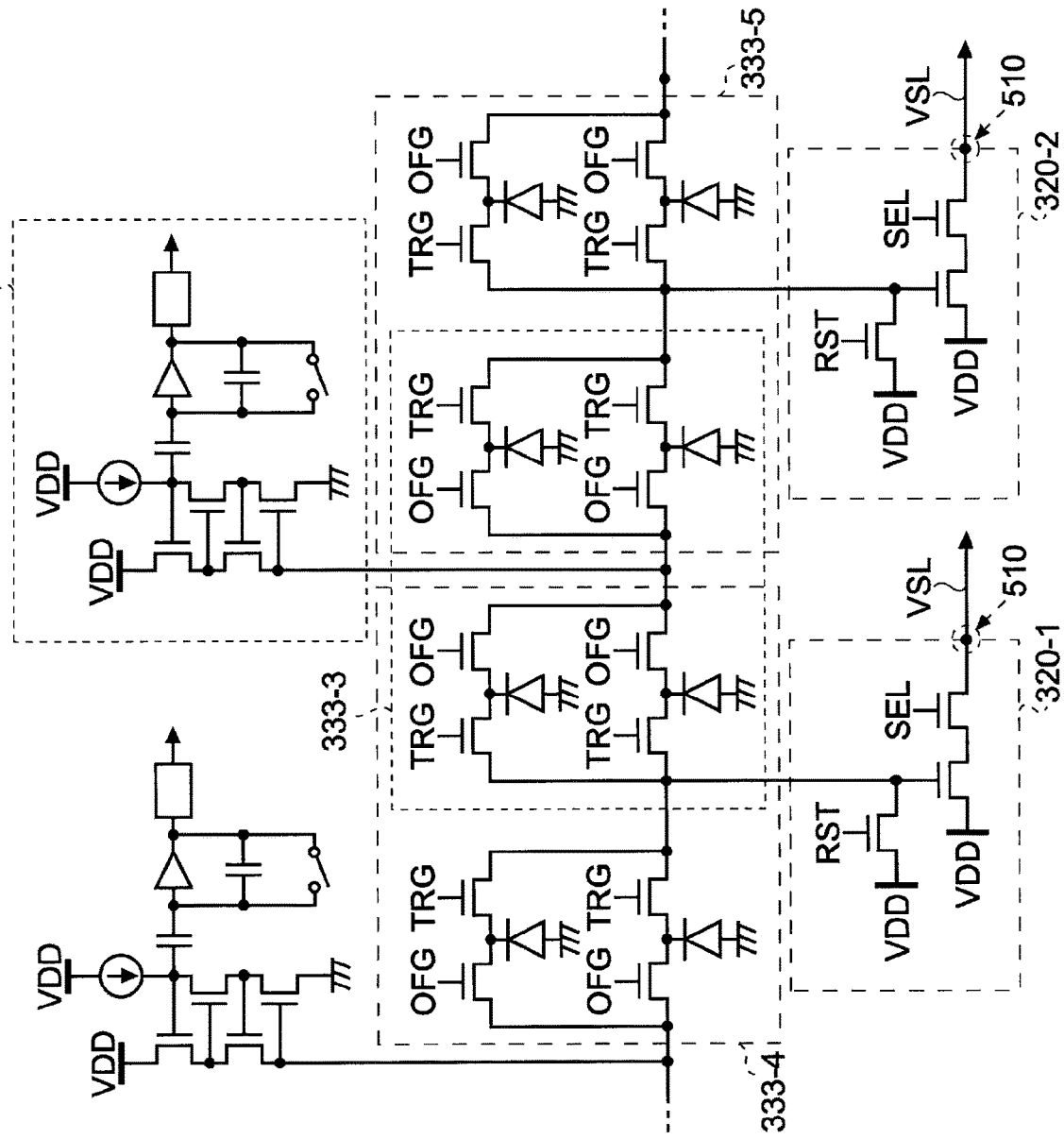
FIG. 26 is a circuit diagram illustrating a circuit configuration of pixel blocks according to a layout of the upper layer circuit illustrated in FIG. 25.

In addition, FIG. 26 is a circuit diagram illustrating a circuit configuration of pixel blocks according to the layout of the upper layer circuit illustrated in FIG. 25. As illustrated in FIG. 26, in a case where the upper layer circuit is set to the layout illustrated in FIG. 25, in the photoelectric conversion element group 333-3 that is connected to the address event detection unit 400, outputs of the OFG transistors 332 are commonized and are connected to the address event detection unit 400. On the other hand, in the photoelectric conversion element group 333-4 or 333-5 which is connected to the pixel signal generation unit 320-1 or 320-2, outputs of the transmission transistors 331 are commonized and are connected to the pixel signal generation unit 320-1 or 320-2.

Figure 27:
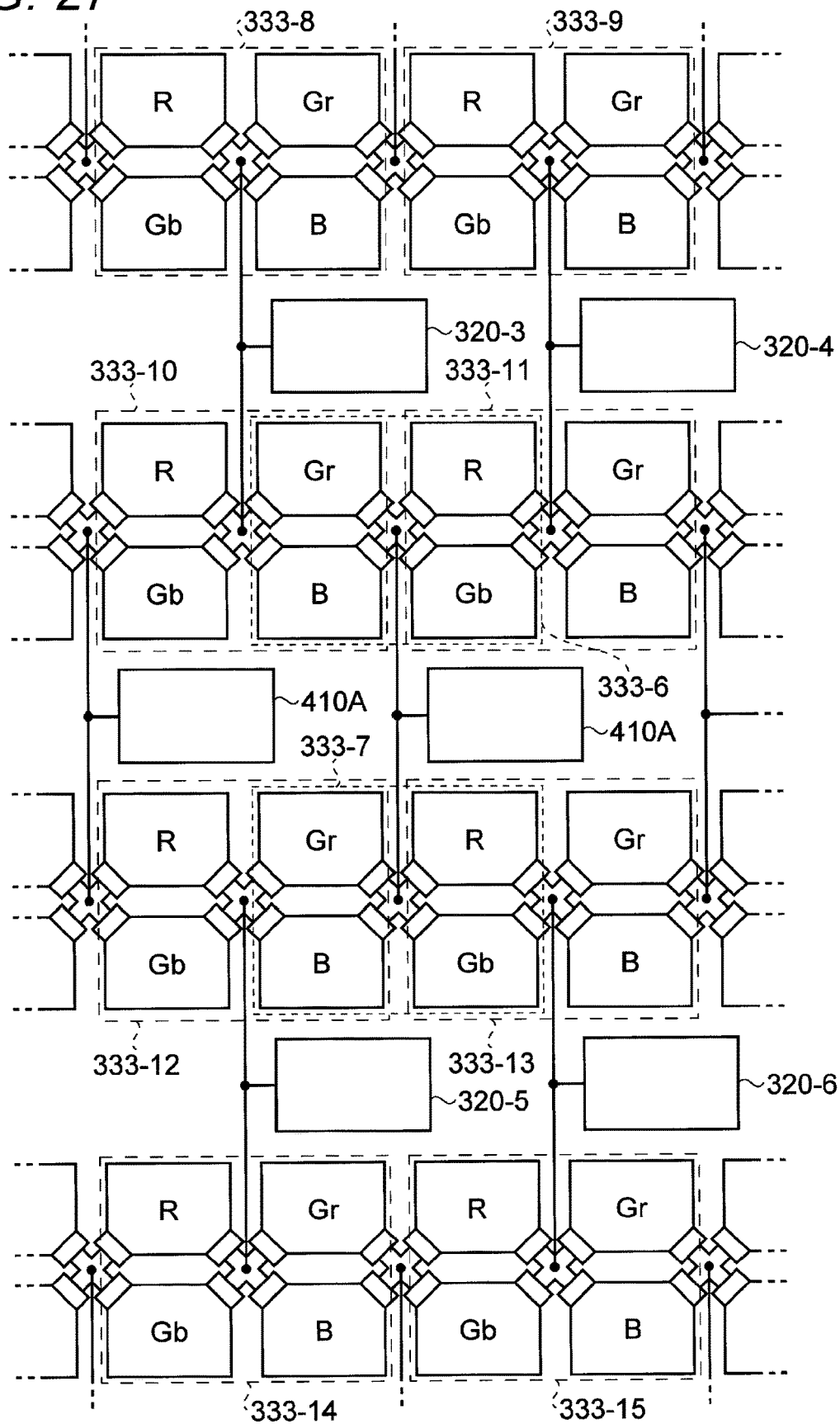
FIG. 27 is a top view illustrating another layout example of the upper layer circuit according to the fourth embodiment.

This configuration is also applicable to the third embodiment similarly. That is, as illustrated in FIG. 27, in a case where one address event detection unit 400 monitors existence and nonexistence of address event ignition in photoelectric conversion element groups 333-6 and 333-7 which are constituted by a total of eight photoelectric conversion elements 333 including two photoelectric conversion elements 333R, two photoelectric conversion elements 333Gr, two photoelectric conversion elements 333Gb, and two photoelectric conversion elements 333B, the following configuration may be employed. That is, the pixel signal generation unit 320-3 is in charge of reading-out of a pixel signal with respect to eight photoelectric conversion elements 333R, 333Gr, 333Gb, and 333B which belong to a photoelectric conversion element group 333-10 including two photoelectric conversion elements (for example, photoelectric conversion elements 333Gr and 333B) in the photoelectric conversion element group 333-6, and another photoelectric conversion element group 333-8. A pixel signal generation unit 320-4 is in charge of reading-out of a pixel signal with respect to eight photoelectric conversion elements 333R, 333Gr, 333Gb, and 333B in a photoelectric conversion element group 333-11 including the remaining two photoelectric conversion elements (for example, photoelectric conversion elements 333R and 333Gb) of the photoelectric conversion element group 333-6, and another photoelectric conversion element group 333-9. A pixel signal generation unit 320-5 is in charge of reading-out of a pixel signal with respect to eight photoelectric conversion elements 333R, 333Gr, 333Gb, and 333B which belong to a photoelectric conversion element group 333-12 including two photoelectric conversion elements (for example, photoelectric conversion element 333Gr and 333B) of a photoelectric conversion element group 333-7, and another photoelectric conversion element group 333-14. A pixel signal generation unit 320-6 is in charge of reading-out of a pixel signal with respect to eight photoelectric conversion elements 333R, 333Gr, 333Gb, and 333B which belong to a photoelectric conversion element group 333-13 including the remaining two photoelectric conversion elements (for example, photoelectric conversion elements 333R and 333Gb) of the photoelectric conversion element group 333-7, and another photoelectric conversion element group 333-15.

Figure 28:
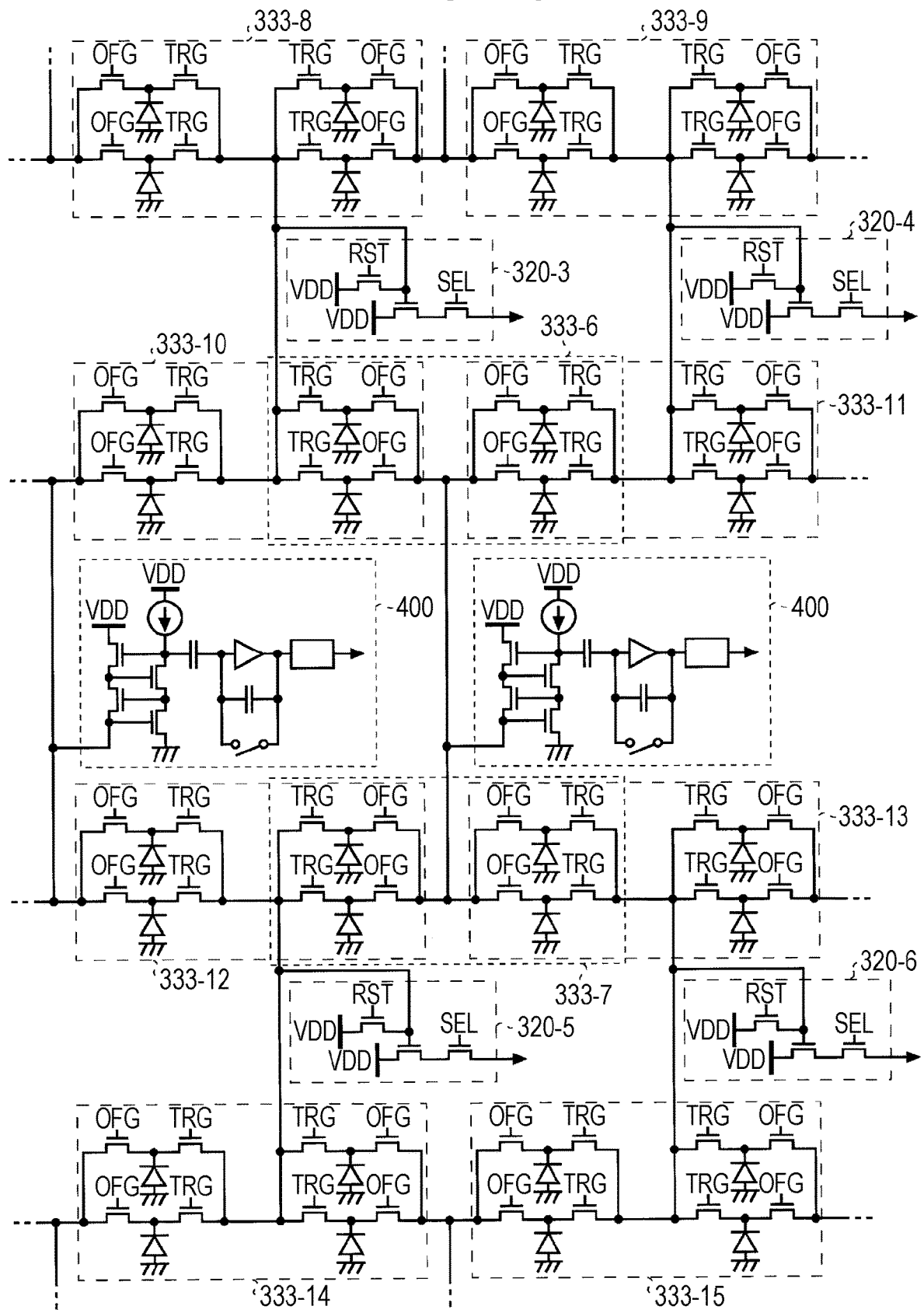
FIG. 28 is a circuit diagram illustrating a circuit configuration of pixel blocks according to a layout of the upper layer circuit illustrated in FIG. 27.

In addition, FIG. 28 is a circuit diagram illustrating a circuit configuration of the pixel blocks according to the layout of the upper layer circuit illustrated in FIG. 27. As illustrated in FIG. 28, in a case where the upper layer circuit is set to the layout illustrated in FIG. 27, in each of the photoelectric conversion element groups 333-6 and 333-7 which are connected to the address event detection unit 400, outputs of the OFG transistors 332 are commonized and are connected to the address event detection unit 400. On the other hand, in each of the photoelectric conversion element groups 333-8 to 333-15 which are respectively connected to the pixel signal generation units 320-3 to 320-6, outputs of the transmission transistors 331 are commonized and are connected to the pixel signal generation unit 320-1 or 320-2.

5.1 Operation and Effect

As described above, a case where a photoelectric conversion element group in which the address event detection unit 400 monitors address event ignition, and a photoelectric conversion element group in which the pixel signal generation unit 320 reads out a pixel signal are the same as each other has been exemplified. However, it is not necessary for the groups to be the same as each other, and various modifications can be made.

Furthermore, the other configurations, operations, and effects may be similar to those in the above-described embodiments, and thus individual detailed description thereof will be omitted.

6. FIFTH EMBODIMENT

Next, a solid-state imaging device and an imaging device according to a fifth embodiment will be described in detail with reference to the accompanying drawings. Furthermore, in the following description, with regard to configurations similar to those in the above-described embodiment, the configurations will be cited, and redundant description thereof will be omitted.

In the above-described embodiments, for example, as described by using FIG. 2, description has been given of a case where the upper layer circuit including the light-receiving unit 330, the pixel signal generation unit 320, and a part of the address event detection unit 400 (upper layer detection circuit 410A) is disposed in the light receiving chip 201, and the other configurations are disposed in the logic chip 202. However, among the configurations which are disposed in the light-receiving chip 201, the pixel signal generation unit 320, and a part of the address event detection unit 400 (the upper layer detection circuit 410A) may be disposed in a chip on a lower side of the light-receiving chip 201.

Figure 29:
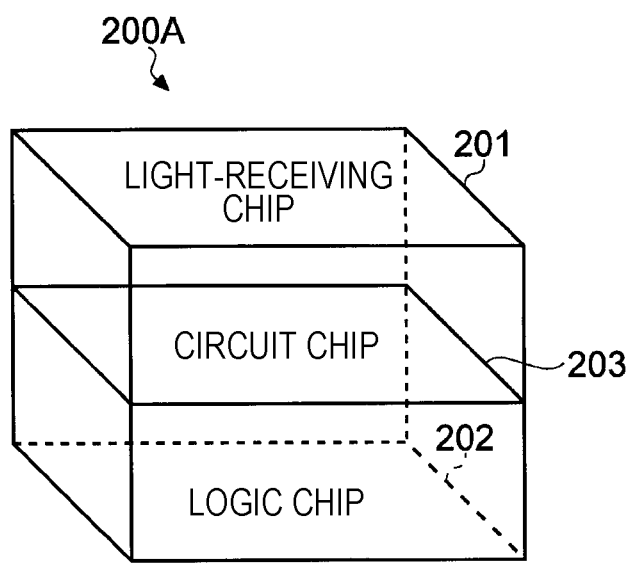
FIG. 29 is a view illustrating a lamination structure example of a solid-state imaging device according to a fifth embodiment.

Specifically, for example, the pixel signal generation unit 320 and a part of the address event detection unit 400 (the upper layer detection circuit 410A) may be disposed in the logic chip 202, or may be disposed in a circuit chip 203 that is added between the light-receiving chip 201 and the logic chip 202 as in a solid-state imaging device 200A illustrated in FIG. 29.

Furthermore, as illustrated in FIG. 29, in the case of adding the circuit chip 203 between the light-receiving chip 201 and the logic chip 202, at least one of joining between the light-receiving chip 201 and the circuit chip 203, or joining between the circuit chip 203 and the logic chip 202 may be mechanically realized by Cu—Cu joining using the Cu—Cu joint 510A, and electrical connection may be established.

Figure 30:
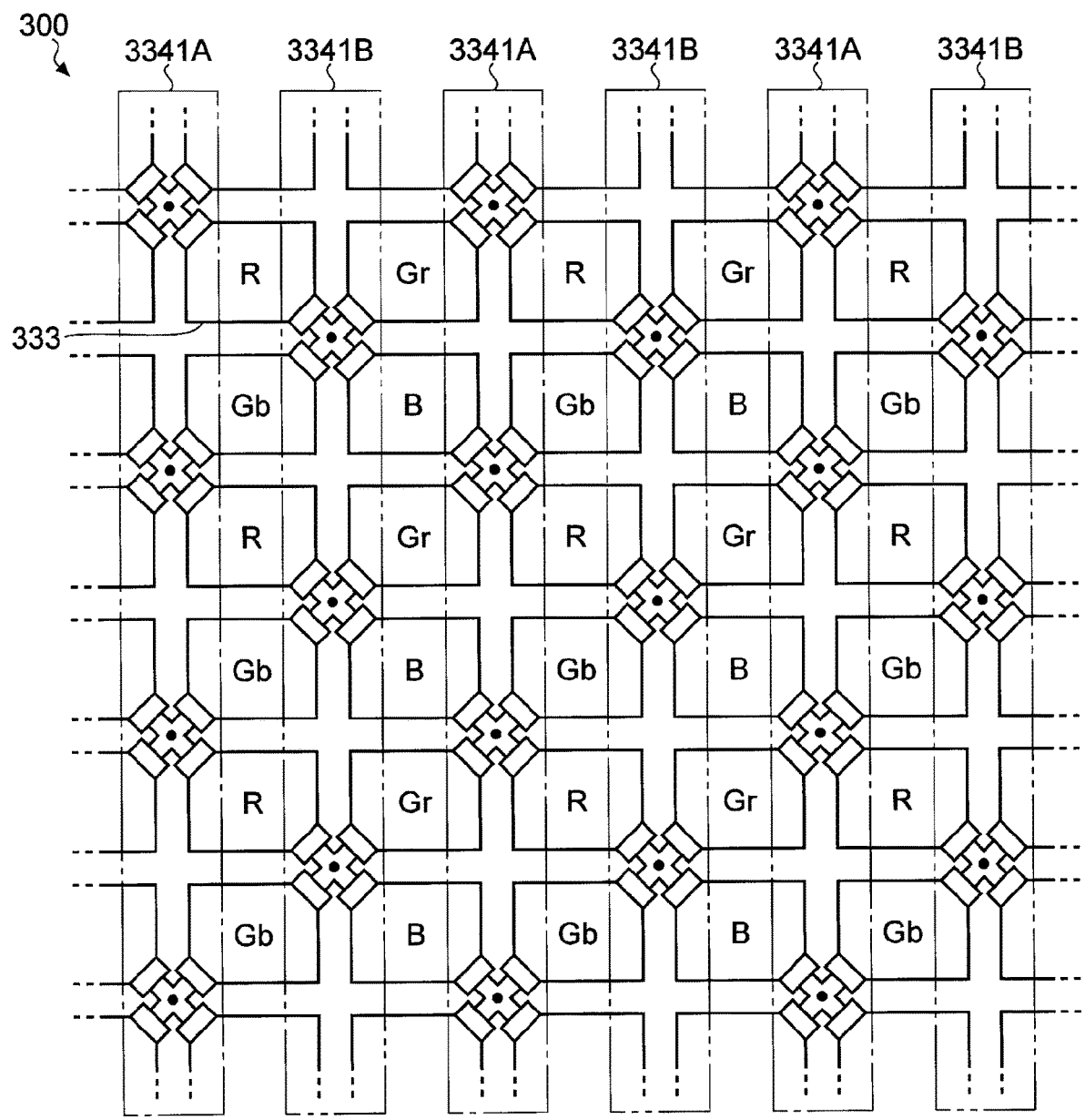
FIG. 30 is a top view illustrating a layout example of a pixel array unit according to the second embodiment.

In addition, in the configuration in which the pixel signal generation unit 320 and a part of the address event detection unit 400 (the upper layer detection circuit 410A) are disposed in a lower-layer chip in comparison to the light-receiving chip 201, as illustrated in FIG. 30, the photoelectric conversion elements 333 may be arranged with the same interval in the pixel array unit 300. In this case, it is possible to employ the following layout. For example, an integration unit group 3341A in which integration units 3341 connected to the address event detection unit 400 are linearly arranged in parallel may be disposed between an odd column and an even column and between an odd row and an even row of the photoelectric conversion elements 333, and an integration unit group 3341B in which integration units 3341 connected to the pixel signal generation unit 320 are linearly arranged in parallel may be disposed between an even column and an odd column and between an even row and an odd row.

However, in the layout illustrated in FIG. 30, it is not necessary for the pixel signal generation unit 320 and a part of the address event detection unit 400 (upper layer detection circuit 410A) to be disposed in the lower-layer chip, and the pixel signal generation unit 320 and a part of the address event detection unit 400 (upper layer detection circuit 410A) may be disposed between the photoelectric conversion elements 333.

6.1 Operation and Effect

As described above, the pixel signal generation unit 320 and a part of the address event detection unit 400 (upper layer detection circuit 410A) may be disposed in a lower-layer chip in comparison to the light-receiving chip 201. With this arrangement, it is possible to increase an occupation ratio of the photoelectric conversion element 333 in the light-receiving chip 201, and thus it is possible to improve light-reception efficiency.

Furthermore, the other configurations, operations, and effects may be similar to those in the above-described embodiments, and individual detailed description thereof will be omitted.

7. APPLICATION EXAMPLE TO MOVING BODY

The technology (the present technology) according to the present disclosure is applicable to various products. For example, the technology according to the present disclosure can be realized as a device that is mounted on a moving body of any one kind among an automobile, an electric vehicle, a hybrid electric vehicle, a motorcycle, a bicycle, a personal mobility, an airplane, a drone, a ship, a robot, and the like.

Figure 31:
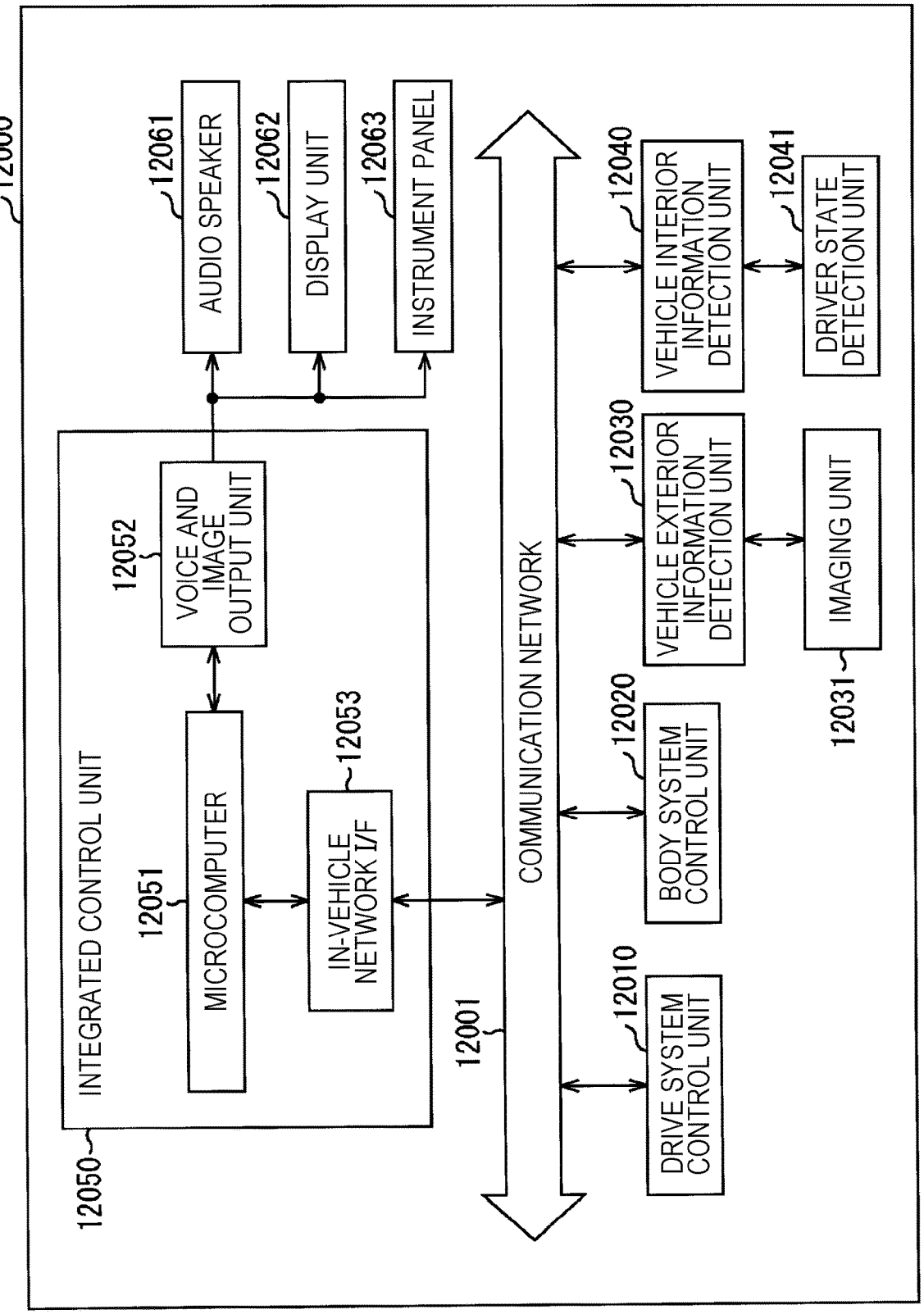
FIG. 31 is a block diagram illustrating an example of a schematic configuration of a vehicle control system.

FIG. 31 is a block diagram illustrating a schematic configuration example of a vehicle control system that is an example of a moving body control system to which the technology according to the present disclosure is applicable.

A vehicle control system 12000 includes a plurality of electronic control units which are connected to each other through a communication network 12001. In the example illustrated in FIG. 31, the vehicle control system 12000 includes a drive system control unit 12010, a body system control unit 12020, a vehicle exterior information detection unit 12030, a vehicle interior information detection unit 12040, and an integrated control unit 12050. In addition, as a functional configuration of the integrated control unit 12050, a microcomputer 12051, a voice and image output unit 12052, and an in-vehicle network I/F (interface) 12053 are illustrated in the drawing.

The drive system control unit 12010 controls an operation of a device relating to the drive system of the vehicle in accordance with various programs. For example, the drive system control unit 12010 functions as a control device of a drive force generation device such as an internal combustion engine and a drive motor which generate a drive force of the vehicle, a drive force transmission mechanism that transmits the drive force to wheels, a steering mechanism that adjusts the steering angle of the vehicle, and a braking device that generates a braking force of the vehicle, and the like.

The body system control unit 12020 controls an operation of various devices which are mounted to a vehicle body in accordance with various programs. For example, the body system control unit 12020 functions as a control device of a keyless entry system, a smart key system, a power window device, and various lamps such as a head lamp, a back lamp, a brake lamp, a blinker, and a fog lamp. In this case, an electric wave that is transmitted from a portable device that substitutes for a key, or signals of various switches can be input to the body system control unit 12020. The body system control unit 12020 receives input of the electric wave or the signals, and controls a door lock device, a power window device, a lamp, and the like of the vehicle.

The vehicle exterior information detection unit 12030 detects information regarding an outer side of the vehicle on which the vehicle control system 12000 is mounted. For example, an imaging unit 12031 is connected to the vehicle exterior information detection unit 12030. The vehicle exterior information detection unit 12030 allows the imaging unit 12031 to capture a vehicle exterior image and receives the captured image. The vehicle exterior information detection unit 12030 may perform object detection processing of a person, a vehicle, an obstacle, a sign, a character on a load, or the like or distance detection processing on the basis of the image that is received.

The imaging unit 12031 is an optical sensor that receives light and outputs an electric signal corresponding to a light-reception amount. The imaging unit 12031 may output the electric signal as an image or as distance measurement information. In addition, light received by the imaging unit 12031 may be visible light, or invisible light such as infrared rays.

The vehicle interior information detection unit 12040 detects vehicle interior information. For example, a driver state detection unit 12041 that detects a driver state is connected to the vehicle interior information detection unit 12040. For example, the driver state detection unit 12041 includes a camera that images a driver, and the vehicle interior information detection unit 12040 may calculate the degree of fatigue or the degree of concentration of a driver on the basis of detection information that is input from the driver state detection unit 12041, or may determine whether or not the driver drowses.

The microcomputer 12051 calculates a control target value of the drive force generation device, the steering mechanism, or the braking device on the basis of vehicle interior or exterior information that is acquired by the vehicle exterior information detection unit 12030 or the vehicle interior information detection unit 12040, and can output a control command to the drive system control unit 12010. For example, the microcomputer 12051 can perform a cooperative control to realize a function of an advanced driver assistance system (ADAS) which includes collision avoidance or impact mitigation of the vehicle, following travel based on an inter-vehicle distance, vehicle speed maintenance travel, vehicle collision alarm, vehicle lane deviation alarm, and the like.

In addition, the microcomputer 12051 can perform a cooperative control for automatic driving and the like in which the vehicle autonomously travels without depending on an operation of a driver by controlling the drive force generation device, the steering mechanism, the braking device, and the like on the basis of information in the vicinity of the vehicle which is acquired by the vehicle exterior information detection unit 12030 or the vehicle interior information detection unit 12040.

In addition, the microcomputer 12051 can output a control command to the body system control unit 12020 on the basis of the vehicle exterior information acquired by the vehicle exterior information detection unit 12030. For example, the microcomputer 12051 can perform a cooperative control to realize glare protection such as switching of a high beam into a low beam by controlling the head lamp in correspondence with a position of a preceding vehicle or an oncoming vehicle which is detected by the vehicle exterior information detection unit 12030.

The voice and image output unit 12052 transmits at least one output signal between a voice and an image to an output device capable of visually or aurally notifying a passenger in a vehicle or an outer side of the vehicle of information. In the example in FIG. 31, as the output device, an audio speaker 12061, a display unit 12062, and an instrument panel 12063 are exemplified. For example, the display unit 12062 may include at least one of an on-board display or a head-up display.

Figure 32:
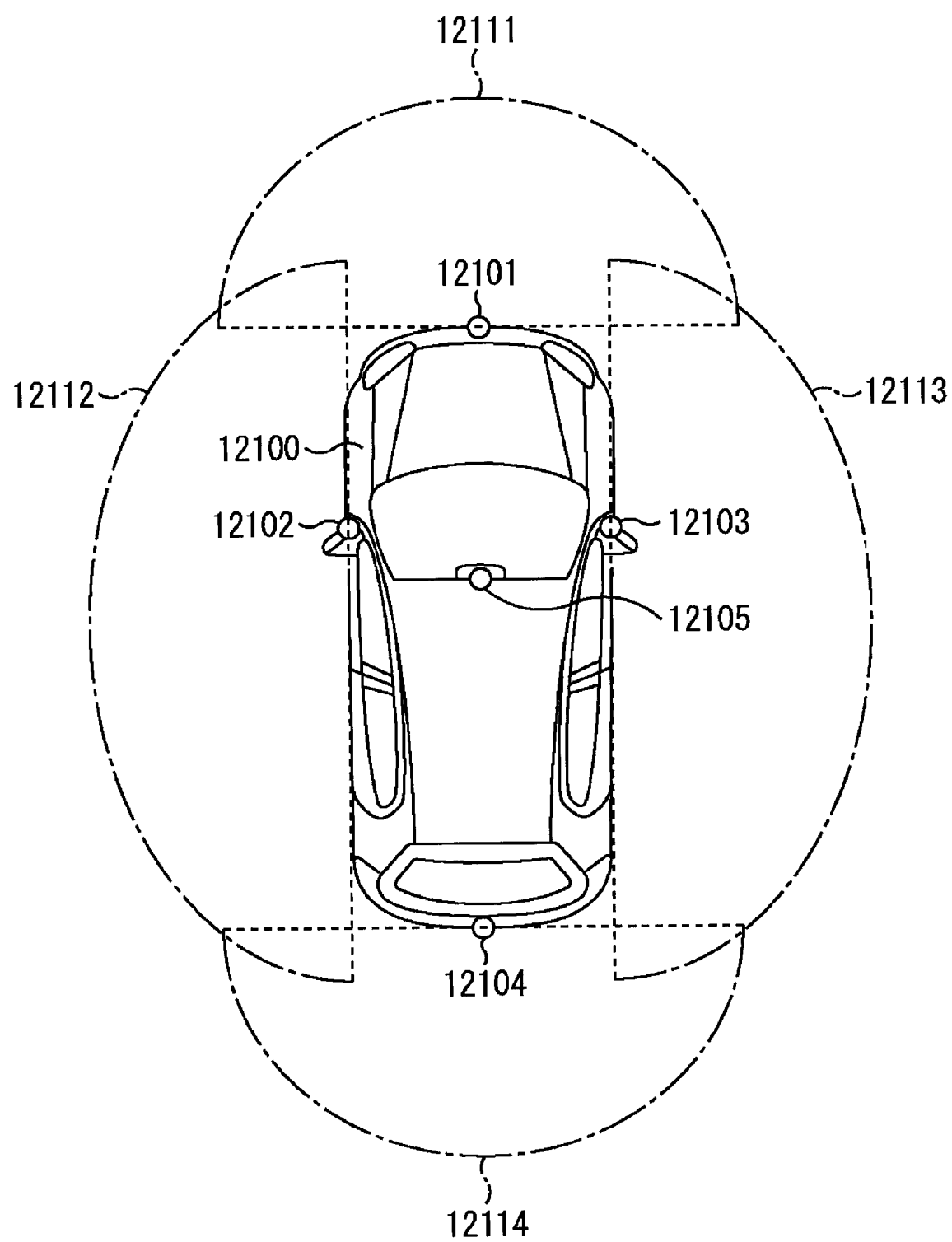
FIG. 32 is a view illustrating an example of an installation position of an out-of-vehicle information detection unit and an imaging unit.

FIG. 32 is a view illustrating an example of an installation position of the imaging unit 12031.

In FIG. 32, as the imaging unit 12031, imaging units 12101, 12102, 12103, 12104, and 12105 are provided.

For example, the imaging units 12101, 12102, 12103, 12104, and 12105 are installed at positions such as a front nose, a side-view mirror, a rear bumper, a back door, an upper side of a windshield in a vehicle room, and the like of the vehicle 12100. The imaging unit 12101 provided at the front nose, and the imaging unit 12105 that is provided on an upper side of the windshield in a vehicle room mainly acquire images on a forward side of the vehicle 12100. The imaging units 12102 and 12103 which are provided in the side-view minor mainly acquire images on a lateral side of the vehicle 12100. The imaging unit 12104 that is provided in the rear bumper or the back door mainly acquires images on a backward side of the vehicle 12100. The imaging unit 12105 that is provided on an upper side of the windshield in the vehicle room can be mainly used to detect a preceding vehicle, a pedestrian, an obstacle, a traffic signal, a traffic sign, a vehicle lane, and the like.

Furthermore, FIG. 32 illustrates an example of a photographing range of the imaging units 12101 to 12104. An image capturing range 12111 represents an image capturing range of the imaging unit 12101 that is provided in the front nose, image capturing ranges 12112 and 12113 respectively represent image capturing ranges of the imaging units 12102 and 12103 which are provided in the side-view mirrors, an image capturing range 12114 represents an image capturing range of the imaging unit 12104 that is provided in the rear bumper or the back door. For example, when a plurality of pieces of image data captured by the imaging units 12101 to 12104 are superimposed on each other, it is possible to obtain an overlooking image when the vehicle 12100 is viewed from an upper side.

At least one of the imaging units 12101 to 12104 may have a function of acquiring distance information. For example, at least one of the imaging units 12101 to 12104 may be a stereo camera including a plurality of imaging elements, or may be an imaging element that includes pixels for phase difference detection.

For example, the microcomputer 12051 can extract a three-dimensional object, which is a closest three-dimensional object, particularly, on a proceeding path of the vehicle 12100 and travels in approximately the same direction as that of the vehicle 12100 that travels at a predetermined velocity (for example, 0 km/h or greater), as a preceding vehicle by obtaining distances to respective three-dimensional objects in the image capturing ranges 12111 to 12114 and a variation of the distances with the passage of time (relative velocity to the vehicle 12100) on the basis of the distance information obtained from the imaging units 12101 to 12104. In addition, the microcomputer 12051 can set a distance between vehicles to be secured in advance in front of the preceding vehicle to perform automatic brake control (also including a following stop control), an automatic acceleration control (also including a following acceleration control), and the like. As described above, it is possible to perform a cooperative control for automatic driving in which a vehicle autonomously travels without depending on an operation by a driver, and the like.

For example, the microcomputer 12051 can extract three-dimensional object data relating to a three-dimensional object by classifying a plurality of pieces of the three-dimensional object data into data of a two-wheel vehicle, data of typical vehicle, data of a large-sized vehicle, data of pedestrian, and data of other three-dimensional objects such as an electric pole on the basis of the distance information obtained from the imaging units 12101 to 12104, and can use the three-dimensional object data for automatic obstacle avoidance. For example, the microcomputer 12051 discriminates obstacles at the periphery of the vehicle 12100 into an obstacle that is visually recognized by a driver of the vehicle 12100 and an obstacle that is difficult for the driver to visually recognize. In addition, the microcomputer 12051 determines collision risk indicating the degree of danger of collision with each of the obstacles. In a situation in which the collision risk is equal to or greater than a set value, and collision may occur, the microcomputer 12051 can assist driving for collision avoidance by outputting an alarm to the driver through the audio speaker 12061 or the display unit 12062, or by performing compulsory deceleration or avoidance steering through the drive system control unit 12010.

At least one of the imaging units 12101 to 12104 may be an infrared camera that detects infrared rays. For example, the microcomputer 12051 can recognize a pedestrian by determining whether or not the pedestrian exists in images captured by the imaging units 12101 to 12104. For example, the pedestrian recognition is performed by a procedure of extracting a specific point in the images captured by the imaging units 12101 to 12104 as an infrared camera, and a procedure of performing pattern matching processing for a series of specific points indicating a contour line of an object to determine whether or not the object is a pedestrian. When the microcomputer 12051 determines that a pedestrian exists on the images captured by the imaging units 12101 to 12104, and recognizes the pedestrian, the voice and image output unit 12052 controls the display unit 12062 to overlap and display a quadrangular contour line for emphasis on the pedestrian who is recognized. In addition, the voice and image output unit 12052 may control the display unit 12062 to display an icon indicating the pedestrian or the like at a desired position.

Hereinbefore, description has been given of an example of the vehicle control system to which the technology according to the present disclosure is applicable. The technology according to the present disclosure is applicable to the imaging unit 12031, the driver state detection unit 12041, and the like among the above-described configurations.

Hereinbefore, embodiments of the present disclosure have been described, but the technical range of the present disclosure is not limited to the above-described embodiments, and various modifications can be made in a range not departing from the gist of the present disclosure. In addition, constituent elements in other embodiments and modification examples may be appropriately combined.

In addition, the effects in the embodiments described in this specification are illustrative only, and other effect may exist without a limitation.

Furthermore, the present technology may employ the following configurations.

(1)

A solid-state imaging device including:
- a plurality of photoelectric conversion elements which are arranged in a two-dimensional lattice shape in row and column directions, and each generate a charge corresponding to a light-reception amount;
- a first transistor that is provided in each of the plurality of photoelectric conversion elements;
- an integration unit that integrates an output of the first transistor that is provided in each of two or more photoelectric conversion elements among the plurality of photoelectric conversion elements;
- a detection unit that detects a photocurrent based on a charge that is generated in at least one of the two or more photoelectric conversion elements;
- a second transistor that is disposed between the output of the first transistor that is provided in each of the two or more photoelectric conversion elements, and the detection unit; and
- a generation unit that generates a pixel signal of a voltage value based on a charge that is generated in each of the two or more photoelectric conversion elements.

(2)

The solid-state imaging device according to (1),
in which each of the first transistors is disposed at positions which are adjacent to each other in each of the two or more photoelectric conversion elements.

(3)

The solid-state imaging device according to one or more of (1) to (2),
in which the two or more photoelectric conversion elements are a total of four photoelectric conversion elements of two rows×two columns, and
the first transistor that is provided in each of the two or more photoelectric conversion elements is disposed at corner portions which are opposite to each other in the photoelectric conversion elements of two rows×two columns.

(4)

The solid-state imaging device according to one or more of (1) to (3),
in which the detection unit is disposed to be adjacent to an array that is formed by the photoelectric conversion elements of two rows×two columns in the row direction or the column direction, and
the generation unit is disposed to be adjacent to the array that is formed by the photoelectric conversion elements of two rows×two columns in the row direction or the column direction.

(5)

The solid-state imaging device according to one or more of (1) to (4),
in which the generation unit is disposed on a side opposite to the detection unit with the array formed by the photoelectric conversion elements of two rows×two columns interposed therebetween.

(6)

The solid-state imaging device according to one or more of (1) to (5),
in which the generation unit is disposed on the same side as the detection unit with respect to the array formed by the photoelectric conversion elements of two rows×two columns.

(7)

The solid-state imaging device according to one or more of (1) to (6),
in which the two or more photoelectric conversion elements are constituted by a first photoelectric conversion element group including a total of four photoelectric conversion elements of two rows×two columns, and a second photoelectric conversion element group including a total of four other photoelectric conversion elements of two rows×two columns,
the first transistor that is provided in each of the photoelectric conversion elements which constitute the first photoelectric conversion element group is disposed at corner portions which are opposite to each other in the photoelectric conversion elements of two rows×two columns, and
the first transistor that is provided in each of the photoelectric conversion elements which constitute the second photoelectric conversion element group is disposed at corner portions which are opposite to each other in the photoelectric conversion elements of two rows×two columns.

(8)

The solid-state imaging device according to (7),
in which the first photoelectric conversion element group and the second photoelectric conversion element group are arranged in a first direction that is one of the row direction and the column direction,
the detection unit is disposed between the first photoelectric conversion element group and the second photoelectric conversion element group, and
the generation unit is disposed to be adjacent to an array that is formed by the first photoelectric conversion element group and the second photoelectric conversion element group in the first direction.

(9)

The solid-state imaging device according to one or more of (1) to (8),
in which the first photoelectric conversion element group and the second photoelectric conversion element group are arranged in a first direction that is one of the row direction and the column direction,
the detection unit is disposed to be adjacent to an array that is formed by the first photoelectric conversion element group and the second photoelectric conversion element group in the first direction, and
the generation unit is disposed to be adjacent to the array on a side opposite to the detection unit with the array formed by the first photoelectric conversion element group and the second photoelectric conversion element group interposed therebetween.

(10)

The solid-state imaging device according to one or more of (1) to (9),
in which the first photoelectric conversion element group and the second photoelectric conversion element group are arranged in a first direction that is one of the row direction and the column direction, the detection unit is disposed to be adjacent to an array formed by the first photoelectric conversion element group and the second photoelectric conversion element group in the first direction, and the generation unit is disposed between the first photoelectric conversion element group and the second photoelectric conversion element group.

(11)

The solid-state imaging device according to one or more of (1) to (10), in which the detection unit and the generation unit are disposed between the first photoelectric conversion element group and the second photoelectric conversion element group.

(12)

The solid-state imaging device according to one or more of (1) to (11), in which the second transistor is provided in the integration unit.

(13)

The solid-state imaging device according to one or more of (1) to (12), further including:

a third transistor that is disposed between the output of the first transistor that is provided in each of the two or more photoelectric conversion elements, and the generation unit.

(14)

The solid-state imaging device according to one or more of (1) to (13), in which the plurality of photoelectric conversion elements, the first and second transistors, the integration unit, a part of a plurality of transistors which constitute the detection unit, and a plurality of transistors which constitute the generation unit are disposed in the same first semiconductor chip.

(15)

The solid-state imaging device according to one or more of (1) to (14), further including:

a second semiconductor chip that includes the remaining circuits which constitute the detection unit, in which the first semiconductor chip and the second semiconductor chip are electrically and mechanically joined to each other by joining a copper pad provided in the first semiconductor chip and a copper pad provided in the second semiconductor chip to each other.

(16)

The solid-state imaging device according to one or more of (1) to (15), in which the first and second transistors, a part of the plurality of transistors which constitute the detection unit, and the plurality of transistors which constitute the generation unit are metal-oxide-semiconductor (MOS) transistors.

(17)

A solid-state imaging device including:

a plurality of photoelectric conversion elements which are arranged in a two-dimensional lattice shape in row and column directions, and each generate a charge corresponding to a light-reception amount;

a first transistor that is provided in each of the plurality of photoelectric conversion elements;

a first integration unit that integrates an output of the first transistor that is provided in each of the photoelectric conversion elements which belong to a first photoelectric conversion element group constituted by two or more photoelectric conversion elements among the plurality of photoelectric conversion elements;

a second integration unit that integrates an output of the first transistor that is provided in each of the photoelectric conversion elements which belong to a second photoelectric conversion element group constituted by two or more photoelectric conversion elements among the plurality of photoelectric conversion elements;

a detection unit that detects a photocurrent based on a charge that is generated in at least one of the two or more photoelectric conversion elements which belong to the first photoelectric conversion element group;

a second transistor that is disposed between the output of the first transistor that is provided in each of the two or more photoelectric conversion elements which belong to the first photoelectric conversion element group, and the detection unit; and a generation unit that generates a pixel signal of a voltage value based on a charge that is generated in each of the two or more photoelectric conversion elements which belong to the second photoelectric conversion element group, in which at least one of the two or more photoelectric conversion elements which belong to the first photoelectric conversion element group belongs to the second photoelectric conversion element group.

(18)

An imaging device including:

a solid-state imaging device;

an optical system that images incident light to a light-receiving surface of the solid-state imaging device; and a control unit that controls the solid-state imaging device, in which the solid-state imaging device includes, a plurality of photoelectric conversion elements which are arranged in a two-dimensional lattice shape in row and column directions, and each generate a charge corresponding to a light-reception amount, a first transistor that is provided in each of the plurality of photoelectric conversion elements, an integration unit that integrates an output of the first transistor that is provided in each of two or more photoelectric conversion elements among the plurality of photoelectric conversion elements, a detection unit that detects a photocurrent based on a charge that is generated in at least one of the two or more photoelectric conversion elements, a second transistor that is disposed between the output of the first transistor that is provided in each of the two or more photoelectric conversion elements, and the detection unit, and a generation unit that generates a pixel signal of a voltage value based on a charge that is generated in each of the two or more photoelectric conversion elements.

(19)

An imaging device, comprising:

at least one floating diffusion region;

a set of photoelectric conversion regions sharing the at least one floating diffusion region and that convert incident light into electric charges;

a first readout circuit coupled to the at least one floating diffusion region and located at a first side of the set of photoelectric conversion regions; and a second readout circuit coupled to the at least one floating diffusion region, the second readout circuit including a portion located at a second side of the set of photoelectric conversion regions that is opposite the first side, the second readout circuit being configured to control the first readout circuit.

(20)
The imaging device of (19), wherein the second readout circuit is configured to convert a voltage signal into a logarithmic value based on the electric charges.

(21)
The imaging device of one or more of (19) to (20), wherein the second readout circuit includes a first set of transistors and a second set of transistors spaced apart from one another in a first direction.

(22)
The imaging device of one or more of (19) to (21), wherein the first set of transistors and the second set of transistors are arranged in a second direction substantially perpendicular to the first direction.

(23)
The imaging device of one or more of (19) to (22), wherein the set of photoelectric conversion regions includes a first group of four photoelectric conversion regions in a 2×2 matrix.

(24)
The imaging device of one or more of (19) to (23), wherein a first line extending in the first direction intersects the first and second sets of transistors and first and second photoelectric conversion regions in the first group.

(25)
The imaging device of one or more of (19) to (24), wherein a second line that extends in the first direction and that is offset from the first line in the second direction intersects the at least one floating diffusion region.

(26)
The imaging device of one or more of (19) to (25), wherein the first readout circuit includes a third set of transistors, and wherein the third set of transistors are arranged in the second direction.

(27)
The imaging device of one or more of (19) to (26), wherein a third line that extends in the first direction and that is offset from the second line in the second direction intersects the third set of transistors and third and fourth photoelectric conversion regions in the first group.

(28)
The imaging device of (26), wherein a number of transistors in the third set of transistors and a number of transistors in the first set of transistors is equal.

(29)
The imaging device of one or more of (19) to (28), wherein a number of transistors in the second set of transistors is fewer than the number of the transistors in the first set of transistors.

(30)
The imaging device of one or more of (19) to (29), wherein the set of photoelectric conversion regions includes a second group of four photoelectric conversion regions in a 2×2 matrix, and wherein the first readout circuit is between the first group and the second group in the first direction.

(31)
The imaging device of one or more of (19) to (30), wherein the at least one floating diffusion region includes a first floating diffusion region shared by the first group of four photoelectric conversion regions, and a second floating diffusion region shared by the second group of four photoelectric conversion regions.

(32)
An imaging device, comprising:
a first floating diffusion region;
a first group of photoelectric conversion regions sharing the first floating diffusion region and that convert incident light into electric charges;
a second floating diffusion region;
a second group of photoelectric conversion regions sharing the second floating diffusion region and that convert incident light into electric charges;
a first readout circuit coupled to the first and second floating diffusions and located at a first side of the first group of photoelectric conversion regions; and
a second readout circuit coupled to the first and second floating diffusion regions, the second readout circuit including a portion located at a second side of the first group of photoelectric conversion regions such that the second readout circuit is between the first group of photoelectric conversion regions and the second group of photoelectric conversion regions, the second readout circuit being configured to control the first readout circuit, the second side being opposite to the first side.

(33)
The imaging device of (32), wherein the second readout circuit is configured to convert a voltage signal to a logarithmic value based on the electric charges.

(34)
The imaging device of one or more of (32) to (33), wherein the first group and the second group each include four photoelectric conversion regions in a 2×2 matrix.

(35)
The imaging device of one or more of (32) to (34), wherein the first group and the second group are aligned with one another in a first direction.

(36)
The imaging device of one or more of (32) to (35), wherein a line extends in the first direction through the first floating diffusion region and the second floating diffusion region, wherein gates of transistors in the first readout circuit are at a first side of the center line, and wherein gates of transistors in the second readout circuit are at a second side of the center line that is opposite the first side of the center line.

(37)
The imaging device of one or more of (32) to (36), wherein the transistors in the second readout circuit include a first set of transistors and a second set of transistors spaced apart from the first set of transistors in the first direction.

(38)
The imaging device of one or more of (32) to (37), wherein the gates of the transistors in the first and second sets of transistors and the gates of the transistors in the first readout circuit are arranged in a second direction that is substantially perpendicular to the first direction.

(39)
An imaging device, comprising:
a first chip including:
at least one floating diffusion region; and
a set of photoelectric conversion regions sharing the at least one floating diffusion region and that convert incident light into electric charge; and
a second chip bonded to the first chip and including:
a first readout circuit coupled to the at least one floating diffusion region and located at a first side of the set of photoelectric conversion regions; and
a second readout circuit coupled to the at least one floating diffusion region, the second readout circuit including a portion located at a second side of the set of photoelectric conversion regions that is opposite the first side, the second readout circuit being configured to control the first readout circuit.

(40)
The imaging device of (39), wherein the second readout circuit is configured to convert a voltage signal into a logarithmic value based on the electric charges.

(41)
The imaging device of one or more of (39) to (40), further comprising:
a third chip bonded to the second chip, the third chip including signal processing circuitry for processing a pixel signal for each photoelectric conversion region.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

100 Imaging device
110 Imaging lens
120 Recording unit
130 Control unit
200, 200A Solid-state imaging device
201 Light-receiving chip
202 Logic chip
203 Circuit chip
210 Logic circuit
211 Drive circuit
212 Signal processing unit
213 Arbiter
220 Column ADC
230 ADC
300 Pixel array unit
310, 310A, 310B, 310C, 310D Pixel block
320, 320-1 to 320-6 Pixel signal generation unit
321 Reset transistor
322 Amplification transistor
323 Selection transistor
324 Floating diffusion layer
325 Diffusion region
330, 630 Light-receiving unit
331B, 331Gb, 331Gr, 331R, 631 Transmission transistor
332 OFG transistor
333, 333B, 333G, 333Gb, 333Gr, 333R, 333W Photoelectric conversion element
333-1 to 333-15 Photoelectric conversion element group
400 Address event detection unit
410 Current-voltage conversion unit
410A Upper layer detection circuit
411, 414 LG transistor
412, 413 Amplification transistor
415 Constant-current circuit
420 Buffer
430 Subtractor
431, 433 Capacitor
432 Inverter
434 Switch
440 Quantizer
441 Comparator
450 Transmission unit
500, 500-1, 500-2, 500-3, 600, 700-1, 700-2, 700-3, 700-4 Upper layer circuit
510A Cu—Cu joint
3311B, 3311Gb, 3311Gr, 3311R, 6311 Transmission gate
3211 Reset gate
3221 Amplification gate
3231 Selection gate
3241, 3342, 3343, 3344, 3345, 3346, 3347 Interconnection
3341, 5341, 6341 Integration unit
3341A, 3341B Integration unit group
4111, 4141 LG gate
4121, 4131 Amplification gate

What is claimed is:

1. An imaging device, comprising:
at least one floating diffusion region;
a set of photoelectric conversion regions sharing the at least one floating diffusion region and that convert incident light into electric charges;
a first readout circuit coupled to the at least one floating diffusion region and located at a first side and a first corner of the set of photoelectric conversion regions; and
a second readout circuit coupled to the at least one floating diffusion region,
wherein the second readout circuit includes a portion located at a second side and a second corner of the set of photoelectric conversion regions,
wherein the second side is opposite the first side and the second corner is opposite the first corner, and
wherein the second readout circuit is configured to control the first readout circuit.

2. The imaging device of claim 1, wherein the second readout circuit is configured to convert a voltage signal into a logarithmic value based on the electric charges.

3. The imaging device of claim 1, wherein the second readout circuit includes a first set of transistors and a second set of transistors spaced apart from one another in a first direction.

4. The imaging device of claim 3, wherein the first set of transistors and the second set of transistors are arranged in a second direction substantially perpendicular to the first direction.

5. The imaging device of claim 4, wherein the set of photoelectric conversion regions includes a first group of four photoelectric conversion regions in a 2×2 matrix.

6. The imaging device of claim 5, wherein a first line extending in the first direction intersects the first and second sets of transistors and first and second photoelectric conversion regions in the first group.

7. The imaging device of claim 6, wherein a second line that extends in the first direction and that is offset from the first line in the second direction intersects the at least one floating diffusion region.

8. The imaging device of claim 7,
wherein the first readout circuit includes a third set of transistors, and
wherein the third set of transistors are arranged in the second direction.

9. The imaging device of claim 8, wherein a third line that extends in the first direction and that is offset from the second line in the second direction intersects the third set of transistors and third and fourth photoelectric conversion regions in the first group.

10. The imaging device of claim 8, wherein a number of transistors in the third set of transistors and a number of transistors in the first set of transistors is equal.

11. The imaging device of claim 10, wherein a number of transistors in the second set of transistors is fewer than the number of the transistors in the first set of transistors.

12. The imaging device of claim 4, wherein the set of photoelectric conversion regions includes a second group of four photoelectric conversion regions in a 2×2 matrix, and
wherein the first readout circuit is between the first group and the second group in the first direction.

13. The imaging device of claim 12, wherein the at least one floating diffusion region includes a first floating diffusion region shared by the first group of four photoelectric conversion regions, and a second floating diffusion region shared by the second group of four photoelectric conversion regions.

14. An imaging device, comprising:
a first floating diffusion region;
a first group of photoelectric conversion regions sharing the first floating diffusion region and that convert incident light into electric charges;
a second floating diffusion region;
a second group of photoelectric conversion regions sharing the second floating diffusion region and that convert incident light into electric charges;
a first readout circuit coupled to the first and second floating diffusions and located at a first side and a first corner of the first group of photoelectric conversion regions; and
a second readout circuit coupled to the first and second floating diffusion regions,
wherein the second readout circuit includes a portion located at a second side and a second corner of the first group of photoelectric conversion regions such that the second readout circuit is between the first group of photoelectric conversion regions and the second group of photoelectric conversion regions,
wherein the second readout circuit is configured to control the first readout circuit, and
wherein the second side is opposite to the first side and the second corner is opposite to the first corner.

15. The imaging device of claim 14, wherein the second readout circuit is configured to convert a voltage signal to a logarithmic value based on the electric charges.

16. The imaging device of claim 14, wherein the first group and the second group each include four photoelectric conversion regions in a 2×2 matrix.

17. The imaging device of claim 16, wherein the first group and the second group are aligned with one another in a first direction.

18. The imaging device of claim 17, wherein a line extends in the first direction through the first floating diffusion region and the second floating diffusion region,
wherein gates of transistors in the first readout circuit are at a first side of a center line, and
wherein gates of transistors in the second readout circuit are at a second side of the center line that is opposite the first side of the center line.

19. The imaging device of claim 18, wherein the transistors in the second readout circuit include a first set of transistors and a second set of transistors spaced apart from the first set of transistors in the first direction.

20. The imaging device of claim 19, wherein the gates of the transistors in the first and second sets of transistors and the gates of the transistors in the first readout circuit are arranged in a second direction that is substantially perpendicular to the first direction.

21. An imaging device, comprising:
a first chip including:
at least one floating diffusion region; and
a set of photoelectric conversion regions sharing the at least one floating diffusion region and that convert incident light into electric charge; and
a second chip bonded to the first chip and including:
a first readout circuit coupled to the at least one floating diffusion region and located at a first side and a first corner of the set of photoelectric conversion regions; and
a second readout circuit coupled to the at least one floating diffusion region,
wherein the second readout circuit includes a portion located at a second side and a second corner of the set of photoelectric conversion regions,
wherein the second side is opposite the first side and the second corner is opposite the first corner, and
wherein the second readout circuit is configured to control the first readout circuit.

22. The imaging device of claim 21, wherein the second readout circuit is configured to convert a voltage signal into a logarithmic value based on the electric charges.

23. The imaging device of claim 21, further comprising:
a third chip bonded to the second chip, the third chip including signal processing circuitry for processing a pixel signal for each photoelectric conversion region.

* * * * *